(12) United States Patent
Yoshimura et al.

(10) Patent No.: US 8,772,763 B2
(45) Date of Patent: Jul. 8, 2014

(54) PHOTOVOLTAIC CELL

(75) Inventors: Ken Yoshimura, Tsukuba (JP);
Katsuhiro Suenobu, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 29 days.

(21) Appl. No.: 13/502,639

(22) PCT Filed: Oct. 29, 2010

(86) PCT No.: PCT/JP2010/069259
§ 371 (c)(1),
(2), (4) Date: Apr. 18, 2012

(87) PCT Pub. No.: WO2011/052712
PCT Pub. Date: May 5, 2011

(65) Prior Publication Data
US 2012/0205641 A1 Aug. 16, 2012

(30) Foreign Application Priority Data

Oct. 29, 2009 (JP) ................. 2009-248795
Mar. 11, 2010 (JP) ................. 2010-054223
Apr. 28, 2010 (JP) ................. 2010-104115

(51) Int. Cl.
*H01L 21/48* (2006.01)
*B82Y 10/00* (2011.01)
*H01L 51/00* (2006.01)
*C08G 61/12* (2006.01)
*H01L 51/05* (2006.01)
*H01L 51/42* (2006.01)

(52) U.S. Cl.
CPC ......... *H01L 51/0036* (2013.01); *H01L 51/0545* (2013.01); *B82Y 10/00* (2013.01); *C08G 2261/364* (2013.01); *H01L 2251/308* (2013.01); *Y02E 10/549* (2013.01); *H01L 51/4253* (2013.01); *C08G 2261/344* (2013.01); *C08G 61/123* (2013.01); *G08G 61/122* (2013.01); *C08G 2261/3223* (2013.01); *H01L 51/0043* (2013.01); *C08G 61/126* (2013.01); *C08G 2261/91* (2013.01); *C08G 2261/3246* (2013.01); *H01L 51/0046* (2013.01); *C08G 2261/411* (2013.01)
USPC .......... 257/40; 257/57; 257/66; 257/E29.073; 257/E33.012; 257/E51.025

(58) Field of Classification Search
USPC ........... 257/40, 57–66, E29.273, 289, 33.012, 257/51.007, 51.018, 51.025, 51.026
See application file for complete search history.

(56) References Cited

U.S. PATENT DOCUMENTS

| 2003/0168656 | A1* | 9/2003 | Kobayashi et al. | 257/40 |
| 2004/0201018 | A1* | 10/2004 | Yamahara et al. | 257/59 |
| 2007/0014939 | A1 | 1/2007 | Gaudiana et al. | |
| 2007/0017571 | A1 | 1/2007 | Gaudiana et al. | |
| 2007/0020526 | A1 | 1/2007 | Gaudiana et al. | |
| 2007/0131270 | A1 | 6/2007 | Gaudiana et al. | |
| 2007/0158620 | A1 | 7/2007 | Gaudiana et al. | |
| 2007/0246094 | A1 | 10/2007 | Brabec et al. | |
| 2007/0267055 | A1 | 11/2007 | Gaudiana et al. | |
| 2008/0003422 | A1* | 1/2008 | Ueda | 428/220 |
| 2008/0006324 | A1 | 1/2008 | Berke et al. | |
| 2008/0138651 | A1* | 6/2008 | Doi et al. | 428/690 |

(Continued)

FOREIGN PATENT DOCUMENTS

CN 1989169 A 6/2007
GB 2 432 837 A 6/2007

(Continued)

OTHER PUBLICATIONS

Lijun Huo, et al., "Bandgap and Molecular Level Control of the Low-Bandgap Polymers Based on 3,6-Dithiophen-2-yl-2,5-dihydropyrrolo[3,4-c]pyrrole-1,4-dione toward Highly Efficient Polymer Solar Cells", Macromolecules, 2009, pp. 6564-6571, vol. 42.

(Continued)

*Primary Examiner* — Michael Lebentritt
(74) *Attorney, Agent, or Firm* — Sughrue Mion, PLLC

(57) ABSTRACT

The present invention provides a photovoltaic cell having a large short-circuit current density and a large photoelectric conversion efficiency.
This photovoltaic cell comprises:
  a first electrode;
  a second electrode;
  an active layer between the first electrode and the second electrode;
  wherein the active layer contains a macromolecular compound having a structural unit represented by Formula (1):

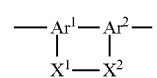

wherein $Ar^1$ and $Ar^2$ are the same as or different from each other and represent a trivalent aromatic hydrocarbon group or a trivalent heterocyclic group; $X^1$ and $X^2$ are the same as or different from each other and represent —O—, —S—, —C(=O)—, —S(=O)—, —SO$_2$—, —C(R$^{50}$)(R$^{51}$)—, —Si(R$^3$)(R$^4$)—, —N(R$^5$)—, —B(R$^6$)—, —P(R$^7$)—, or —P(=O)(R$^8$)—; $R^{50}$, $R^{51}$, $R^3$, $R^4$, $R^5$, $R^6$, $R^7$, and $R^8$ are the same as or different from each other and represent a hydrogen atom, a halogen atom, or a monovalent organic group; and $X^1$ and $Ar^2$ are bonded with atoms adjacent to each other on a ring that constitutes $Ar^1$, and $X^2$ and $Ar^1$ are bonded with atoms adjacent to each other on a ring that constitutes $Ar^2$,
wherein an inverse of the excitation energy of the macromolecular compound from a ground singlet state to a lowest excited singlet state that is calculated using the time-dependent density functional theory is 0.43 (eV$^{-1}$) or more.

7 Claims, No Drawings

(56) References Cited

U.S. PATENT DOCUMENTS

| | | | |
|---|---|---|---|
| 2009/0065770 A1 | 3/2009 | Miura et al. | |
| 2010/0006154 A1 | 1/2010 | Kitazawa et al. | |
| 2010/0084000 A1 | 4/2010 | Ueda | |
| 2010/0180944 A1 | 7/2010 | Gaudiana et al. | |
| 2011/0114183 A1 | 5/2011 | Uetani et al. | |
| 2011/0193071 A1* | 8/2011 | Yahagi | 257/40 |
| 2012/0205596 A1* | 8/2012 | Yoshimura et al. | 252/511 |
| 2012/0205644 A1* | 8/2012 | Yoshimura et al. | 257/40 |
| 2012/0217448 A1* | 8/2012 | Yoshimura et al. | 252/500 |
| 2012/0273786 A1* | 11/2012 | Yahagi | 257/57 |
| 2012/0292626 A1* | 11/2012 | Yahagi | 257/59 |

FOREIGN PATENT DOCUMENTS

| | | |
|---|---|---|
| JP | 2004-168999 A | 6/2004 |
| JP | 2006-063334 A | 3/2006 |
| JP | 2008-109114 A | 5/2008 |
| JP | 2009-506519 A | 2/2009 |
| JP | 2009-096950 A | 5/2009 |
| WO | 2007/105386 A1 | 9/2007 |
| WO | 2008/044585 A1 | 4/2008 |

OTHER PUBLICATIONS

Shengqiang Xiao, et al., "Conjugated Polymers of Fused Bithiophenes with Enhanced P-Electron Delocalization for Photovoltaic Applications", Macromolecules, 2008, pp. 5688-5696, vol. 41.

First Office Action issued by the State Intellectual Property Office of the People's Republic of China in Application No. 201080048513.X, dated Apr. 9, 2014.

* cited by examiner

PHOTOVOLTAIC CELL

CROSS REFERENCE TO RELATED APPLICATIONS

This application is a National Stage of International Application No. PCT/JP2010/069259 filed Oct. 29, 2010, claiming priority based on Japanese Patent Application Nos. 2009-248795, filed Oct. 29, 2009, 2010-054223, filed Mar. 11, 2010 and 2010-104115, filed Apr. 28, 2010, the contents of all of which are incorporated herein by reference in their entirety.

TECHNICAL FIELD

The present invention relates to a photovoltaic cell using a specific macromolecular compound.

BACKGROUND ART

In recent years, for the prevention of the global warming, the reduction of $CO_2$ discharged into the atmosphere is required. For example, the transfer to a solar system using a pn junction-type silicon-based solar cell and the like on the roof of a house is put forward. However, monocrystalline, multicrystalline, and amorphous silicon that are used for the silicon-based solar cell have such a problem that they require conditions of a high temperature and high vacuum in their production process.

By contrast, an organic thin film solar cell that is one example of the photovoltaic cell can omit a high temperature and high vacuum process used for a production process of a silicon-based solar cell and has the probability that it can be produced at low cost only by a coating process, so that the organic thin film solar cell has been attracting attention in recent years. As an organic thin film solar cell using a macromolecular compound, an organic thin film solar cell having an organic layer containing a macromolecular compound comprising a repeated unit (A) and a repeated unit (B) is mentioned (Patent Literature 1).

[Chemical Formula 1]

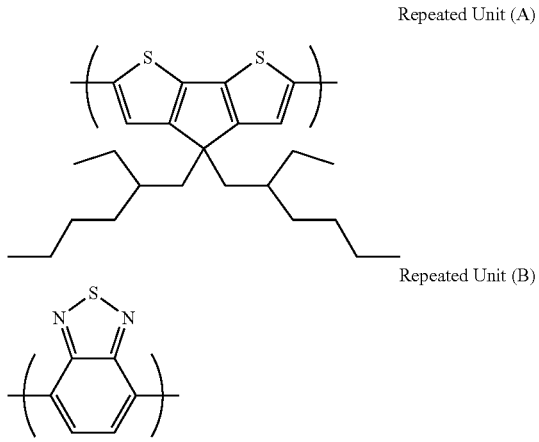

PRIOR ART LITERATURE

Patent Literature

Patent Literature 1: Japanese Patent Application Laid-open No. 2009-506519

SUMMARY OF THE INVENTION

Problem to be Solved by the Invention

However, a photovoltaic cell having an organic layer containing the macromolecular compound does not necessarily have a satisfactory short-circuit current density and a satisfactory photoelectric conversion efficiency.

It is an object of the present invention to provide a photovoltaic cell by which the short-circuit current density and the photoelectric conversion efficiency of the photovoltaic cell are enhanced.

Means for Solving Problem

Accordingly, the present invention firstly provides a photovoltaic cell comprising:
a first electrode;
a second electrode;
an active layer positioned between the first electrode and the second electrode;
wherein the active layer contains a macromolecular compound having a structural unit represented by Formula (1):

wherein $Ar^1$ and $Ar^2$ are the same as or different from each other and represent a trivalent aromatic hydrocarbon group or a trivalent heterocyclic group; $X^1$ and $X^2$ are the same as or different from each other and represent —O—, —S—, —C(=O)—, —S(=O)—, —SO$_2$—, —C(R$^{50}$)(R$^{51}$)—, —Si(R$^3$)(R$^4$)—, —N(R$^5$)—, —B(R$^6$)—, —P(R$^7$)—, or —P(=O)(R$^8$)—; $R^{50}$, $R^{51}$, $R^3$, $R^4$, $R^5$, $R^6$, $R^7$, and $R^8$ are the same as or different from each other and represent a hydrogen atom, a halogen atom, or a monovalent organic group; and $X^1$ and $Ar^2$ are bonded with atoms adjacent to each other on a ring that constitutes $Ar^1$, and $X^2$ and $Ar^1$ are bonded with atoms adjacent to each other on a ring that constitutes $Ar^2$, wherein an inverse of excitation energy of the macromolecular compound from a ground singlet state to a lowest excited singlet state that is calculated using a time-dependent density functional theory is 0.43 (eV$^{-1}$) or more.

The present invention secondly provides a solar cell module comprising the above photovoltaic cell.

The present invention thirdly provides an image sensor comprising the above photovoltaic cell.

The present invention fourthly provides an organic thin film transistor comprising:
a gate electrode;
a source electrode;
a drain electrode; and
an active layer;
wherein the active layer contains a macromolecular compound having a structural unit represented by Formula (1):

wherein $Ar^1$ and $Ar^2$ are the same as or different from each other and represent a trivalent aromatic hydrocarbon group or a trivalent heterocyclic group; $X^1$ and $X^2$ are the same as or different from each other and represent —O—, —S—, —C(=O)—, —S(=O)—, —SO$_2$—, —C(R$^{50}$)(R$^{51}$)—, —Si(R$^3$)(R$^4$)—, —N(R$^5$)—, —B(R$^6$)—, —P(R$^7$)—, or —P(=O)(R$^8$)—; $R^{50}$, $R^{51}$, $R^3$, $R^4$, $R^5$, $R^6$, $R^7$, and $R^8$ are the same as or different from each other and represent a hydrogen atom, a halogen atom, or a monovalent organic group; and $X^1$ and $Ar^2$ are bonded with atoms adjacent to each other on a ring that constitutes $Ar^1$, and $X^2$ and $Ar^1$ are bonded with atoms adjacent to each other on a ring that constitutes $Ar^2$, wherein an inverse of excitation energy of the macromolecular compound from a ground singlet state to a lowest excited singlet state that is calculated using a time-dependent density functional theory is 0.43 (eV$^{-1}$) or more.

The present invention fifthly provides a method of calculating excitation energy of a macromolecular compound comprising a repeated unit represented by Formula (2) from a ground singlet state to a lowest excited singlet state, the method comprising:

calculating excitation energy of a compound represented by Formula (2-1), excitation energy of a compound represented by Formula (2-2), and excitation energy of a compound represented by Formula (2-3) by a time-dependent density functional theory;

plotting, on a coordinate plane in which a value represented by 1/k is assigned on an abscissa axis when number of aromatic rings contained in a main chain of the compound is assumed to be k and excitation energy is assigned on an ordinate axis, a first point of which abscissa is a value represented by 1/k for the compound represented by Formula (2-1) and of which ordinate is the excitation energy of the compound represented by Formula (2-1), a second point of which abscissa is a value represented by 1/k for the compound represented by Formula (2-2) and of which ordinate is the excitation energy of the compound represented by Formula (2-2), and a third point of which abscissa is a value represented by 1/k for the compound represented by Formula (2-3) and of which ordinate is the excitation energy of the compound represented by Formula (2-3);

calculating an approximate straight line that connects the first point, the second point, and the third point by least-squares method; and calculating an ordinate of an intersection point of a line on which the value represented by 1/k is 0 with the approximate straight line on the coordinate plane, as the excitation energy of the macromolecular compound;

wherein Formulae (2), (2-1), (2-2) and (2-3) are as follows:

  (2)

  (2-1)

  (2-2)

  (2-3)

wherein Formula (2) represents a divalent organic group comprising one or a plurality of structure units represented by Formula (1); wherein H represents a hydrogen atom; and when $Ar^3$ is plurally present, $Ar^3$s may be the same as or different from each other, wherein Formula (1) is as follows:

  (1)

wherein $Ar^1$ and $Ar^2$ are the same as or different from each other and represent a trivalent aromatic hydrocarbon group or a trivalent heterocyclic group; $X^1$ and $X^2$ are the same as or different from each other and represent —O—, —S—, —C(=O)—, —S(=O)—, —SO$_2$—, —C(R$^{50}$)(R$^{51}$)—, —Si(R$^3$)(R$^4$)—, —N(R$^5$)—, —B(R$^6$)—, —P(R$^7$)—, or —P(=O)(R$^6$)—; $R^{50}$, $R^{51}$, $R^3$, $R^4$, $R^5$, $R^6$, $R^7$, and $R^8$ are the same as or different from each other and represent a hydrogen atom, a halogen atom, or a monovalent organic group; and $X^1$ and $Ar^2$ are bonded with atoms adjacent to each other on a ring that constitutes $Ar^1$, and $X^2$ and $Ar^1$ are bonded with atoms adjacent to each other on a ring that constitutes $Ar^2$.

Effects of the Invention

The present invention is extremely useful since a photovoltaic cell of the present invention has a large short-circuit current density and a large photoelectric conversion efficiency.

EMBODIMENT FOR CARRYING OUT THE INVENTION

Hereinafter, the present invention is described in detail.

The photovoltaic cell of the present invention has a first electrode and a second electrode, and further has an active layer between the first electrode and the second electrode. The present invention relates to a photovoltaic cell characterized in that the active layer contains a macromolecular compound having a structural unit represented by Formula (1), and an inverse of the excitation energy of the macromolecular compound from a ground singlet state to a lowest excited singlet state that is calculated using the time-dependent density functional theory is 0.43 (eV$^{-1}$) or more. The structural unit represented by Formula (1) is a divalent group.

[Chemical Formula 5]

  (1)

In the present invention, the excitation energy of the macromolecular compound comprising a repeated unit represented by A from a ground singlet state to a lowest excited singlet state is calculated as follows.

As the calculation model structure, there are prepared a calculation model structure composed of one repeated unit represented by A, a calculation model structure in which two repeated units represented by A are linked with each other, and a calculation model structure in which three repeated units represented by A are linked with each other.

To linking groups at the both terminals of each calculation model structure, hydrogen atoms are bonded. Next, for each calculation model structure, the structure optimization calculation is performed to determine a structure having the minimum energy. The Hartree-Fock method is used as the method, and 3-21G* is used as the basis function. Furthermore, for the structure obtained by the structure optimization calculation, the calculation of the excitation energy from the ground singlet state to the lowest excited singlet state is performed by the time-dependent density functional theory. At this time, B3LYP is used as the functional, and 3-21G* is used as the basis function. Gaussian 03 (manufactured by Gaussian Inc.) is used as the calculation program, but another program can also be used so long as its methodology is equal to that of Gaussian 03. Each excitation energy of the calculation model structures from the ground singlet state to the lowest excited singlet state is plotted by assigning the inverse of the number k of aromatic rings that constitute the main chain contained in each calculation model structure (i.e., 1/k) on the abscissa axis and assigning the excitation energy on the ordinate axis, according to a method described in "The Journal of Physical Chemistry B, Vol. 113, No. 24, pp. 8268-8277 (2009)." A straight line is drawn among three plotted points by the least-squares method and the straight line is extrapolated to define the energy when 1/k is 0, as the excitation energy of a macromolecular compound from the ground singlet state to the lowest excited singlet state.

For example, when a macromolecular compound is composed of a repeated unit represented by Formula (2), the excitation energy of a compound represented by Formula (2-1), the excitation energy of a compound represented by Formula (2-2), and the excitation energy of a compound represented by Formula (2-3) are calculated by the time-dependent density functional theory. Next, on a coordinate plane in which the value represented by 1/k is assigned on the abscissa axis and the excitation energy is assigned on the ordinate axis, a first point of which abscissa is the value represented by 1/k for the compound represented by Formula (2-1) and of which ordinate is the excitation energy of the compound represented by Formula (2-1), a second point of which abscissa is the value represented by 1/k for the compound represented by Formula (2-2) and of which ordinate is the excitation energy of the compound represented by Formula (2-2), and a third point of which abscissa is the value represented by 1/k for the compound represented by Formula (2-3) and of which ordinate is the excitation energy of the compound represented by Formula (2-3) are plotted, and the approximate straight line that connects the first point, the second point, and the third point is calculated by the least-squares method. On the above coordinate plane, the ordinate of an intersection point of a straight line on which the value represented by 1/k is 0 with the approximate straight line indicates the excitation energy of a macromolecular compound comprising a repeated unit represented by Formula (2) from the ground singlet state to the lowest excited singlet state.

 (2)

 (2-1)

 (2-2)

 (2-3)

Formula (2) represents a divalent organic group comprising one or a plurality of structural unit(s) represented by Formula (1); wherein H represents a hydrogen atom; and when $Ar^3$ is plurally present, $Ar^3$s may be the same as or different from each other.

When the inverse of the excitation energy of a macromolecular compound contained in the active layer from the ground singlet state to the lowest excited singlet state that is calculated by the present methodology is 0.43 (eV$^{-1}$) or more, the macromolecular compound absorbs light having a longer wavelength and as a result thereof, the photoelectric conversion efficiency becomes higher. The inverse of the excitation energy from the ground singlet state to the lowest excited singlet state is preferably 0.45 (eV$^{-1}$) or more, more preferably 0.47 (eV$^{-1}$) or more, further preferably 0.5 (eV$^{-1}$) or more, 0.6 (eV$^{-1}$) or more, or 0.7 (eV$^{-1}$) or more.

In Formula (1), $X^1$ and $X^2$ are the same as or different from each other and represent —O—, —S—, —C(=O)—, —S(=O)—, —SO$_2$—, —C(R$^{50}$)(R$^{51}$)—, —Si(R$^3$)(R$^4$)—, —N(R$^5$)—, —B(R$^6$)—, —P(R$^7$)—, or —P(=O)(R$^8$)—.

Here, $R^{50}$, $R^{51}$, $R^3$, $R^4$, $R^5$, $R^6$, $R^7$, and $R^8$ are the same as or different from each other and represent a hydrogen atom, a halogen atom, or a monovalent organic group. Examples of the monovalent organic group may include an alkyl group, an alkyloxy group, an alkylthio group, an aryl group, an aryloxy group, an arylthio group, an arylalkyl group, an arylalkyloxy group, an arylalkylthio group, an acyl group, an acyloxy group, an amido group, an acid imido group, an amino group, a substituted amino group, a substituted silyl group, a substituted silyloxy group, a substituted silylthio group, a substituted silylamino group, a monovalent heterocyclic group, a heterocyclyloxy group, a heterocyclylthio group, an arylalkenyl group, an arylalkynyl group, a carboxyl group, and a cyano group.

Here, the alkyl group may be linear or branched, or a cycloalkyl group. The number of carbons of the alkyl group is generally 1 to 30. Specific examples of the alkyl group may include a chained alkyl group such as a methyl group, an ethyl group, an n-propyl group, an isopropyl group, an n-butyl group, an iso-butyl group, a sec-butyl group, a tert-butyl group, an n-pentyl group, an isopentyl group, a 2-methylbutyl group, a 1-methylbutyl group, an n-hexyl group, an isohexyl group, a 3-methylpentyl group, a 2-methylpentyl group, a 1-methylpentyl group, a heptyl group, an octyl group, an isooctyl group, a 2-ethylhexyl group, a 3,7-dimethyloctyl group, a nonyl group, a decyl group, an undecyl group, a dodecyl group, a tetradecyl group, a hexadecyl group, an octadecyl group, and an eicosyl group; and a cycloalkyl group such as a cyclopentyl group, a cyclohexyl group, and an adamantyl group.

The alkyloxy group may be linear or branched, or a cycloalkyloxy group. The alkyloxy group optionally has a substituent. The number of carbons of the alkyloxy group is generally around 1 to 20. Specific examples of the alkyloxy group may include a methoxy group, an ethoxy group, a propyloxy group, an isopropyloxy group, a butoxy group, an iso-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a trifluoromethoxy group, a pentafluoroethoxy group, a perfluorobutoxy group, a perfluorohexyl group, a perfluorooctyl group, a methoxymethyloxy group, and a 2-methoxyethyloxy group.

Here, in the present specification, the term "optionally has(having) a substituent" for a certain group means that a part or all of hydrogen atoms that the certain group has is(are) optionally substituted with a substituent. The term "optionally has(having) a substituent" may be rephrased as "is optionally substituted." For example, a "divalent organic group optionally having a substituent" refers to a divalent organic group in which a part or all of hydrogen atoms in the divalent organic group is(are) optionally substituted with a substituent, and may be rephrased as a "divalent organic group that is optionally substituted" (or a "divalent organic group arbitrarily substituted"). For example, a "hydrocarbon group optionally having a substituent" refers to a hydrocarbon group in which a part or all of hydrogen atoms in the hydrocarbon group is(are) optionally substituted with a substituent, and may be rephrased as a "hydrocarbon group that is optionally substituted" (or a "divalent organic group arbitrarily substituted").

The alkylthio group may be linear or branched, or a cycloalkylthio group. The alkylthio group optionally has a substituent. The number of carbons of the alkylthio group is generally around 1 to 20. Specific examples of the alkylthio group may include a methylthio group, an ethylthio group, a propylthio group, an iso-propylthio group, a butylthio group, an iso-butylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a laurylthio group, and a trifluoromethylthio group.

For the aryl group, the number of carbon atoms thereof is generally around 6 to 60, and the aryl group optionally has a substituent. Specific examples of the aryl group may include a phenyl group, a C1-C12 alkyloxyphenyl group (C1-C12 alkyl means that the number of carbon atoms of the alkyl is 1 to 12; the C1-C12 alkyl is preferably C1-C8 alkyl, more preferably C1-C6 alkyl; the C1-C8 alkyl means an alkyl having 1 to 8 carbon atoms, and the C1-C6 alkyl means an alkyl having 1 to 6 carbon atoms; and specific examples of the C1-C12 alkyl, the C1-C8 alkyl, and the C1-C6 alkyl may include the alkyl group described and exemplified above for the alkyl group and the same hereinafter), a C1-C12 alkylphenyl group, a 1-naphthyl group, a 2-naphthyl group, and a pentafluorophenyl group.

For the aryloxy group, the number of carbon atoms thereof is generally around 6 to 60, and the aryloxy group optionally has a substituent on an aromatic ring. Specific examples of the aryloxy group may include a phenoxy group, a C1-C12 alkyloxyphenoxy group, a C1-C12 alkylphenoxy group, a 1-naphthyloxy group, a 2-naphthyloxy group, and a pentafluorophenyloxy group.

For the arylthio group, the number of carbon atoms thereof is generally around 6 to 60, and the arylthio group optionally has a substituent on an aromatic ring. Specific examples of the arylthio group may include a phenylthio group, a C1-C12 alkyloxyphenylthio group, a C1-C12 alkylphenylthio group, a 1-naphthylthio group, a 2-naphthylthio group, and a pentafluorophenylthio group.

For the arylalkyl group, the number of carbon atoms thereof is generally around 7 to 60, and the arylalkyl group optionally has a substituent. Specific examples of the arylalkyl group may include a phenyl C1-C12 alkyl group, a C1-C12 alkyloxyphenyl C1-C12 alkyl group, a C1-C12 alkylphenyl C1-C12 alkyl group, a 1-naphthyl C1-C12 alkyl group, and a 2-naphthyl C1-C12 alkyl group.

For the arylalkyloxy group, the number of carbon atoms thereof is generally around 7 to 60, and the arylalkyloxy group optionally has a substituent. Specific examples of the arylalkyloxy group may include a phenyl C1-C12 alkyloxy group, a C1-C12 alkyloxyphenyl C1-C12 alkyloxy group, a C1-C12 alkylphenyl C1-C12 alkyloxy group, a 1-naphthyl C1-C12 alkyloxy group, and a 2-naphthyl C1-C12 alkyloxy group.

For the arylalkylthio group, the number of carbon atoms thereof is generally around 7 to 60, and the arylalkylthio group optionally has a substituent. Specific examples of the arylalkylthio group may include a phenyl C1-C12 alkylthio group, a C1-C12 alkyloxyphenyl C1-C12 alkylthio group, a C1-C12 alkylphenyl C1-C12 alkylthio group, a 1-naphthyl C1-C12 alkylthio group, and a 2-naphthyl C1-C12 alkylthio group.

For the acyl group, the number of carbon atoms thereof is generally around 2 to 20. Specific examples of the acyl group may include an acetyl group, a propionyl group, a butyryl group, an isobutyryl group, a pivaloyl group, a benzoyl group, a trifluoroacetyl group, and a pentafluorobenzoyl group.

For the acyloxy group, the number of carbon atoms thereof is generally around 2 to 20. Specific examples of the acyloxy group may include an acetoxy group, a propionyloxy group, a butyryloxy group, an isobutyryloxy group, a pivaloyloxy group, a benzoyloxy group, a trifluoroacetyloxy group, and a pentafluorobenzoyloxy group.

For the amido group, the number of carbon atoms thereof is generally around 2 to 20. The amido group refers to a group obtained by removing hydrogen atoms bonded to a nitrogen atom from an amide. Specific examples of the amido group may include a formamido group, an acetamido group, a propionamido group, a butyramido group, a benzamido group, a trifluoroacetamido group, a pentafluorobenzamido group, a diformamido group, a diacetamido group, a dipropionamido group, a dibutyramido group, a dibenzamido group, a ditrifluoroacetamido group, and a dipentafluorobenzamido group.

The acid imido group refers to a group obtained by removing hydrogen atoms bonded to a nitrogen atom from an acid imide. Specific examples of the acid imido group may include a succinimido group and a phthalic acid imido group.

For the substituted amino group, the number of carbon atoms thereof is generally around 1 to 40. Specific examples of the substituted amino group may include a methylamino group, a dimethylamino group, an ethylamino group, a diethylamino group, a propylamino group, a dipropylamino group, an isopropylamino group, a diisopropylamino group, a butylamino group, an iso-butylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a pyrrolidyl group, a piperidyl group, a ditrifluoromethylamino group, a phenylamino group, a diphenylamino group, a C1-C12 alkyloxyphenylamino group, a di(C1-C12 alkyloxyphenyl)amino group, a di(C1-C12 alkylphenyl)amino group, a 1-naphthylamino group, a 2-naphthylamino group, a pentafluorophenylamino group, a pyridylamino group, a pyridazinylamino group, a pyrimidylamino group, a pyrazylamino group, a triazylamino group, a phenyl C1-C12 alkylamino group, a C1-C12 alkyloxyphenyl C1-C12 alkylamino group, a C1-C12 alkylphenyl C1-C12 alkylamino group, a di(C1-C12 alkyloxyphenyl C1-C12 alkyl)amino group, a di(C1-C12 alkylphenyl C1-C12 alkyl) amino group, a 1-naphthyl C1-C12 alkylamino group, and a 2-naphthyl C1-C12 alkylamino group.

Specific examples of the substituted silyl group may include a trimethylsilyl group, a triethylsilyl group, a tri-n-propylsilyl group, a tri-iso-propylsilyl group, a tert-butyldimethylsilyl group, a triphenylsilyl group, a tri-p-xylylsilyl group, a tribenzylsilyl group, a diphenylmethylsilyl group, a tert-butyldiphenylsilyl group, and a dimethylphenylsilyl group.

Specific examples of the substituted silyloxy group may include a trimethylsilyloxy group, a triethylsilyloxy group, a tri-n-propylsilyloxy group, a tri-iso-propylsilyloxy group, a tert-butyldimethylsilyloxy group, a triphenylsilyloxy group, a tri-p-xylylsilyloxy group, a tribenzylsilyloxy group, a diphenylmethylsilyloxy group, a tert-butyldiphenylsilyloxy group, and a dimethylphenylsilyloxy group.

Specific examples of the substituted silylthio group may include a trimethylsilylthio group, a triethylsilylthio group, a tri-n-propylsilylthio group, a tri-iso-propylsilylthio group, a tert-butyldimethylsilylthio group, a triphenylsilylthio group, a tri-p-xylylsilylthio group, a tribenzylsilylthio group, a diphenylmethylsilylthio group, a tert-butyldiphenylsilylthio group, and a dimethylphenylsilylthio group.

Specific examples of the substituted silylamino group may include a trimethylsilylamino group, a triethylsilylamino group, a tri-n-propylsilylamino group, a tri-iso-propylsilylamino group, a tert-butyldimethylsilylamino group, a triphenylsilylamino group, a tri-p-xylylsilylamino group, a tribenzylsilylamino group, a diphenylmethylsilylamino group, a tert-butyldiphenylsilylamino group, a dimethylphenylsilylamino group, a di(trimethylsilyl)amino group, a di(triethylsilyl)amino group, a di(tri-n-propylsilyl)amino group, a di(tri-iso-propylsilyl)amino group, a di(tert-butyldimethylsilyl)amino group, a di(triphenylsilyl)amino group, a di(tri-p-xylylsilyl)amino group, a di(tribenzylsilyl)amino group, a di(diphenylmethylsilyl)amino group, a di(tert-butyldiphenylsilyl)amino group, and a di(dimethylphenylsilyl)amino group.

Specific examples of the monovalent heterocyclic group may include groups obtained by removing one hydrogen atom from a heterocyclic compound such as furan, thiophene, pyrrole, pyrroline, pyrrolidine, oxazole, isoxazole, thiazole, isothiazole, imidazole, imidazoline, imidazolidine, pyrazole, pyrazoline, pyrazolidine, furazan, triazole, thiadiazole, oxadiazole, tetrazole, pyran, pyridine, piperidine, thiopyran, pyridazine, pyrimidine, pyrazine, piperazine, morpholine, triazine, benzofuran, isobenzofuran, benzothiophene, indole, isoindole, indolizine, indoline, isoindoline, chromene, chromane, isochromane, benzopyran, quinoline, isoquinoline, quinolizine, benzimidazole, benzothiazole, indazole, naphthyridine, quinoxaline, quinazoline, quinazolidine, cinnoline, phthalazine, purine, pteridine, carbazole, xanthene, phenanthridine, acridine, β-carboline, perimidine, phenanthroline, thianthrene, phenoxathiin, phenoxazine, phenothiazine, and phenazine. As the monovalent heterocyclic group, a monovalent aromatic heterocyclic group is preferred.

Examples of the heterocyclyloxy group or heterocyclylthio group may include groups in which an oxygen atom or a nitrogen atom is bonded to the above monovalent heterocyclic group.

For the heterocyclyloxy group, the number of carbon atoms thereof is generally around 4 to 60. Specific examples of the heterocyclyloxy group may include a thienyloxy group, a C1-C12 alkylthienyloxy group, a pyrrolyloxy group, a furyloxy group, a pyridyloxy group, a C1-C12 alkylpyridyloxy group, an imidazolyloxy group, a pyrazolyloxy group, a triazolyloxy group, an oxazolyloxy group, a thiazoloxy group, and a thiadiazoleoxy group.

For the heterocyclylthio group, the number of carbon atoms thereof is generally around 4 to 60. Specific examples of the heterocyclylthio group may include a thienylmercapto group, a C1-C12 alkylthienylmercapto group, a pyrrolylmercapto group, a furylmercapto group, a pyridylmercapto group, a C1-C12 alkylpyridylmercapto group, an imidazolylmercapto group, a pyrazolylmercapto group, a triazolylmercapto group, an oxazolylmercapto group, a thiazolemercapto group, and a thiadiazolemercapto group.

For the arylalkenyl group, the number of carbon atoms thereof is generally 7 to 20, and specific examples of the arylalkenyl group may include a styryl group.

For the arylalkynyl group, the number of carbon atoms thereof is generally 7 to 20, and specific examples of the arylalkynyl group may include a phenylacetylenyl group.

Examples of the halogen atom may include a fluorine atom, a chlorine atom, a bromine atom, and an iodine atom.

From the viewpoint of the easiness of the production of the monomer, $X^1$ is preferably —O—, —S—, or —C(=O)—, more preferably —O— or —C(=O)—, further preferably —O—. $X^2$ is preferably —C($R^{50}$)($R^{51}$)— and —Si($R^3$)($R^4$)—, further preferably —C($R^{50}$)($R^{51}$)—.

In Formula (1), $Ar^1$ and $Ar^2$ are the same as or different from each other and represent a trivalent aromatic hydrocarbon group or a trivalent heterocyclic group. As illustrated in Formula (1), $Ar^1$ has three bonding sites and one of them is a bonding site with $Ar^2$, another is a bonding site with $X^1$, and the other is a bonding site with a hydrogen atom or other atoms. These other atoms may be a part of atoms that constitute another constitutional unit. As illustrated in Formula (1), $Ar^2$ has three bonding sites and one of them is a bonding site with $Ar^1$, another is a bonding site with $X^2$, and the other is a bonding site with a hydrogen atom or other atoms. These other atoms may be a part of atoms that constitute another constitutional unit.

Here, the trivalent aromatic hydrocarbon group refers to an atomic group obtained by removing three hydrogen atoms from a benzene ring or a condensed ring, and has the number of carbon atoms which are generally 6 to 60, preferably 6 to 20. Examples thereof may include the trivalent groups below.

[Chemical Formula 6]

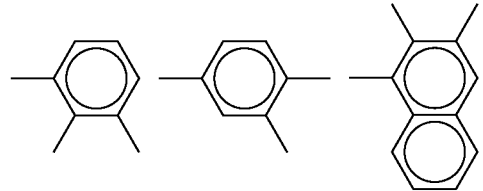

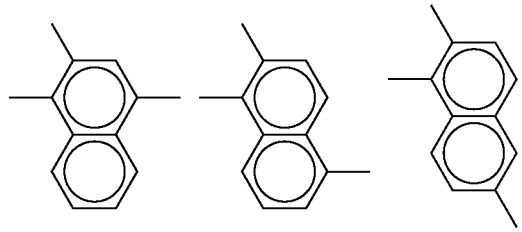

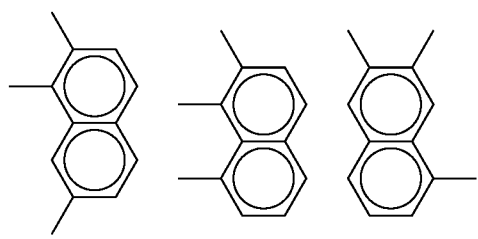

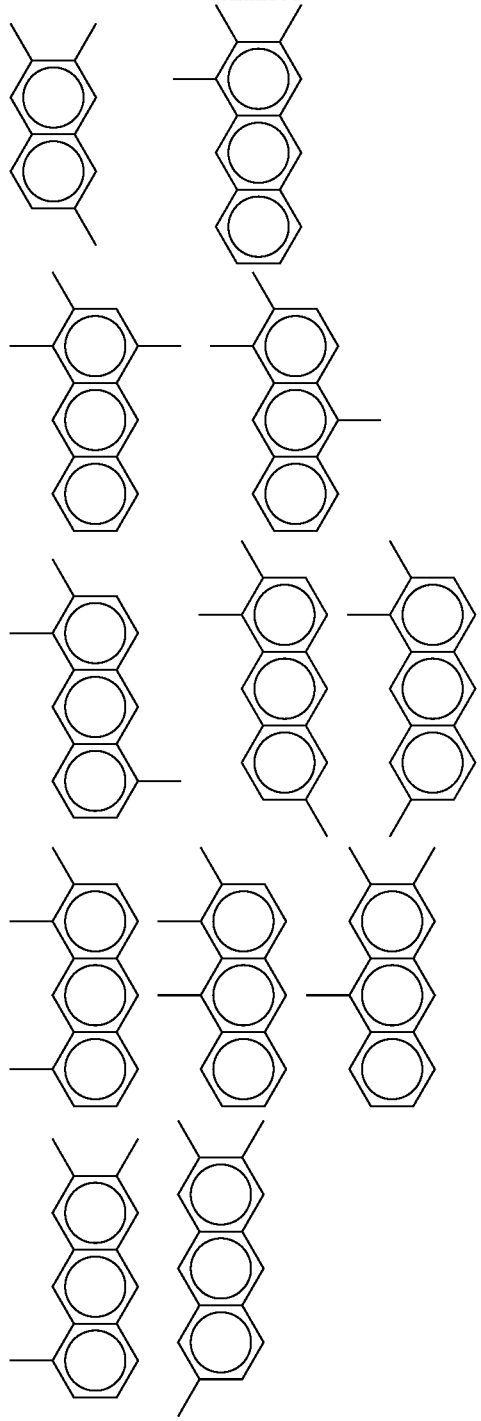
[Chemical Formula 7]
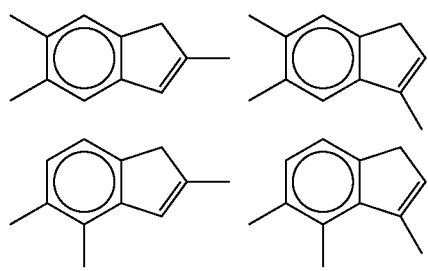
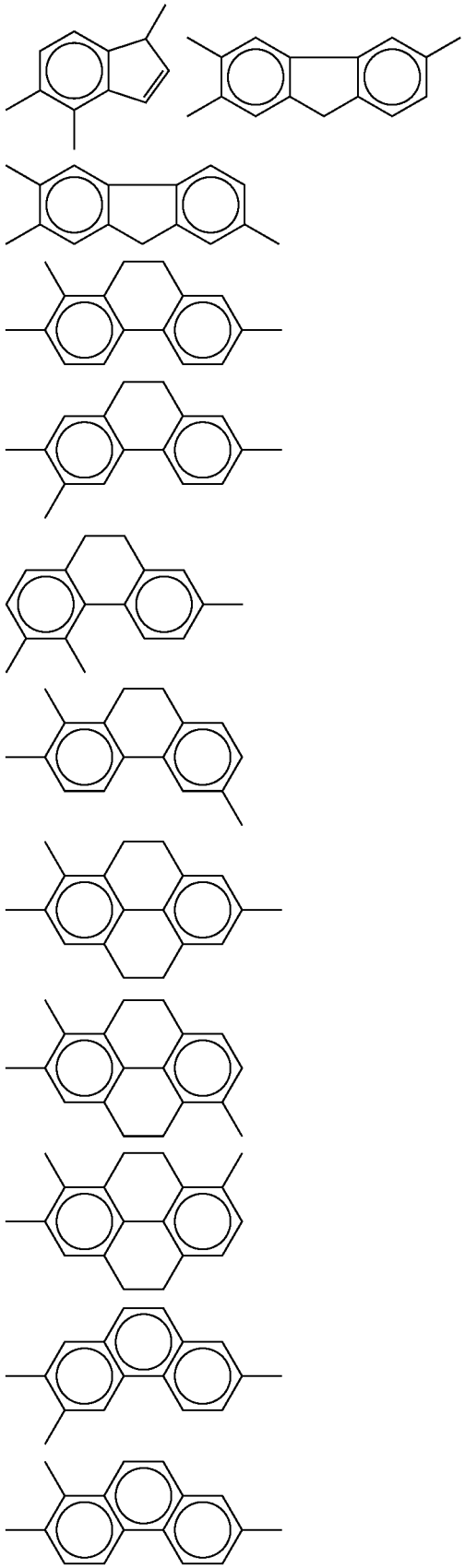

-continued

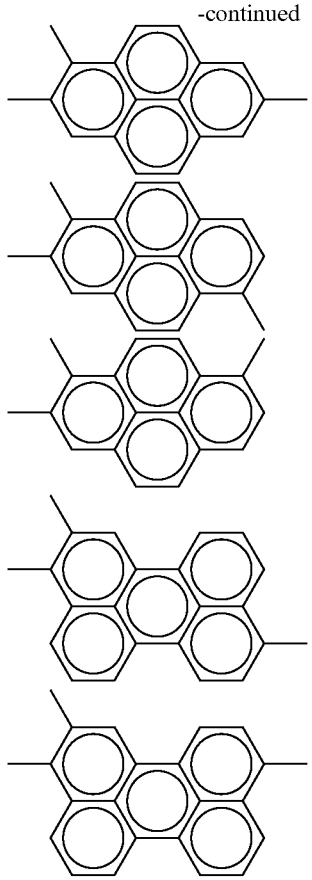

Here, the trivalent aromatic hydrocarbon group optionally has a substituent on the aromatic hydrocarbon group, and examples of the substituent may include a halogen atom, an alkyl group, an alkyloxy group, an alkylthio group, an aryl group, an aryloxy group, an arylthio group, an arylalkyl group, an arylalkyloxy group, an arylalkylthio group, an acyl group, an acyloxy group, an amido group, an acid imido group, an amino group, a substituted amino group, a substituted silyl group, a substituted silyloxy group, a substituted silylthio group, a substituted silylamino group, a monovalent heterocyclic group, an arylalkenyl group, an arylethynyl group, a carboxyl group, and a cyano group. In the number of carbon atoms of the trivalent aromatic hydrocarbon group, the number of carbon atoms of the substituent is not included. When the trivalent aromatic hydrocarbon group has a substituent and the substituent contains carbon atoms, the number of carbon atoms of the substituent is preferably 1 to 40, more preferably 1 to 20, further preferably 1 to 6.

The trivalent heterocyclic group refers to an atomic group obtained by removing three hydrogen atoms from a heterocyclic compound, and has the number of carbon atoms which are generally 4 to 60, preferably 4 to 20. The trivalent heterocyclic group optionally has a substituent on the heterocyclic group, and the number of carbons of the substituent is not included in the number of carbons of the heterocyclic group. As the trivalent heterocyclic group, a trivalent aromatic heterocyclic group is preferred. When the trivalent aromatic heterocyclic group has a substituent and the substituent contains carbon atoms, the number of carbon atoms of the substituent is preferably 1 to 40, more preferably 1 to 20, further preferably 1 to 6.

Here, the heterocyclic compound refers to an organic compound containing, in the ring thereof, as an element that constitutes the ring, not only a carbon atom, but also a heteroatom such as an oxygen atom, a sulfur atom, a nitrogen atom, a phosphorus atom, and a boron atom, among organic compounds having a cyclic structure.

Examples of the heterocyclic group may include trivalent groups below.

[Chemical Formula 8]

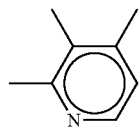 (201)

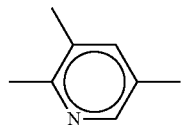 (202)

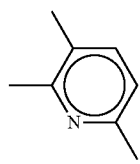 (203)

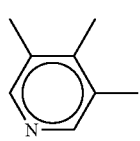 (204)

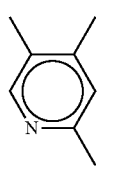 (205)

[Chemical Formula 9]

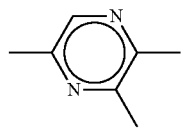 (206)

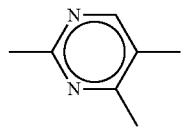 (207)

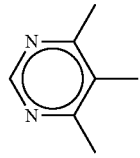 (208)

(209) 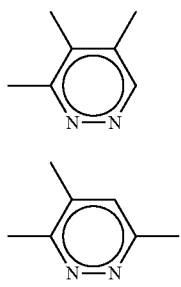
(210)
[Chemical Formula 10]
(211) 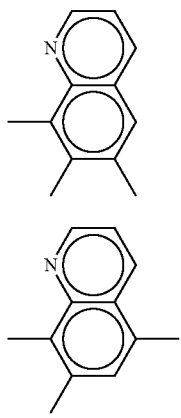
(212)
(213)
(214) 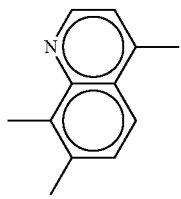
(215)
(216) 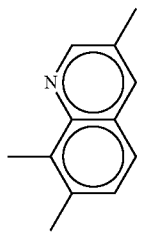
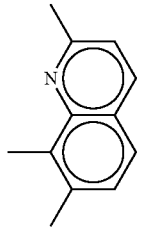
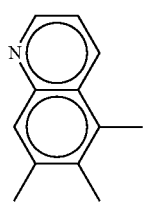
(217) 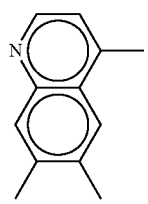
(218)
(219) 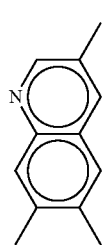
[Chemical Formula 11]
(220) 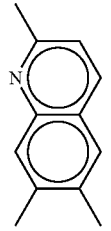
(221) 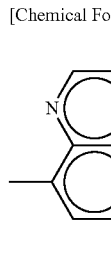
(222) 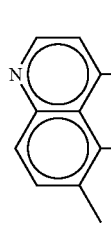
(223) 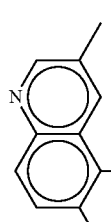
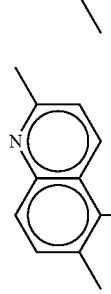
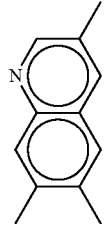

(224)
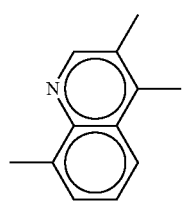
(225)
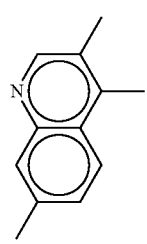
(226)
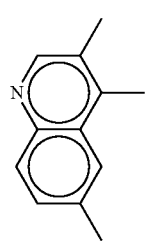
(227)
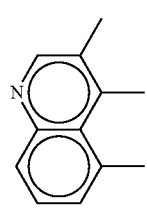
(228)
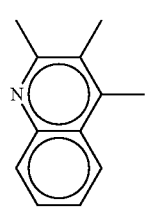
(229)
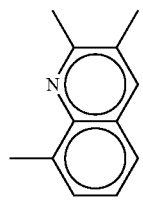
(230)
(231)
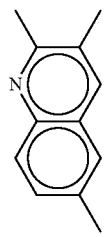
(232)
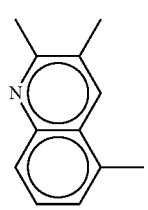
[Chemical Formula 12]
(233)
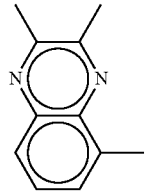
(234)
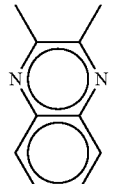
(235)
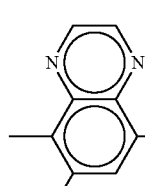
(236)
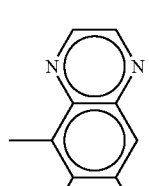
(237)
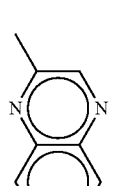

[Chemical Formula 13]
(238) 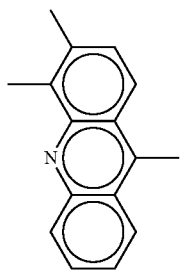
(239) 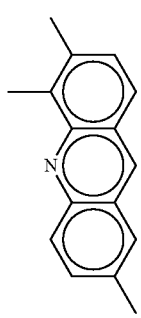
(240) 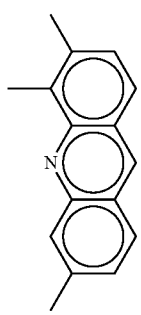
(241) 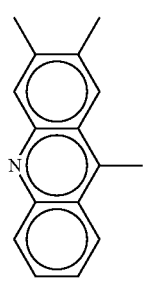
(242) 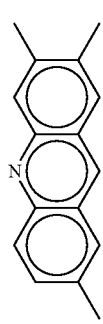
(243) 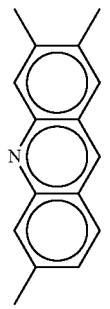
[Chemical Formula 14]
(244) 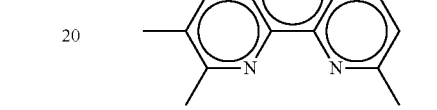
(245) 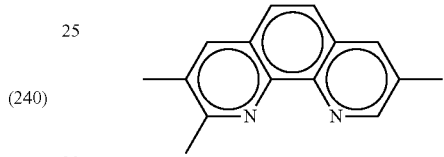
(246) 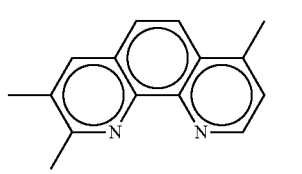
(247) 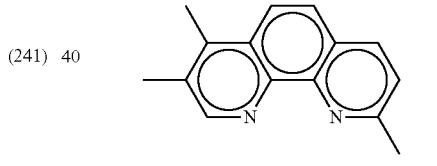
(248) 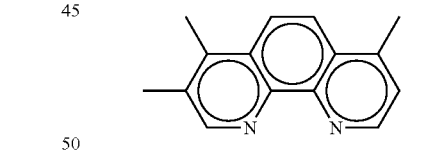
(249) 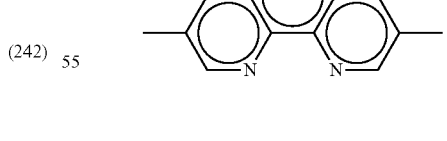
[Chemical Formula 15]
(250) 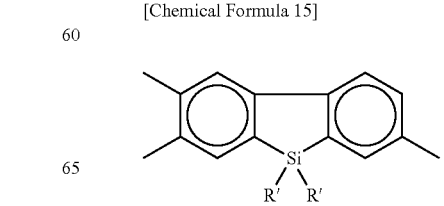

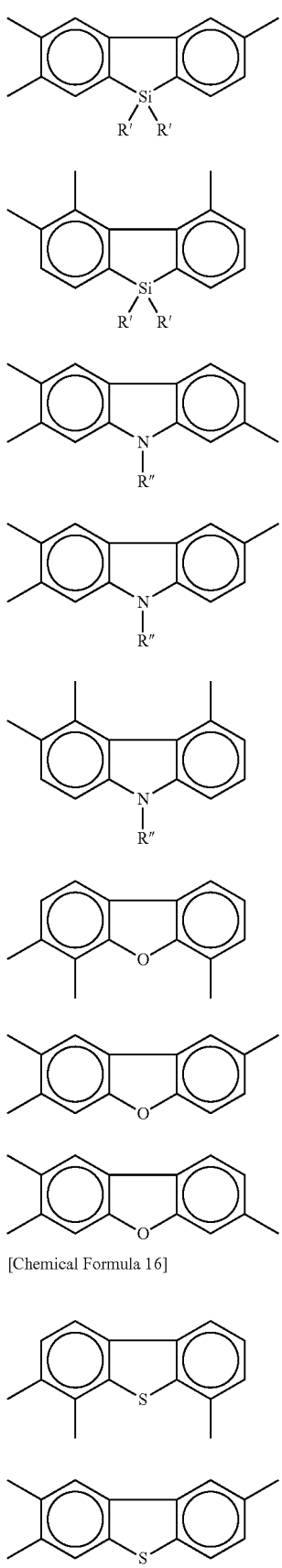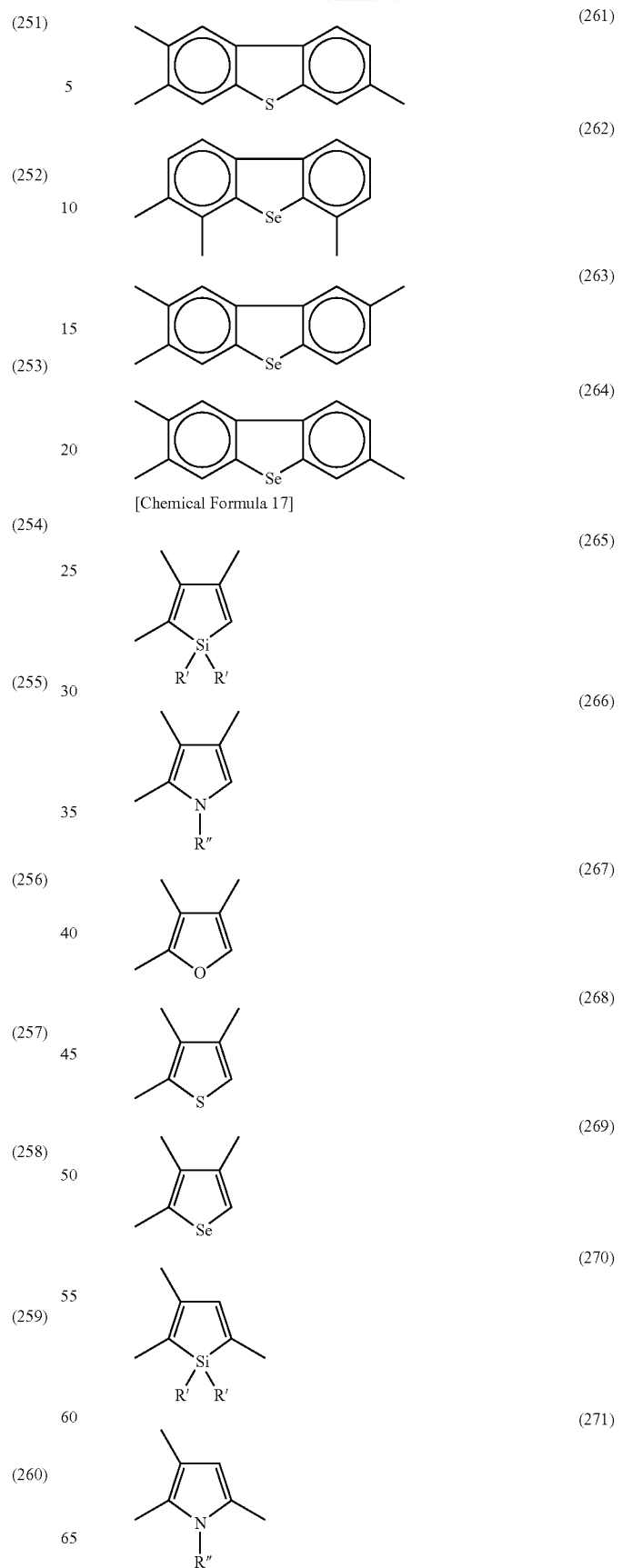

-continued (272) 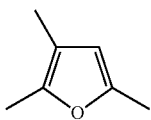

(273) 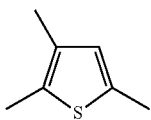

(274) 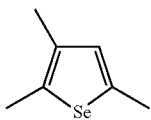

[Chemical Formula 18]

(275) 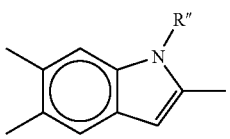

(276) 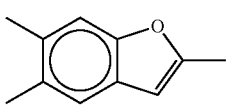

(277) 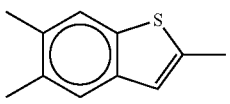

(278) 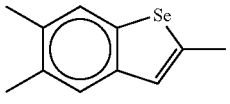

(279) 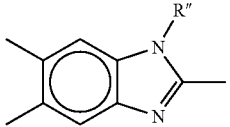

(280) 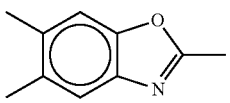

(281) 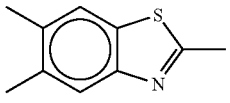

(282) 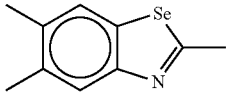

(283) 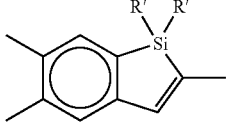

(284) 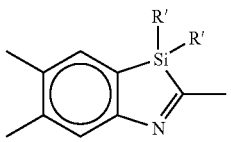

In Formula (201) to Formula (284), R's are the same as or different from each other and represent a hydrogen atom, a halogen atom, an alkyl group, an alkyloxy group, an alkylthio group, an aryl group, an aryloxy group, an arylthio group, an arylalkyl group, an arylalkyloxy group, an arylalkylthio group, a substituted amino group, an acyloxy group, an amido group, an arylalkenyl group, an arylalkynyl group, a monovalent heterocyclic group, or a cyano group.

R"s are the same as or different from each other and represent a hydrogen atom, an alkyl group, an aryl group, an arylalkyl group, a substituted silyl group, an acyl group, or a monovalent heterocyclic group.

The definition and specific examples of the halogen atom, the alkyl group, the alkyloxy group, the alkylthio group, the aryl group, the aryloxy group, the arylthio group, the arylalkyl group, the arylalkyloxy group, the arylalkylthio group, the substituted amino group, the acyloxy group, the amido group, the arylalkenyl group, the arylalkynyl group, or the monovalent heterocyclic group represented by R' are the same as the definition and specific examples of the halogen atom, the alkyl group, the alkyloxy group, the alkylthio group, the aryl group, the aryloxy group, the arylthio group, the arylalkyl group, the arylalkyloxy group, the arylalkylthio group, the substituted amino group, the acyloxy group, the amido group, the arylalkenyl group, the arylalkynyl group, or the monovalent heterocyclic group represented by the above $R^3$.

The definition and specific examples of the alkyl group, the aryl group, the arylalkyl group, the substituted silyl group, or the monovalent heterocyclic group represented by R" are the same as the definition and specific examples of the alkyl group, the aryl group, the arylalkyl group, the substituted silyl group, or the monovalent heterocyclic group represented by the above $R^3$.

In Formula (1), $X^1$ and $Ar^2$ are bonded with atoms (positions) adjacent to each other on a cycle that constitutes $Ar^1$, and $X^2$ and $Ar^1$ are bonded with atoms (positions) adjacent to each other on a cycle that constitutes $Ar^2$.

The structural unit represented by Formula (1) is preferably a structural unit (divalent group) represented by Formula (301) to Formula (493) or a structural unit having further a substituent on an aromatic hydrocarbon ring or a heterocycle contained in the above structural unit, more preferably a structural unit in which $Ar^1$ and $Ar^2$ are a trivalent heterocyclic group.

[Chemical Formula 19]

(301) 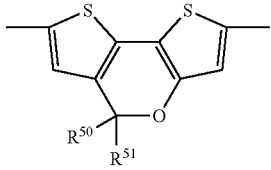

(302) 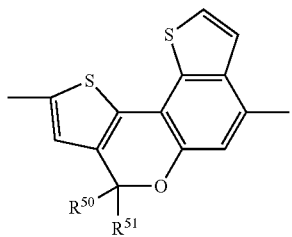
(303) 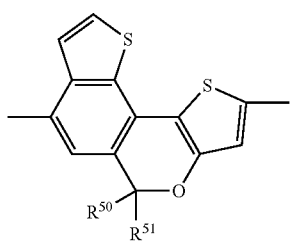
(304) 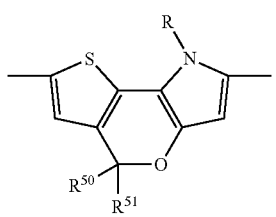
(305) 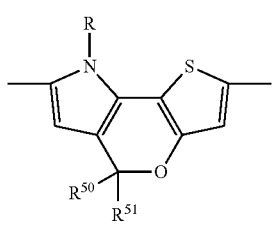
(306) 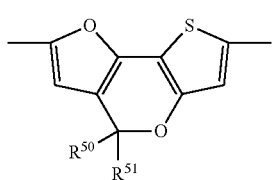
(307) 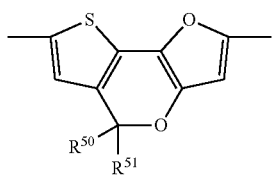
(308) 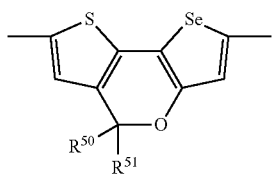
(309) 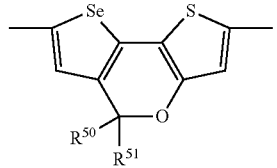
(310) 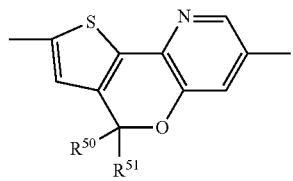
(311) 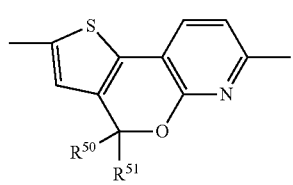
(312) 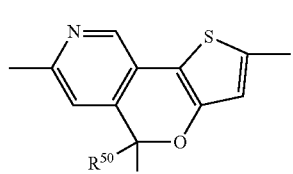
(313) 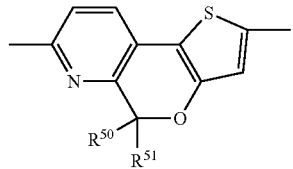
(314) 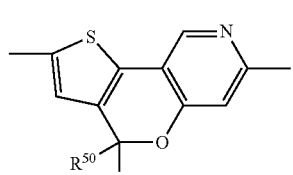
(315) 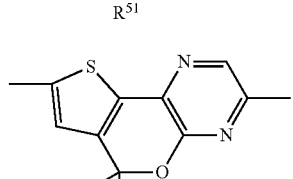
(316) 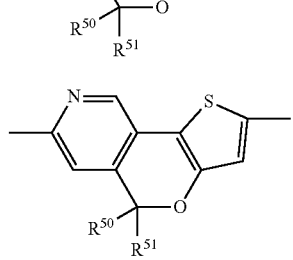

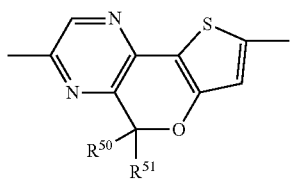 (317)
[Chemical Formula 20]
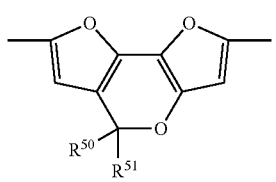 (318)
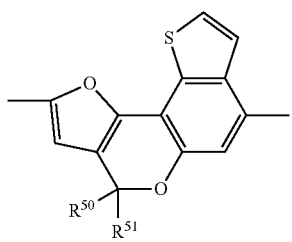 (319)
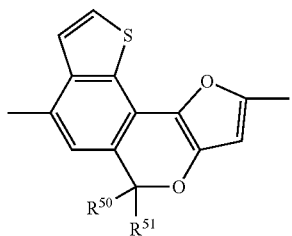 (320)
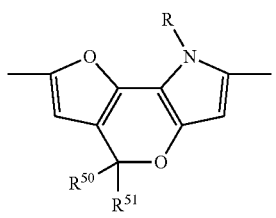 (321)
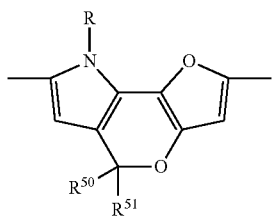 (322)
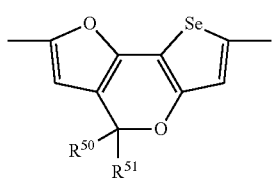 (323)
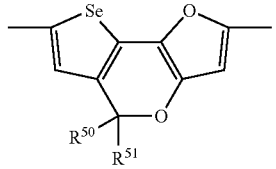 (324)
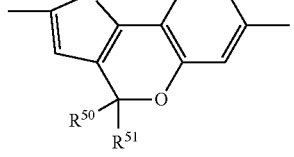 (325)
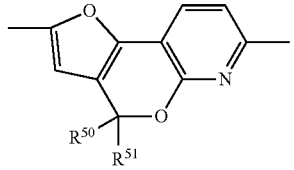 (326)
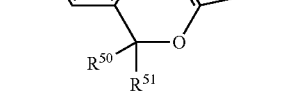 (327)
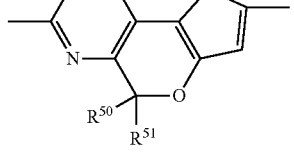 (328)
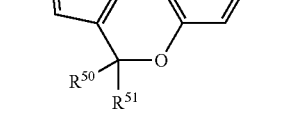 (329)
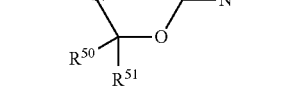 (330)
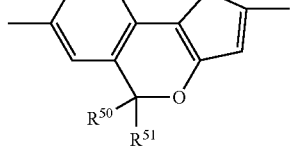 (331)

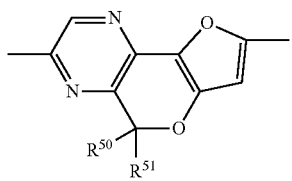
(332)
[Chemical Formula 21]
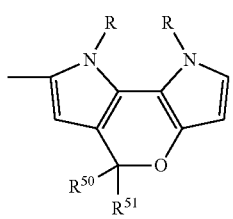
(333)
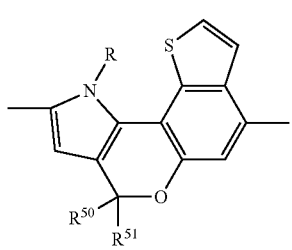
(334)
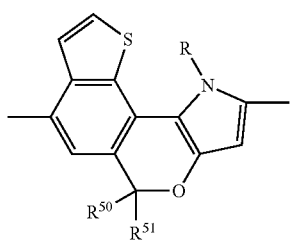
(335)
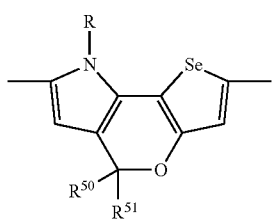
(336)
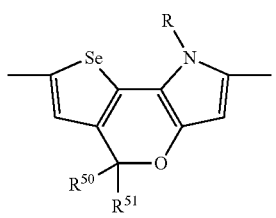
(337)
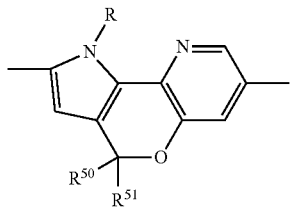
(338)
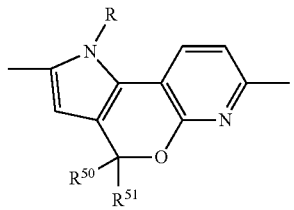
(339)
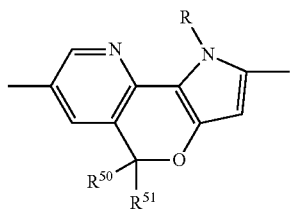
(340)
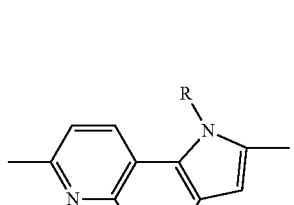
(341)
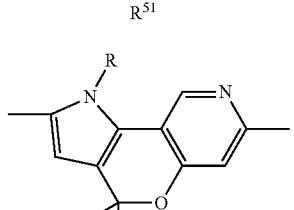
(342)
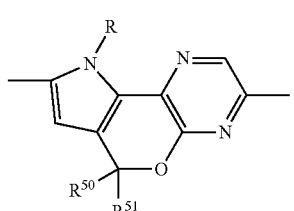
(343)
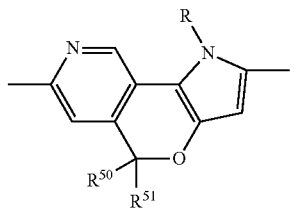
(344)
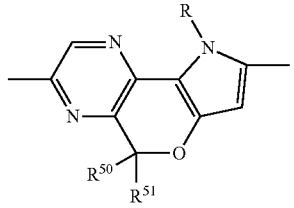
(345)

[Chemical Formula 22]
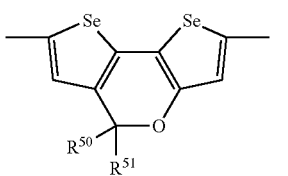 (346)
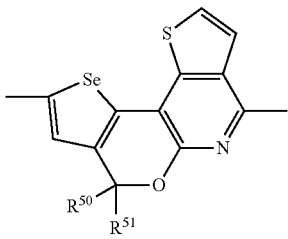 (347)
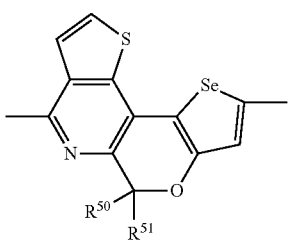 (348)
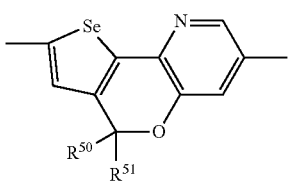 (349)
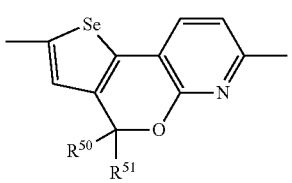 (350)
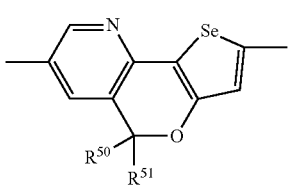 (351)
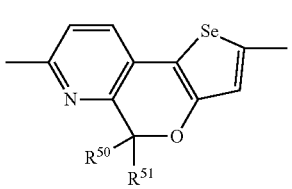 (352)
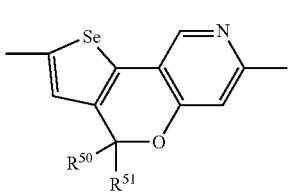 (353)
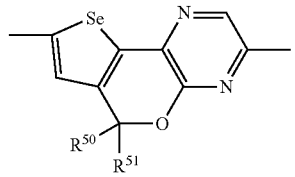 (354)
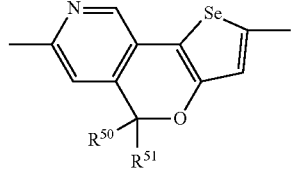 (355)
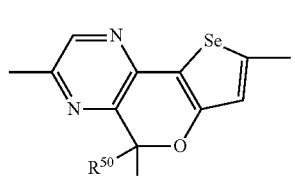 (356)
[Chemical Formula 23]
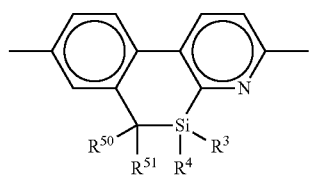 (356)
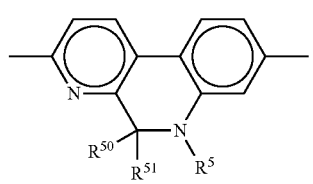 (357)
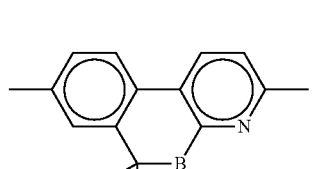 (358)
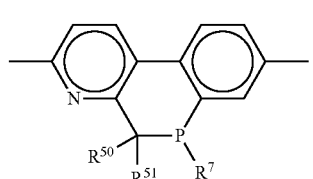 (359)
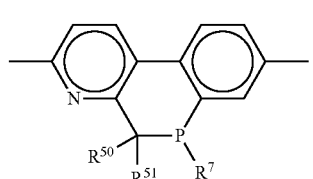 (360)

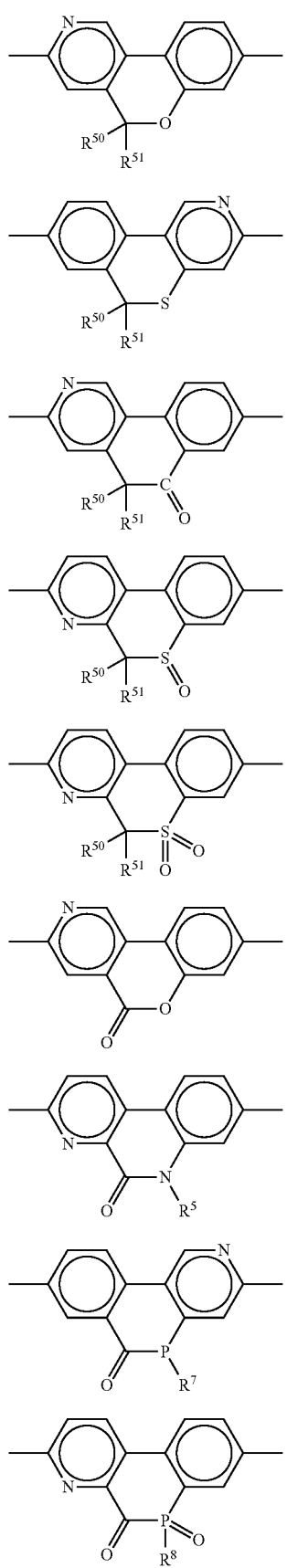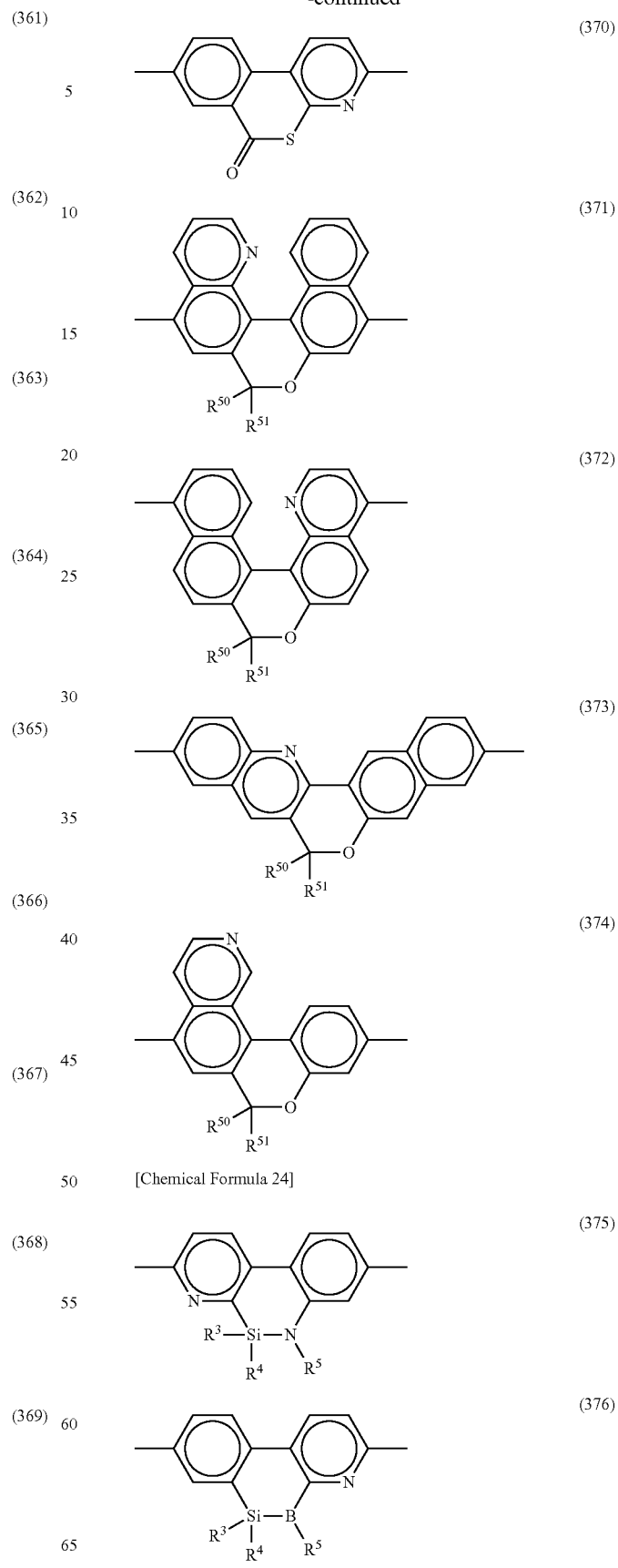

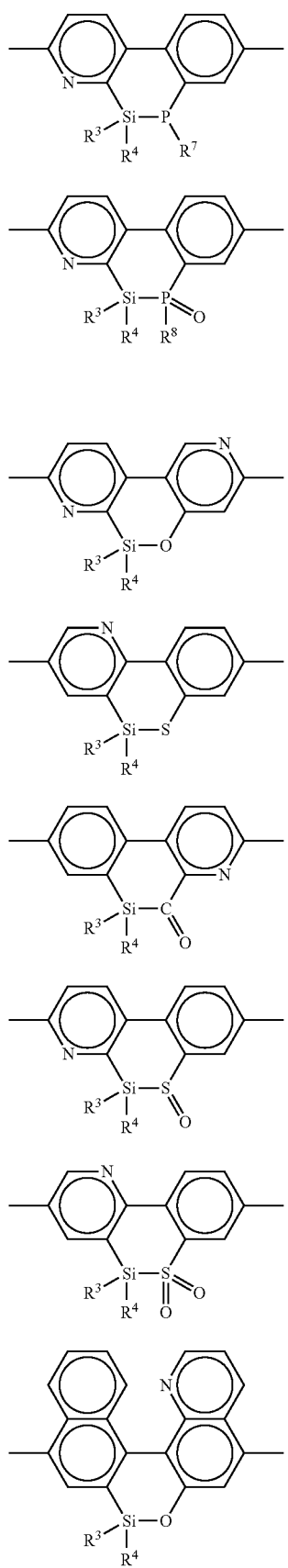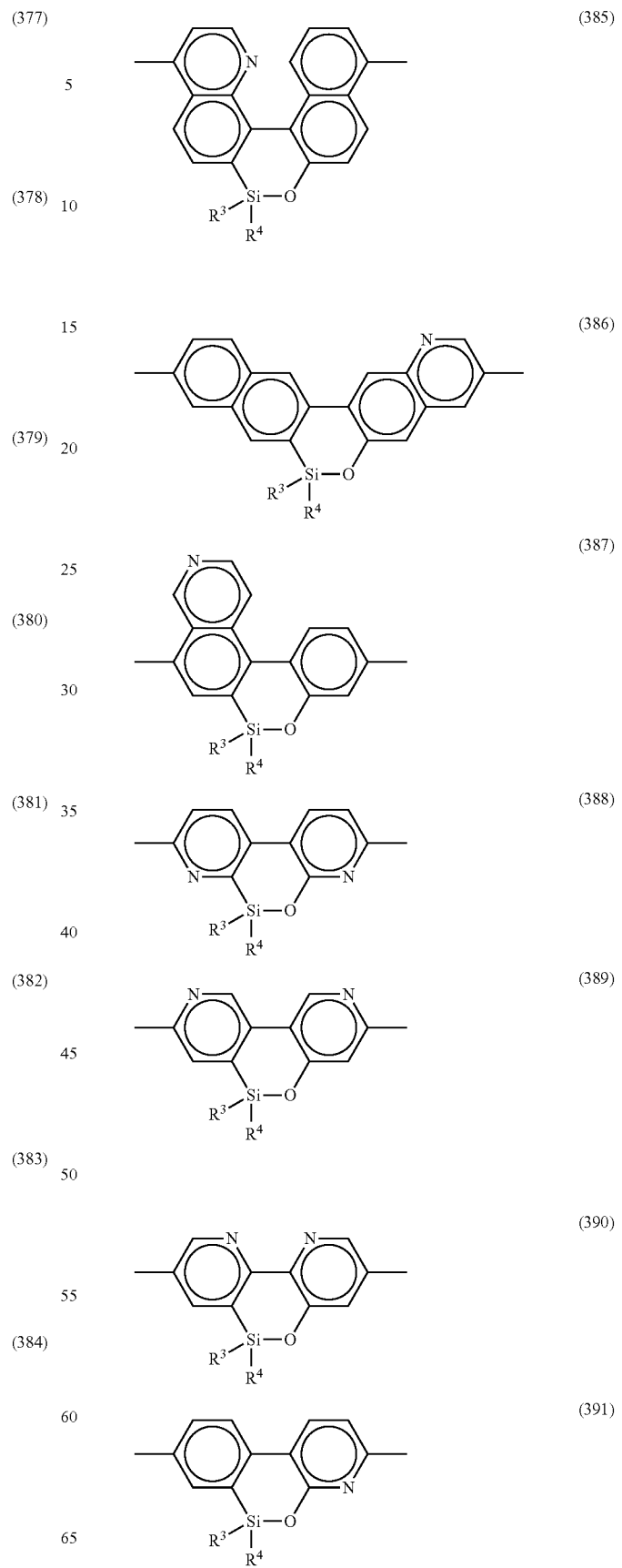

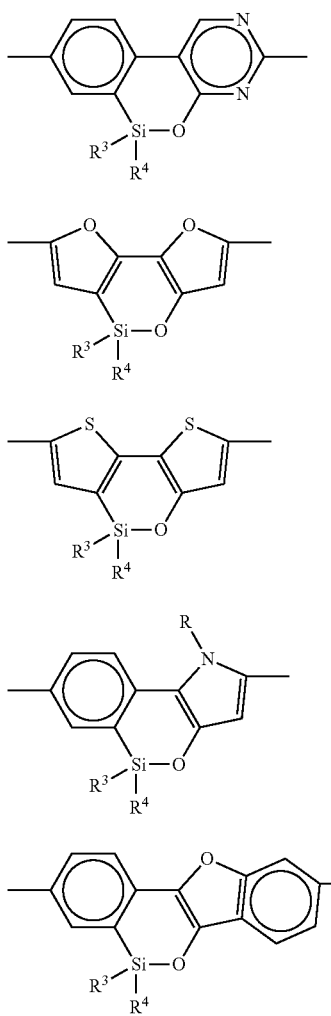
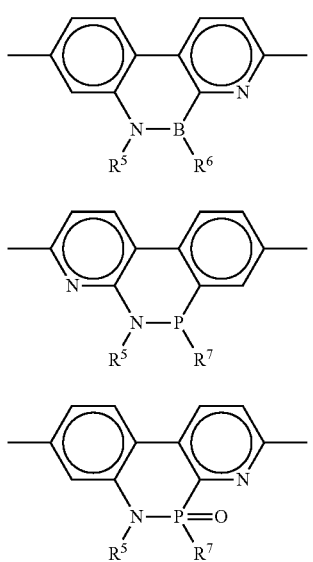
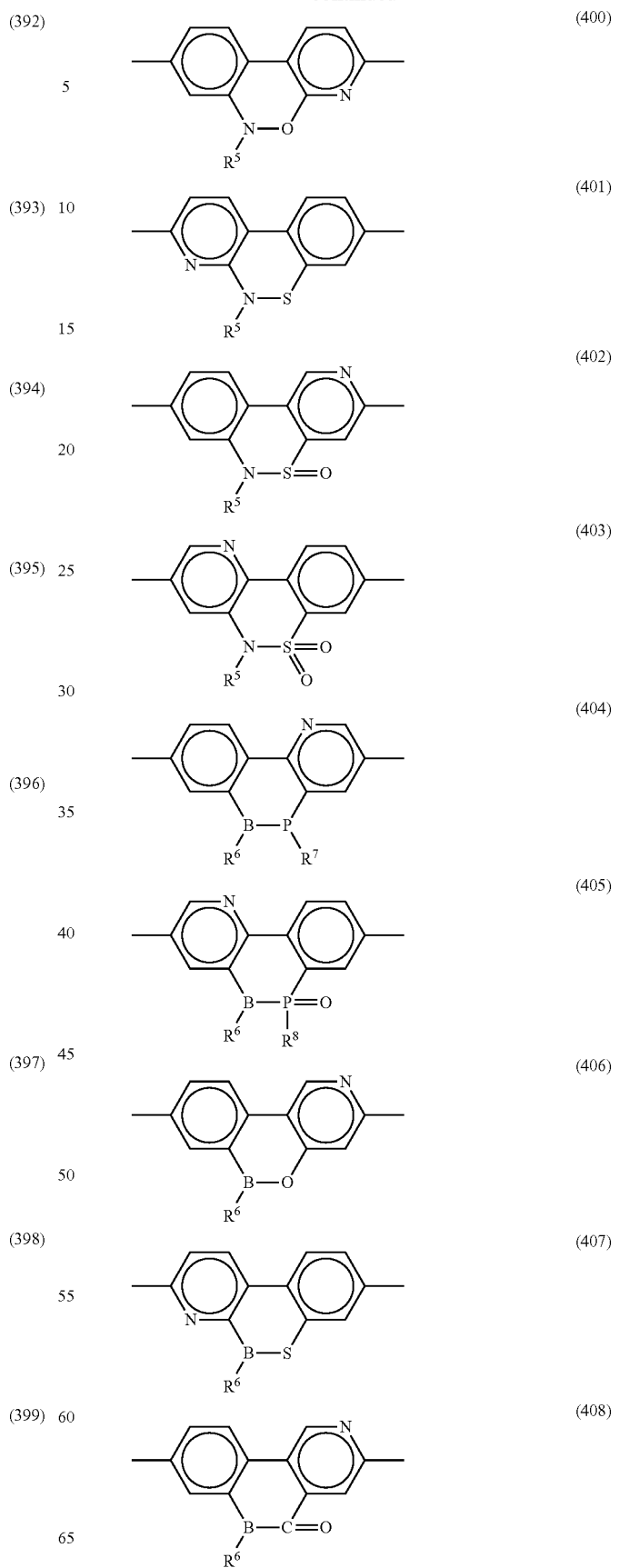

(409) 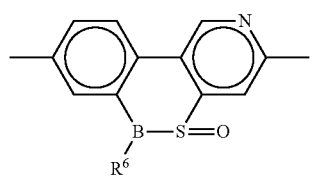
(410) 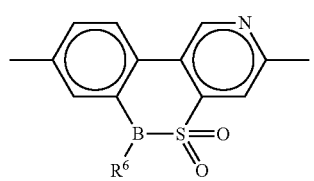
(411) 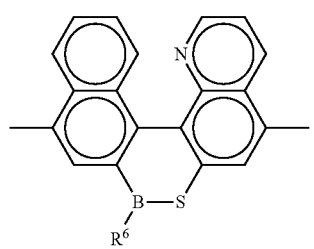
(412) 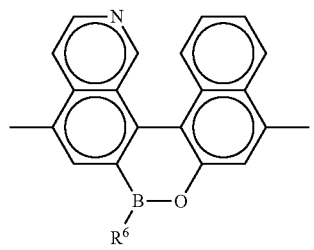
(413) 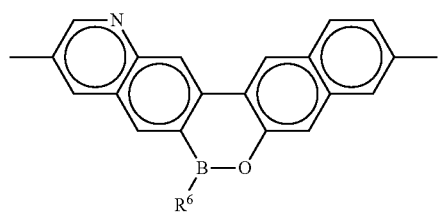
(414) 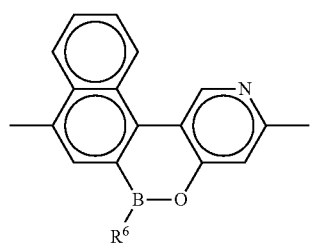
(415) 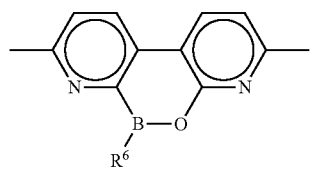
(416) 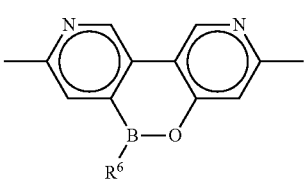
(417) 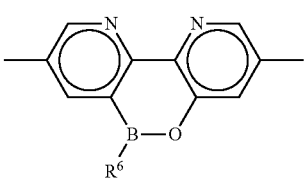
(418) 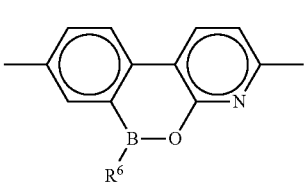
(419) 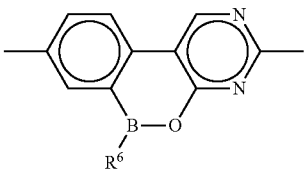
(420) 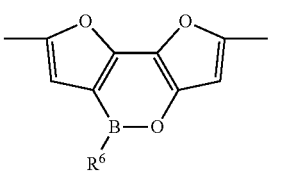
(421) 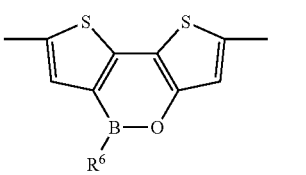
(422) 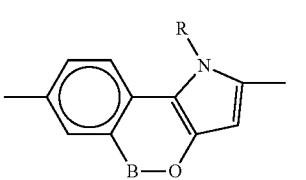
(423) 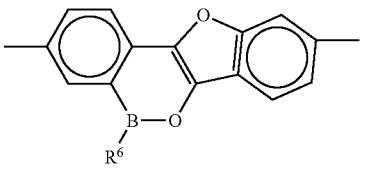

[Chemical Formula 26]
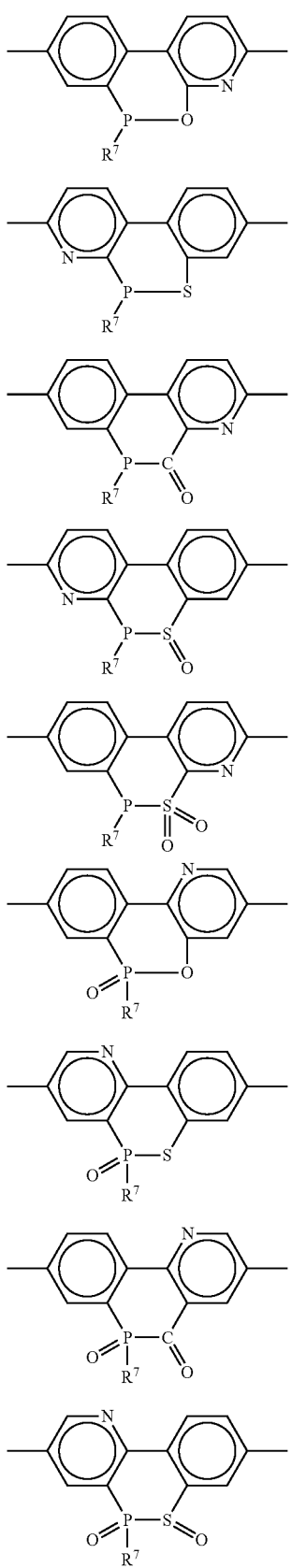
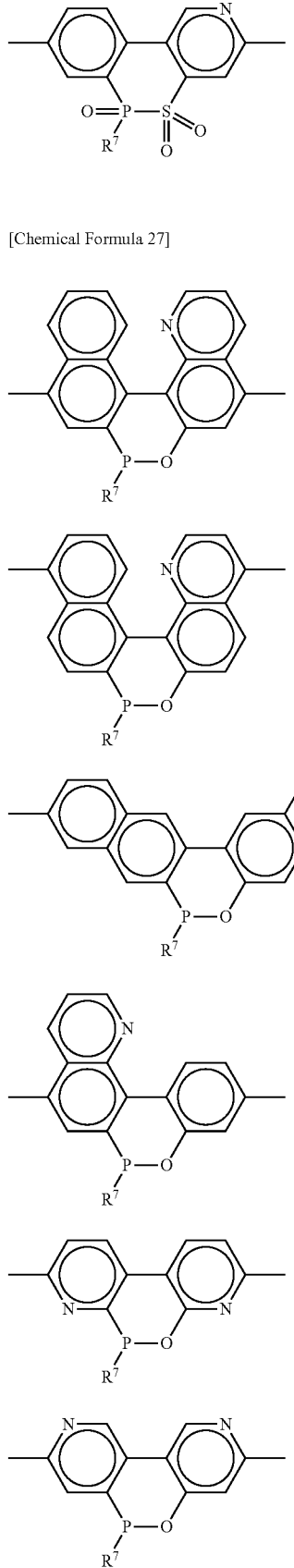
[Chemical Formula 27]

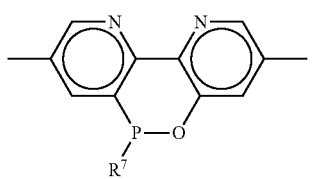
(440)
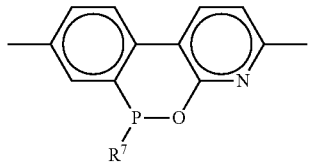
(441)
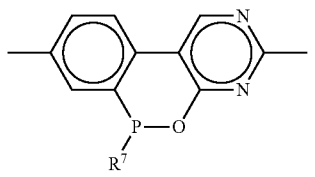
(442)
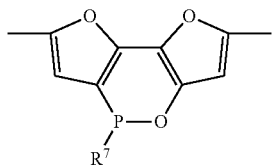
(443)
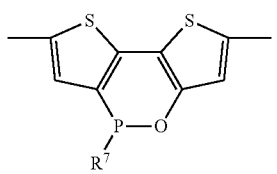
(444)
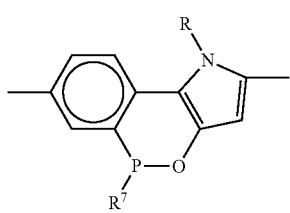
(445)
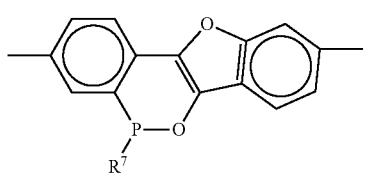
(446)
[Chemical Formula 28]
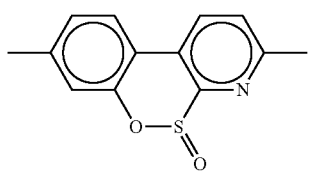
(447)
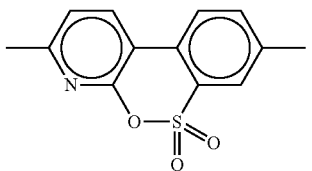
(448)
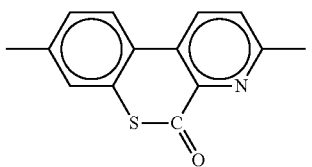
(449)
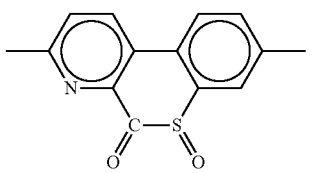
(450)
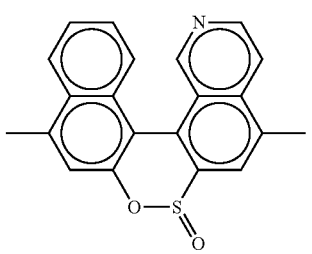
(451)
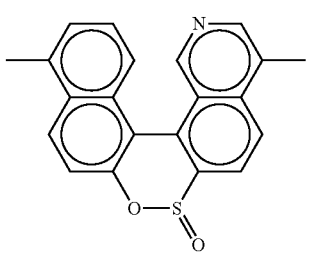
(452)
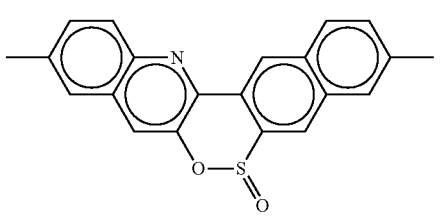
(453)
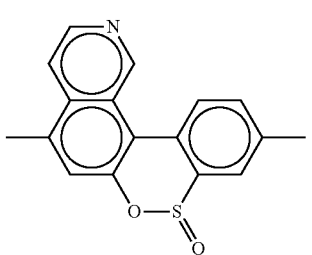
(454)

-continued
[Chemical Formula 29]
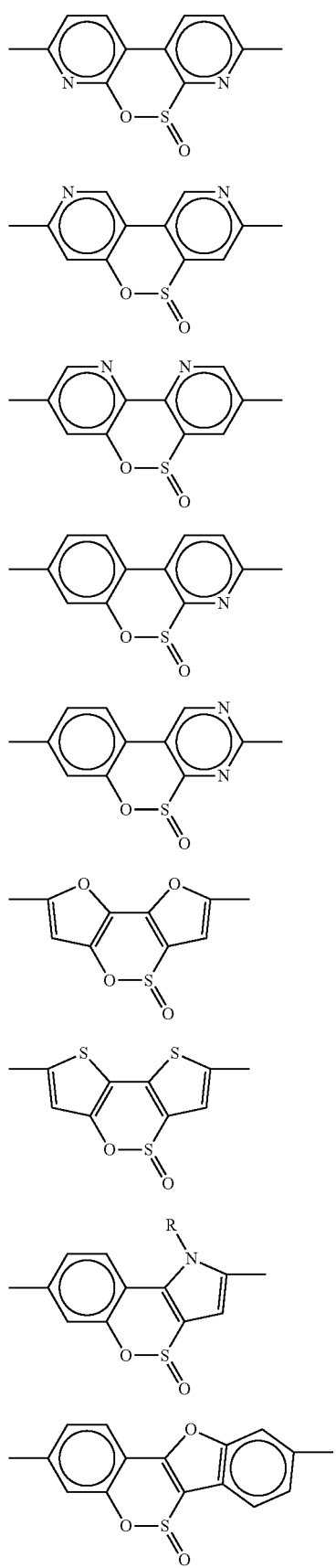
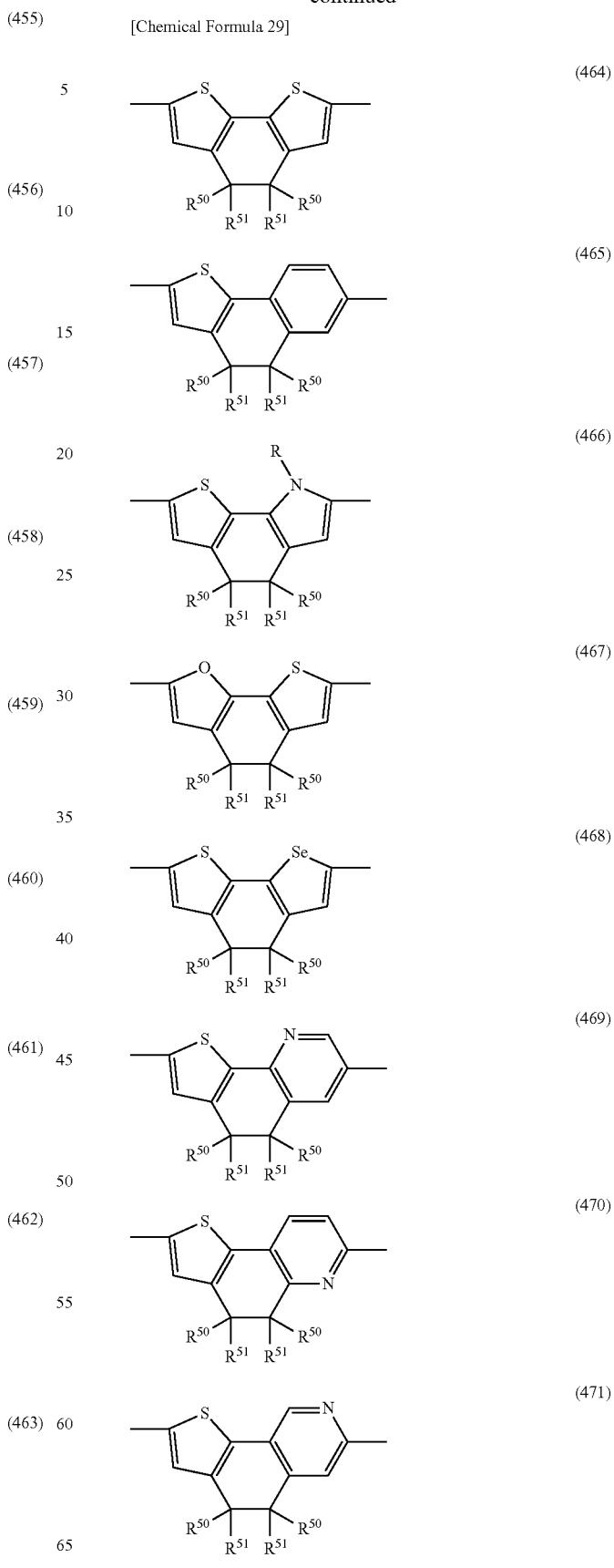

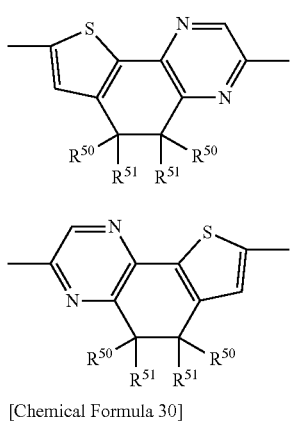
(471)
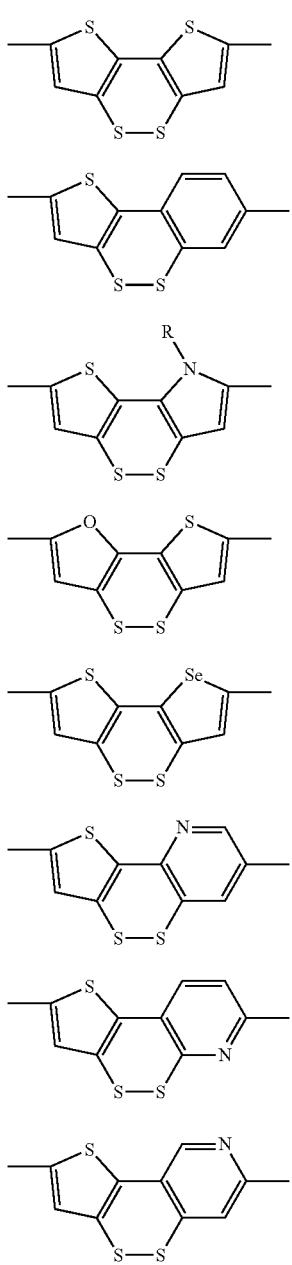
(472)
(473)
[Chemical Formula 30]
(474)
(475)
(476)
(477)
(478)
(479)
(480)
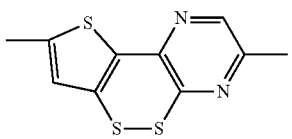
(482)
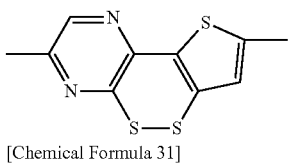
(483)
[Chemical Formula 31]
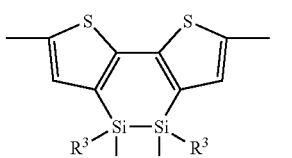
(484)
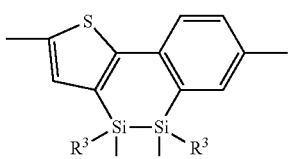
(485)
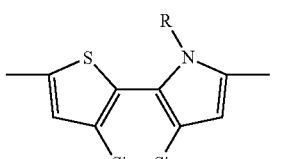
(486)
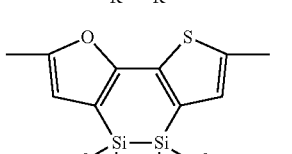
(487)
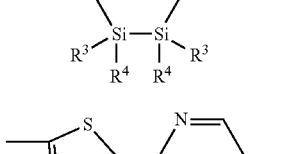
(488)
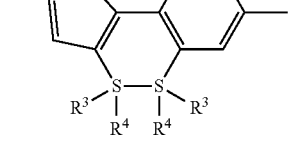
(489)
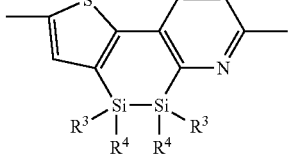
(490)

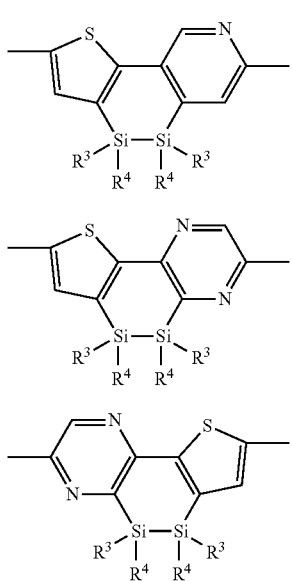

In Formula (301) to Formula (493), $R^{50}$, $R^{51}$, $R^3$, $R^4$, $R^5$, $R^6$, $R^7$, and $R^8$ represent the same as defined above.

In the formulae, R represents a hydrogen atom or a substituent. A plurality of Rs may be the same as or different from each other and may be bonded with each other to form a ring. When R is a substituent, examples of the substituent may include a group selected from an alkyl group, an alkyloxy group, an alkylthio group, an aryl group, an aryloxy group, an arylthio group, an arylalkyl group, an arylalkyloxy group, an arylalkylthio group, an arylalkenyl group, an arylalkynyl group, an amino group, a substituted amino group, a silyl group, a substituted silyl group, a halogen atom, an acyl group, an acyloxy group, an amido group, a monovalent heterocyclic group, a carboxyl group, a substituted carboxyl group, a nitro group, and a cyano group. A hydrogen atom contained in these substituents is optionally substituted with a fluorine atom.

The definition and specific examples of the alkyl group, the alkyloxy group, the alkylthio group, the aryl group, the aryloxy group, the arylthio group, the arylalkyl group, the arylalkyloxy group, the arylalkylthio group, the arylalkenyl group, the arylalkynyl group, the substituted amino group, the substituted silyl group, the halogen atom, the acyl group, the acyloxy group, the amido group, or the monovalent heterocyclic group represented by R are the same as the definition and specific examples of the alkyl group, the alkyloxy group, the alkylthio group, the aryl group, the aryloxy group, the arylthio group, the arylalkyl group, the arylalkyloxy group, the arylalkylthio group, the arylalkenyl group, the arylalkynyl group, the substituted amino group, the substituted silyl group, the halogen atom, the acyl group, the acyloxy group, the amido group, or the monovalent heterocyclic group represented by the above $R^3$.

The substituted carboxyl group which generally has 2 to 20 carbon atoms is used, and examples thereof may include a group having a methyl ester structure, a group having an ethyl ester structure, and a group having a butyl ester structure.

The macromolecular compound used in the photovoltaic cell of the present invention preferably has a structural unit different from a structural unit represented by Formula (1), in addition to the structural unit represented by Formula (1). In this case, it is preferred that the structural unit represented by Formula (1) and the structural unit different from the structural unit represented by Formula (1) form a conjugation. The conjugation in the present invention refers to a state in which: unsaturated bonds and single bonds are chained in the order of an unsaturated bond—a single bond—an unsaturated bond; two π bonds of π orbitals are adjacent to each other and π electrons of π bonds are arranged in parallel; and π electrons are not localized over a double bond or a triple bond, but spread over an adjacent single bond to be delocalized. Here, the unsaturated bond refers to a double bond or a triple bond.

Examples of the structural unit different from the structural unit represented by Formula (1) may include divalent groups, and examples of the divalent group may include an arylene group and a divalent heterocyclic group.

Here, the arylene group is an atomic group obtained by removing two hydrogen atoms from an aromatic hydrocarbon, and the number of carbon atoms that constitutes the ring is generally around 6 to 60, preferably 6 to 20. Here, the aromatic hydrocarbons include an aromatic hydrocarbon having a benzene ring, an aromatic hydrocarbon having a condensed ring, and an aromatic hydrocarbon in which two or more of independent benzene rings or condensed rings are bonded with each other either directly or through a group such as vinylene.

Specific examples of the arylene group may include a phenylene group (for example, Formulae 1 to 3 below), a naphthalene-diyl group (Formulae 4 to 13 below), an anthracene-diyl group (Formulae 14 to 19 below), a biphenyl-diyl group (Formulae 20 to 25 below), a terphenyl-diyl group (Formulae 26 to 28 below), and a condensed ring compound group (Formulae 29 to 38 below). The condensed ring compound group may include a fluorene-diyl group (Formulae 36 to 38 below).

The divalent heterocyclic group refers to an atomic group obtained by removing two hydrogen atoms from a heterocyclic compound, and the number of carbons that constitutes the ring is generally around 3 to 60.

Here, the heterocyclic compound refers to an organic compound containing, in the ring thereof, as an element that constitutes the ring, not only a carbon atom, but also a heteroatom such as an oxygen atom, a sulfur atom, a nitrogen atom, a phosphorus atom, a boron atom, and an arsenic atom, among organic compounds having a cyclic structure.

Examples of the divalent heterocyclic group may include the followings:

a divalent heterocyclic group containing nitrogen as the heteroatom such as a pyridine-diyl group (Formulae 39 to 44 below), a diazaphenylene group (Formulae 45 to 48 below), a quinoline-diyl group (Formulae 49 to 63 below), a quinoxaline-diyl group (Formulae 64 to 68 below), an acridine-diyl group (Formulae 69 to 72 below), a bipyridyl-diyl group (Formulae 73 to 75 below), and a phenanthroline-diyl group (Formulae 76 to 78 below);

a group containing a silicon atom, a nitrogen atom, a sulfur atom, a selenium atom, or the like as the heteroatom and having a fluorene structure (Formulae 79 to 93 below);

a 5-membered heterocyclic group containing a silicon atom, a nitrogen atom, a sulfur atom, a selenium atom, or the like as the heteroatom (Formulae 94 to 98 below);

a 5-membered ring-condensed heterocyclic group containing a silicon atom, a nitrogen atom, a sulfur atom, a selenium atom, or the like as the heteroatom (Formulae 99 to 110 below);

a 5-membered heterocyclic group containing a silicon atom, a nitrogen atom, a sulfur atom, a selenium atom, or the like as the heteroatom that is bonded with other 5-membered heterocycles at an α-position of the heteroatom to form a dimer or an oligomer (Formulae 111 and 112 below);

a 5-membered heterocyclic group containing a silicon atom, a nitrogen atom, a sulfur atom, a selenium atom, or the like as the heteroatom that is bonded with phenyl groups at an α-position of the heteroatom (Formulae 113 to 119 below);

a group in which a 5-membered ring-condensed heterocyclic group containing an oxygen atom, a nitrogen atom, a sulfur atom, a selenium atom, or the like as the heteroatom is substituted with a phenyl group, a furyl group, or a thienyl group (Formulae 120 to 127 below);

a group in which 5-membered heterocycles containing a nitrogen atom, a sulfur atom, a selenium atom, or the like as the heteroatom are condensed with each other (Formulae 128 to 139 below); and a group in which benzene rings and thiophene rings are condensed with each other (Formulae 140 to 143 below).

[Chemical Formula 32]

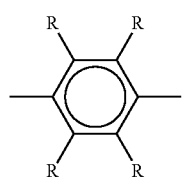

1

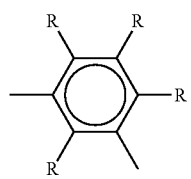

2

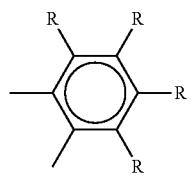

3

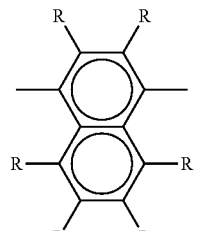

4

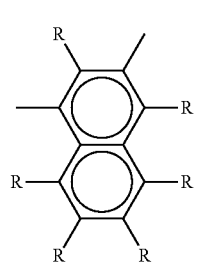

5

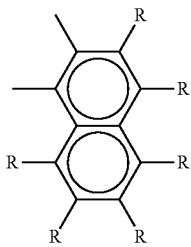

6

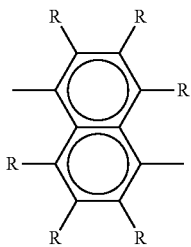

7

[Chemical Formula 33]

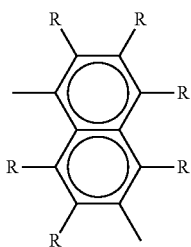

8

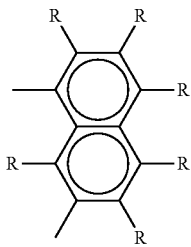

9

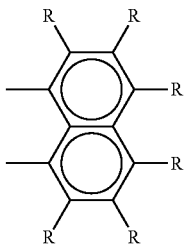

10

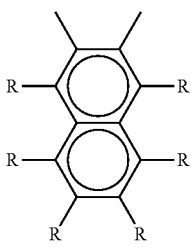

11

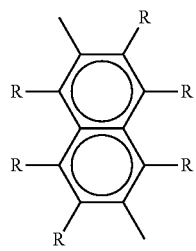
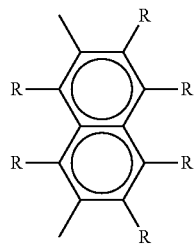
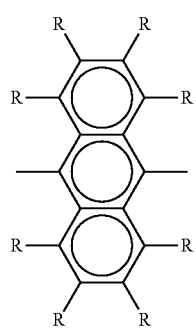
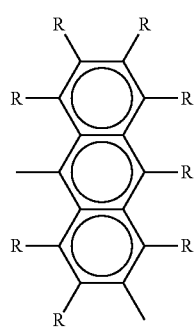
[Chemical Formula 34]
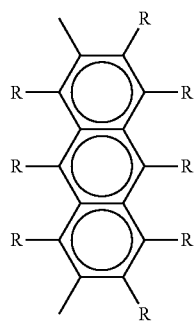
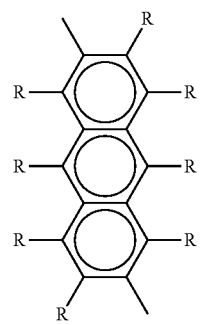
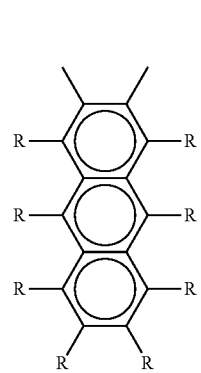
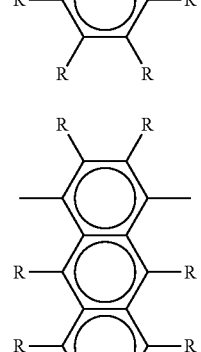
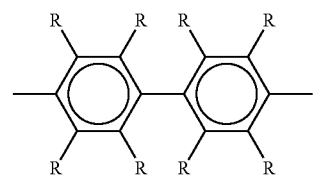
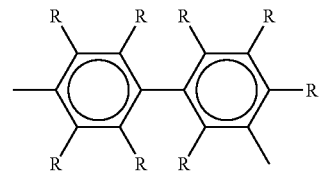
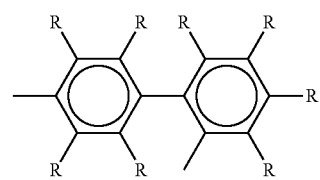

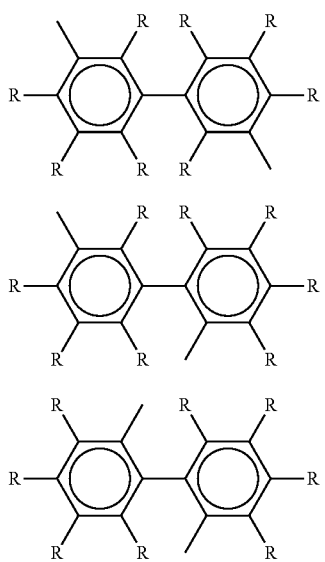
[Chemical Formula 35]
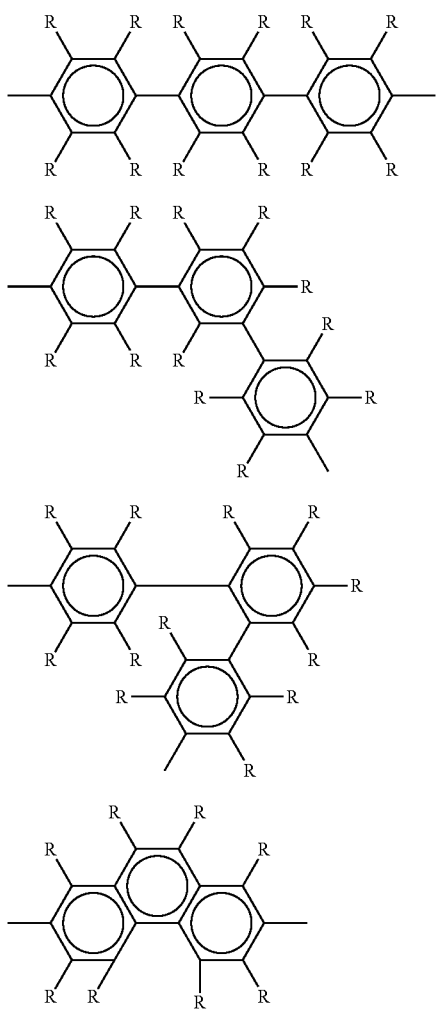
[Chemical Formula 36]
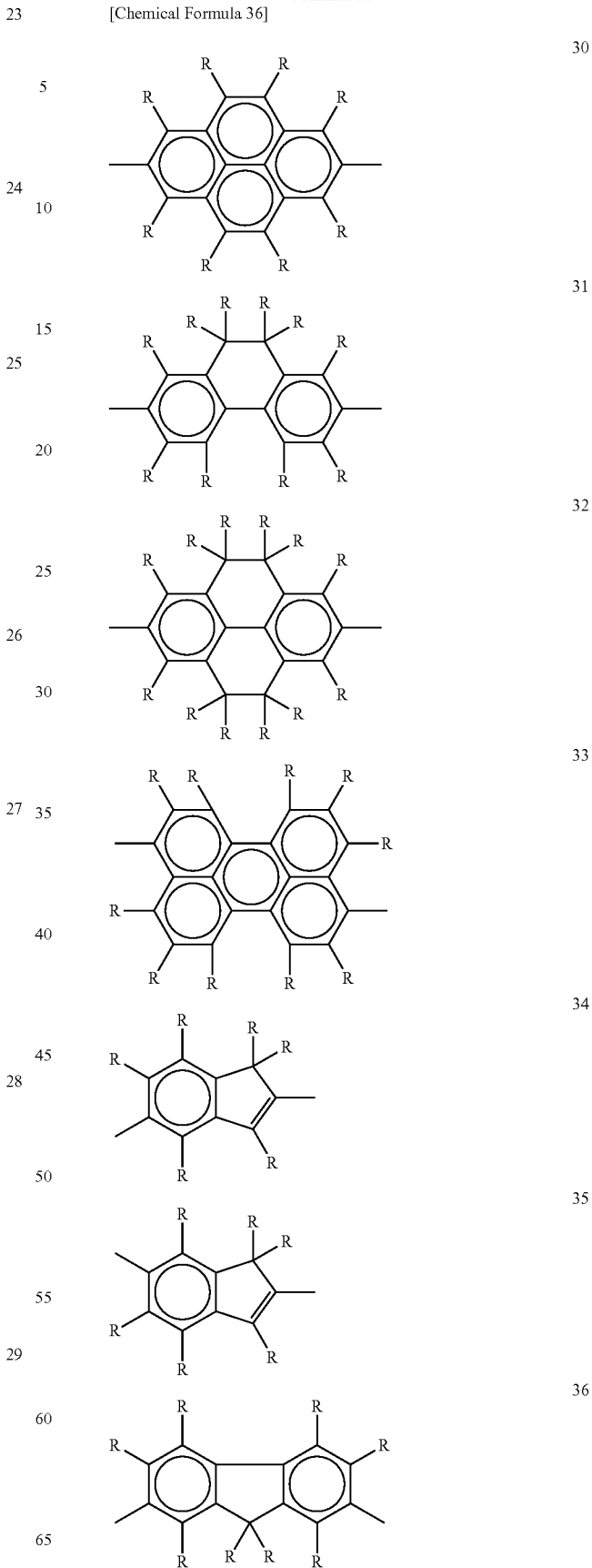

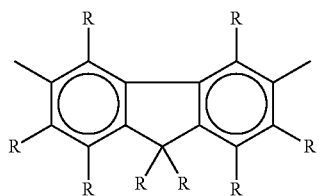
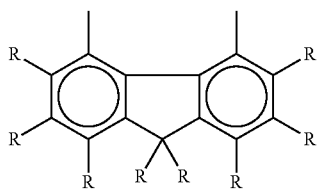
[Chemical Formula 37]
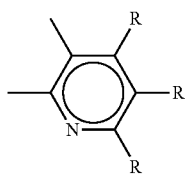
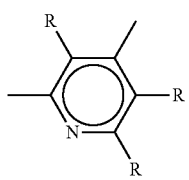
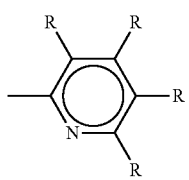
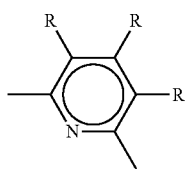
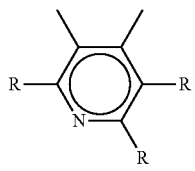
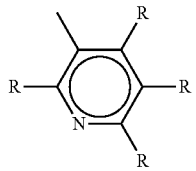
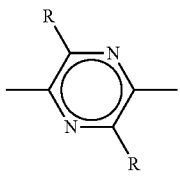
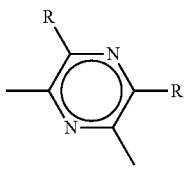
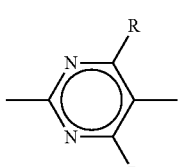
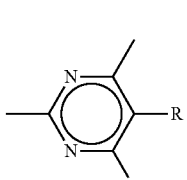
[Chemical Formula 38]
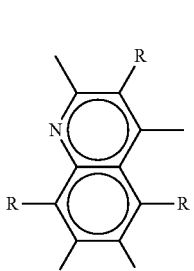
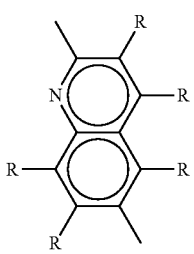
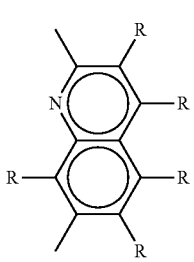

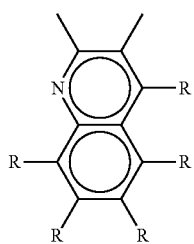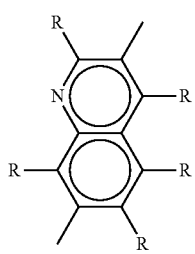
52
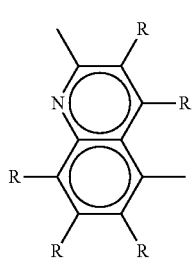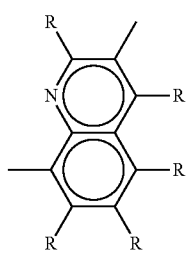
53
[Chemical Formula 39]
54
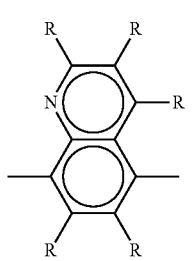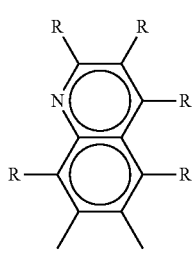
55
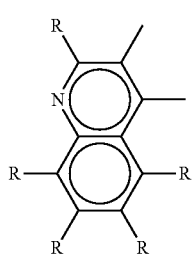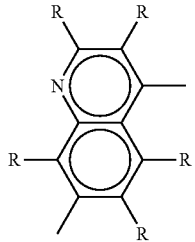
56
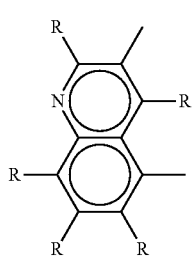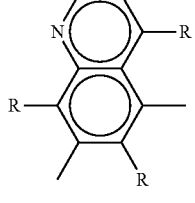
57
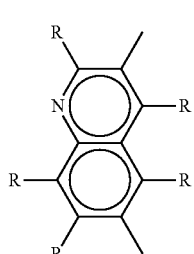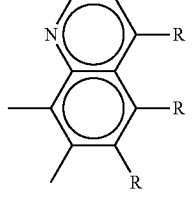
58
59
60
61
62
63

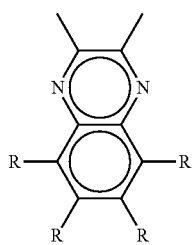
64
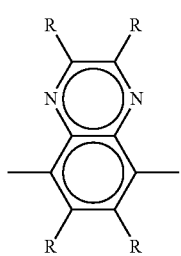
65
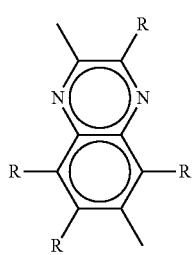
66
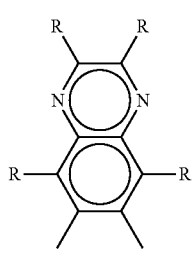
67
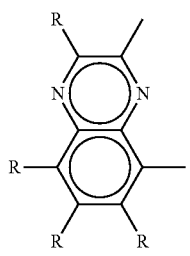
68
[Chemical Formula 40]
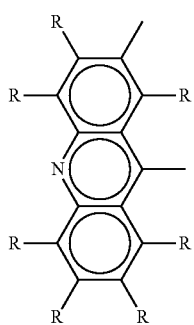
69
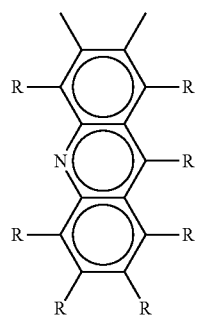
70
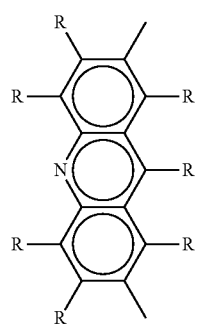
71
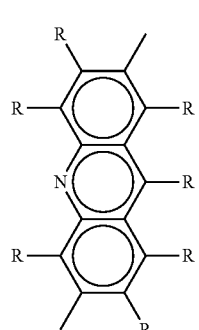
72
[Chemical Formula 41]
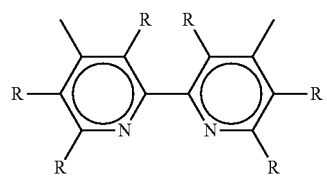
73
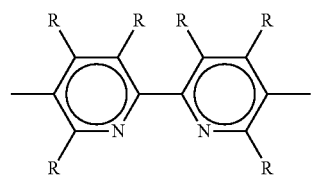
74
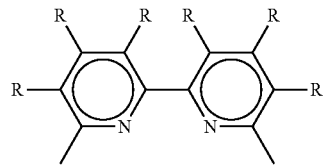
75

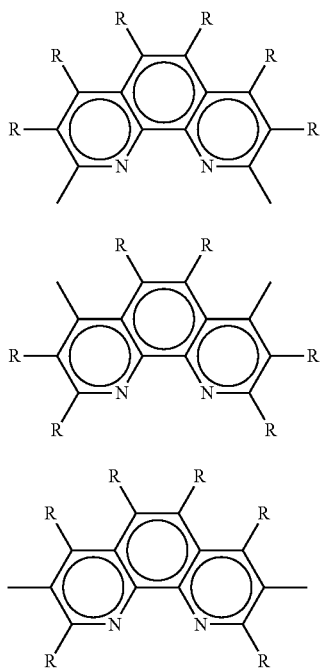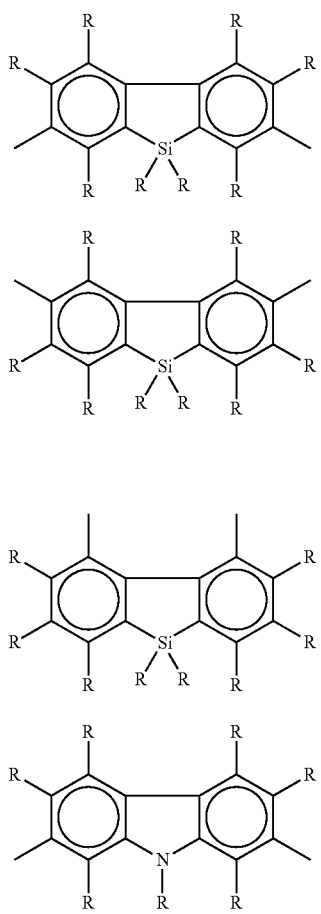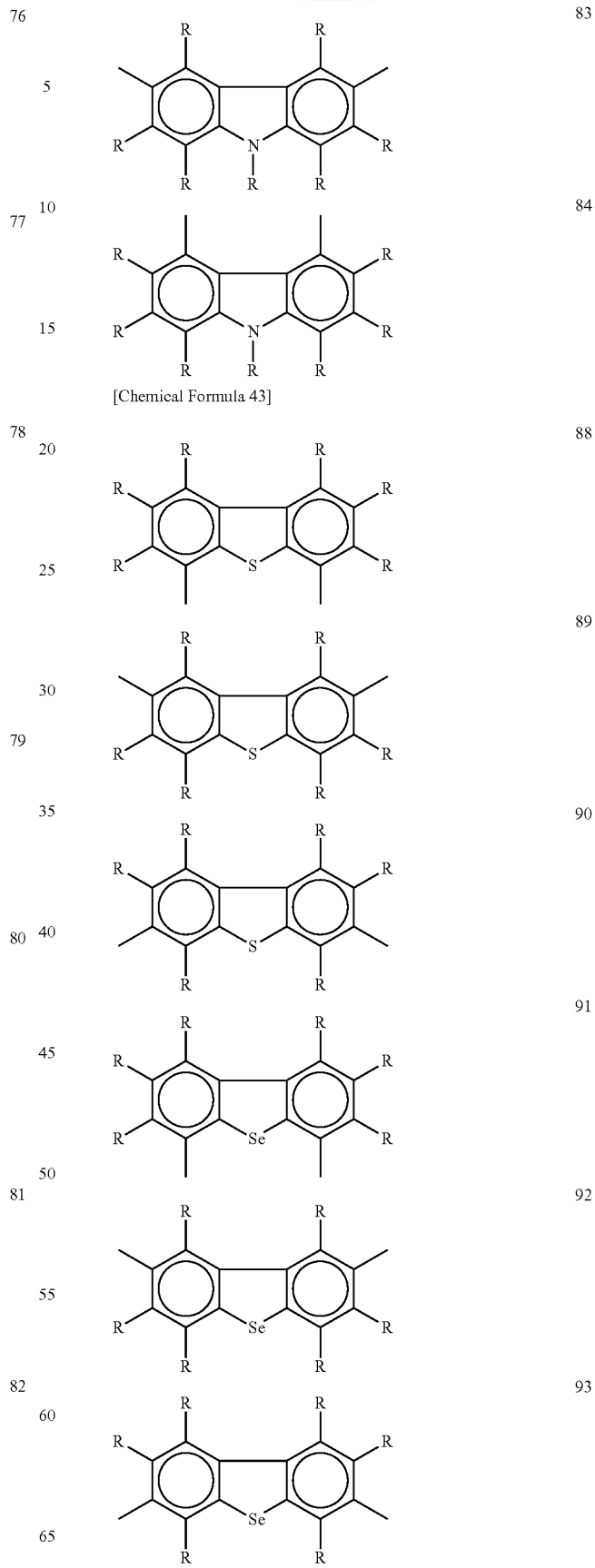

[Chemical Formula 44]
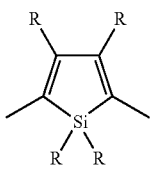 94
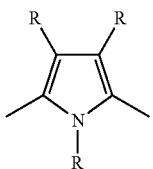 95
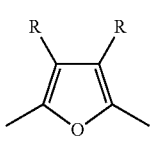 96
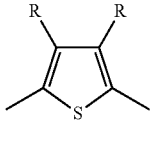 97
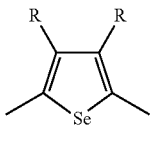 98
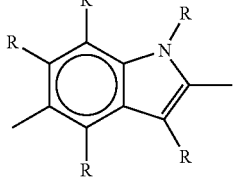 99
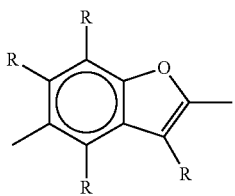 100
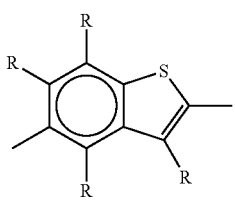 101
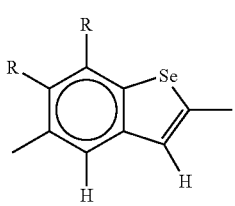 102
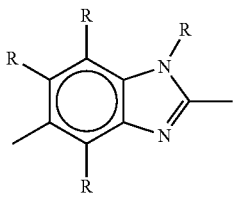 103
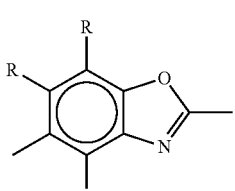 104
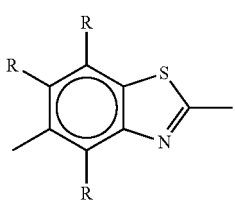 105
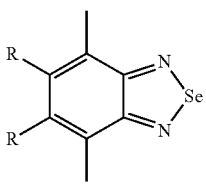 106
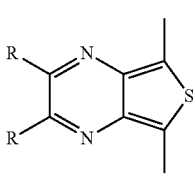 107
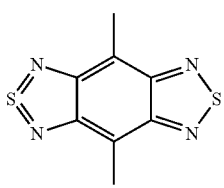 108
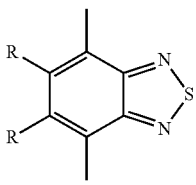 109
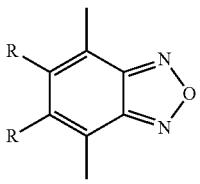 110

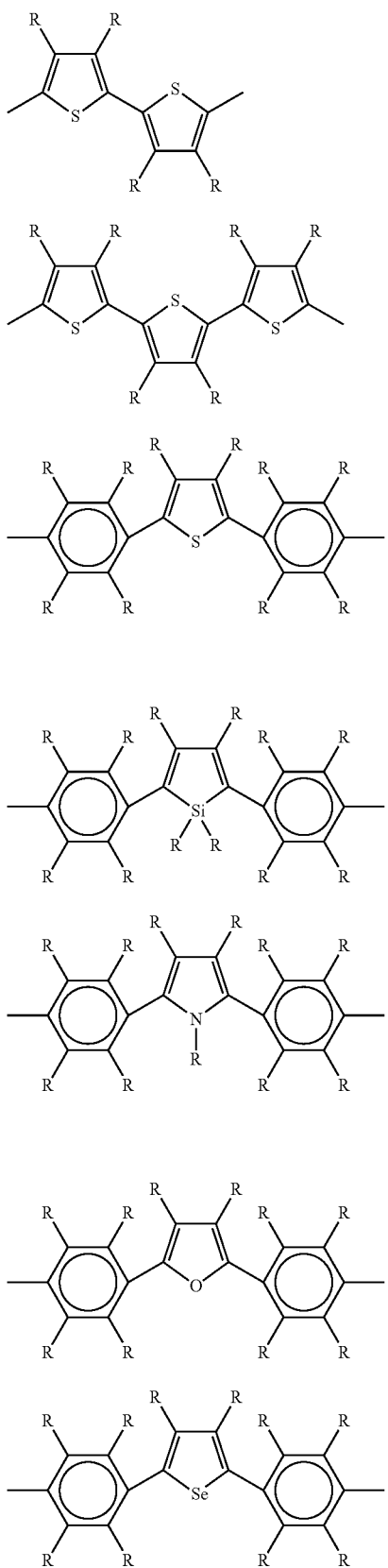
[Chemical Formula 45]
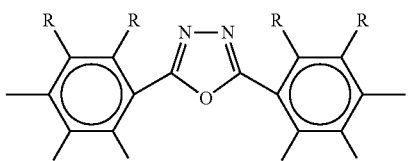
111
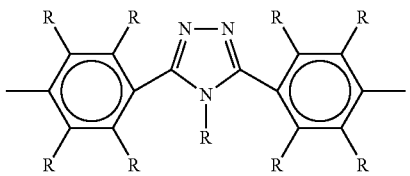
112
[Chemical Formula 46]
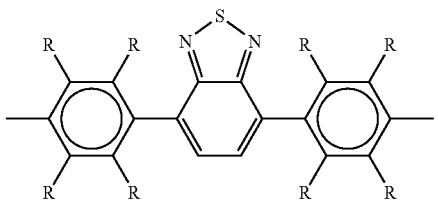
113
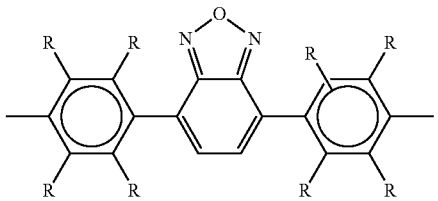
114
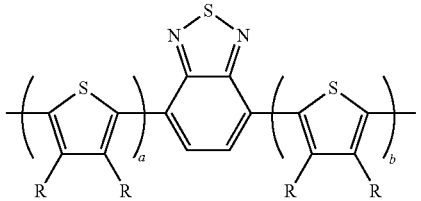
115
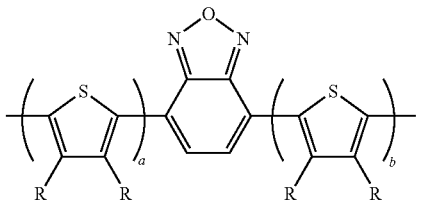
116
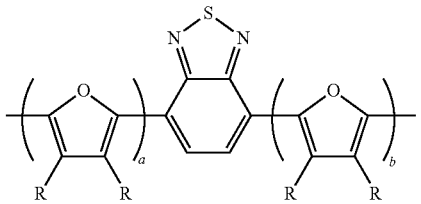
117

125
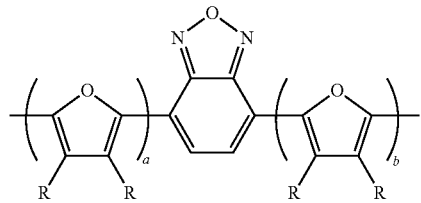
[Chemical Formula 47]
126
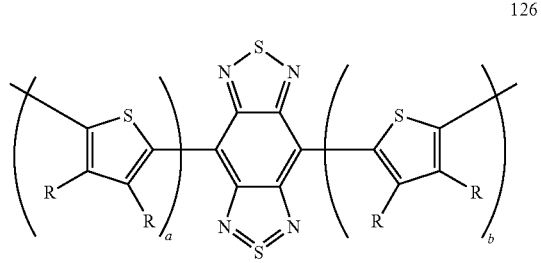
127
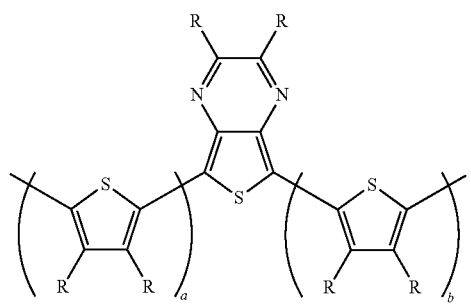
[Chemical Formula 48]
128
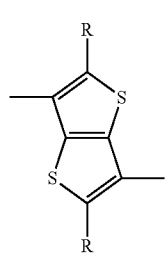
129
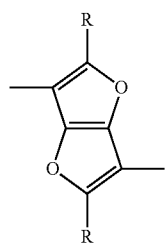
130
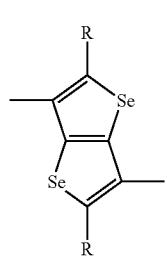
131
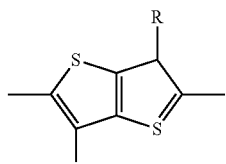
132
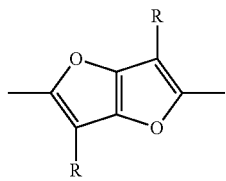
133
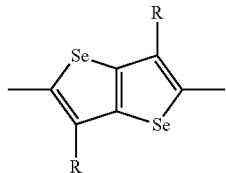
134
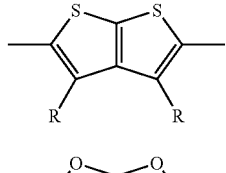
135
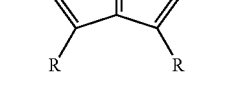
136
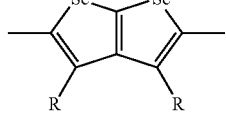
137
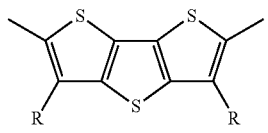
138
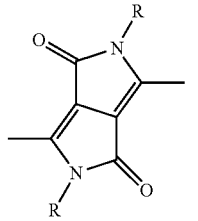
139
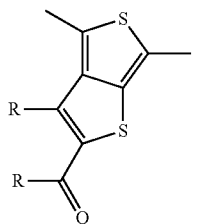

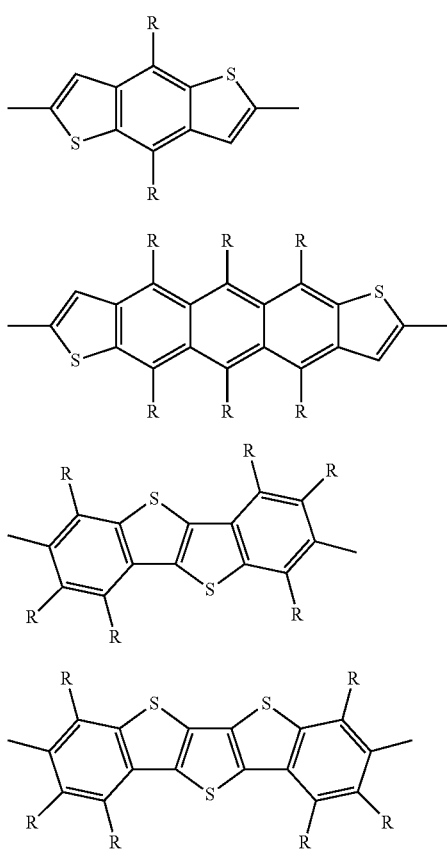

In Formula 1 to Formula 143, R represents the same as defined above. The symbols, a and b are the same as or different from each other and represent the number of repeating that is generally 1 to 5, preferably 1 to 3, particularly preferably 1. Among the group represented by formulae 1 to 143, it is preferably the group represented by formulae 106 to 110, and formulae 120 to 127, and more preferably the group represented by formulae 107, 109, 122 and 127.

Although the macromolecular compound in the present invention refers to a compound having a weight-average molecular weight of 1,000 or more, a macromolecular compound having a weight-average molecular weight of 3,000 to 10,000,000 is preferably used. When the weight-average molecular weight is less than 3,000, there may be caused a defect in film formation during the production of a device. When the weight-average molecular weight is more than 10,000,000, there may fall the solubility of the macromolecular compound in a solvent or the applicability of the macromolecular compound during the preparation of an element. The weight-average molecular weight of the macromolecular compound is further preferably 8,000 to 5,000,000, particularly preferably 10,000 to 1,000,000.

The weight-average molecular weight (Mw) in the present invention refers to a weight-average molecular weight in terms of polystyrene measured using gel permeation chromatography (GPC) with a standard sample of polystyrene.

As the content of the structural unit represented by Formula (1) in the macromolecular compound used in the present invention, it is satisfactory that at least one structural unit is contained in the compound. In the macromolecular compound, 2 or more structural units in average per one macromolecule chain are preferably contained. Further preferably, 3 or more structural units in average per one macromolecule chain are contained.

Also, when the macromolecular compound used in the present invention is utilized in an element, it is desired that the macromolecular compound has a high solubility in a solvent in terms of the easiness of the device production. Specifically, the macromolecular compound used in the present invention preferably has a solubility capable of preparing a solution containing 0.01 wt % or more of the macromolecular compound, more preferably a solubility capable of preparing a solution containing 0.1 wt % or more of the macromolecular compound, further preferably a solubility capable of preparing a solution containing 0.4 wt % or more of the macromolecular compound.

Although the production method of the macromolecular compound in the present invention is not particularly limited, a method using the Suzuki coupling reaction and a method using the Stille coupling reaction are preferred in terms of the easiness of the synthesis of the macromolecular compound.

Examples of the method using the Suzuki coupling reaction may include a production method having a process of reacting one or more type(s) of compound represented by Formula (100):

$$Q^{100}\text{-}E^{1}\text{-}Q^{200} \quad (100)$$

wherein $E^1$ represents a divalent group containing an aromatic ring, and $Q^{100}$ and $Q^{200}$ are the same as or different from each other and represent a boric acid residue or a boric acid ester residue;

with one or more type(s) of compound represented by Formula (200):

$$T^{1}\text{-}E^{2}\text{-}T^{2} \quad (200)$$

wherein $E^2$ represents a structural unit containing a group represented by Formula (1), and $T^1$ and $T^2$ are the same as or different from each other and represent a halogen atom, an alkyl sulfonate group, an aryl sulfonate group, or an arylalkyl sulfonate group; in the presence of a palladium catalyst and a base. $E^1$ is preferably a divalent aromatic group, further preferably a group represented by Formula 1 to Formula 141.

In this case, the total number of moles of one or more type(s) of compound represented by Formula (200) used for the reaction is preferably excessive relative to the total number of moles of one or more type(s) of compound represented by Formula (100). When the total number of moles of one or more type(s) of compound represented by Formula (200) used for the reaction is assumed to be 1 mole, the total number of moles of one or more type(s) of compound represented by Formula (100) is preferably 0.6 to 0.99 mole, further preferably 0.7 to 0.95 mole.

Examples of the boric acid ester residue may include groups represented below:

[Chemical Formula 49]

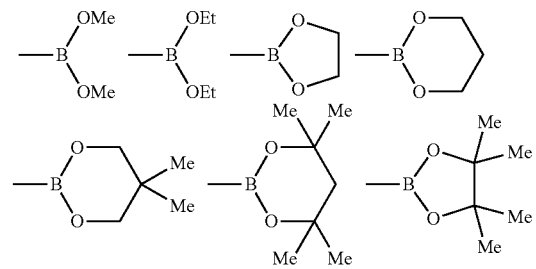

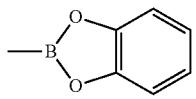

In the above Formulae, Me represents a methyl group and Et represents an ethyl group.

Examples of the halogen atom represented by $T^1$ and $T^2$ in Formula (200) may include a fluorine atom, a chlorine atom, a bromine atom, and an iodine atom. In terms of the easiness of the synthesis of the macromolecular compound, the halogen atom is preferably a bromine atom or an iodine atom, further preferably a bromine atom.

Examples of the alkyl sulfonate group represented by $T^1$ and $T^2$ in Formula (200) may include a methane sulfonate group, an ethane sulfonate group, and a trifluoromethane sulfonate group. Examples of the aryl sulfonate group may include a benzene sulfonate group and a p-toluene sulfonate group. Examples of the arylalkyl sulfonate group may include a benzyl sulfonate group.

Specifically, examples of the method for carrying out the Suzuki coupling reaction may include a method for carrying out the reaction using a palladium catalyst as a catalyst in any solvent in the presence of a base.

Examples of the palladium catalyst used for the Suzuki coupling reaction may include a Pd(0) catalyst and a Pd(II) catalyst. Specifically, examples of the palladium catalyst may include palladium [tetrakis(triphenylphosphine)], palladium acetates, dichlorobis(triphenylphosphine)palladium, palladium acetate, tris(dibenzylideneacetone)dipalladium, and bis(dibenzylideneacetone)palladium. From the viewpoint of the easiness of the reaction (polymerization) operation and the reaction (polymerization) rate, dichlorobis(triphenylphosphine)palladium, palladium acetate, and tris(dibenzylideneacetone)dipalladium are preferred.

The additive amount of the palladium catalyst is not particularly limited so long as it is an amount effective as the catalyst. It is generally 0.0001 mole to 0.5 mole, preferably 0.0003 mole to 0.1 mole, relative to 1 mole of the compound represented by Formula (100).

When palladium acetates are used as a palladium catalyst used for the Suzuki coupling reaction, for example, a phosphorus compound such as triphenylphosphine, tri(o-tolyl)phosphine, and tri(o-methoxyphenyl)phosphine can be added as a ligand. In this case, the additive amount of the ligand is generally 0.5 mole to 100 moles, preferably 0.9 mole to 20 moles, further preferably 1 mole to 10 moles, relative to 1 mole of the palladium catalyst.

Examples of the base used for the Suzuki coupling reaction may include inorganic bases, organic bases, and inorganic salts. Examples of the inorganic base may include potassium carbonate, sodium carbonate, and barium hydroxide. Examples of the organic base may include triethylamine and tributylamine. Examples of the inorganic salt may include cesium fluoride.

The additive amount of the base is generally 0.5 mole to 100 moles, preferably 0.9 mole to 20 moles, further preferably 1 mole to 10 moles, relative to 1 mole of the compound represented by Formula (100).

The Suzuki coupling reaction is generally carried out in a solvent. Examples of the solvent may include N,N-dimethylformamide, toluene, dimethoxyethane, and tetrahydrofuran. From the viewpoint of the solubility of the macromolecular compound used for the present invention, toluene and tetrahydrofuran are preferred. The base may be added as an aqueous solution to carry out the reaction in a two phases-system.

When an inorganic salt is used as the base, the inorganic salt is generally added in a state of an aqueous solution to carry out the reaction from the viewpoint of the solubility of the inorganic salt.

When the base is added in a state of an aqueous solution to carry out the reaction in a two phases-system, a phase-transfer catalyst such as a quaternary ammonium salt may be added, if necessary.

Although the temperature for carrying out the Suzuki coupling reaction depends on the solvent, the temperature is generally around 50 to 160° C. Preferably, it is 60 to 120° C. from the viewpoint of making the molecular weight of the macromolecular compound higher. It is also possible to elevate the temperature to the near of the boiling point of the solvent for reflux. Although the reaction time may be terminated when the polymerization degree has reached an objective polymerization degree, the reaction time is generally 0.1 hour to 200 hours. Preferably, it is around 1 hour to 30 hours for efficiency.

The Suzuki coupling reaction is carried out under an inactive atmosphere such as an argon gas and a nitrogen gas in a reaction system in which a Pd(O) catalyst is not inactivated. For example, the reaction is carried out in a system that is fully deaerated with an argon gas, a nitrogen gas or the like. Specifically, the reaction is carried out by: fully purging the inside of a polymerization vessel (reaction system) with a nitrogen gas to deaerate the reaction system; then charging the compound represented by Formula (100), the compound represented by Formula (200), and dicyclobis(triphenylphosphine) palladium (II) into the polymerization vessel; further purging fully the inside of the polymerization vessel with a nitrogen gas to deaerate the reaction system; then adding a solvent such as toluene that has been deaerated by bubbling the solvent with a nitrogen gas beforehand into the reaction system; then dropping, into the resultant reaction solution, an aqueous solution of a base such as sodium carbonate that has been deaerated by bubbling the solution with a nitrogen gas beforehand; then heating the resultant reaction mixture to elevate the temperature of the reaction mixture; and performing the polymerization, for example, at a reflux temperature for 8 hours while maintaining the inactive atmosphere.

Examples of the method using the Stifle coupling reaction may include a production method having a process of reacting one or more type(s) of compound represented by Formula (300):

$$Q^{300}\text{-}E^3\text{-}Q^{400} \qquad (300)$$

wherein $E^3$ represents a divalent group containing an aromatic ring, and $Q^{300}$ and $Q^{400}$ are the same as or different from each other and represent an organotin residue; with one or more type(s) of compound represented by Formula (200) in the presence of a palladium catalyst. $E^3$ is preferably a divalent aromatic group, further preferably a group represented by Formula 1 to Formula 141.

Examples of the organotin residue may include a group represented by —$SnR^{100}_3$. Here, $R^{100}$ represents a monovalent organic group. Examples of the monovalent organic group may include an alkyl group and an aryl group.

Examples of the alkyl group may include a chained alkyl group such as a methyl group, an ethyl group, an n-propyl group, an isopropyl group, an n-butyl group, an isobutyl group, an sec-butyl group, a tert-butyl group, an n-pentyl group, an isopentyl group, a 2-methylbutyl group, a 1-methylbutyl group, an n-hexyl group, an isohexyl group, a 3-methylpentyl group, a 2-methylpentyl group, a 1-methylpentyl group, a heptyl group, an octyl group, an isooctyl group, a 2-ethylhexyl group, a nonyl group, a decyl group, an undecyl group, a dodecyl group, a tetradecyl group, a hexadecyl group, an octadecyl group, and an eicosyl group; and a cycloalkyl group such as a cyclopentyl group, a cyclohexyl group, and an adamantyl group. Examples of the aryl group may include a phenyl group and a naphthyl group. The organotin residue is preferably —SnMe$_3$, —SnEt$_3$, —SnBu$_3$, or —SnPh$_3$, more preferably —SnMe$_3$, —SnEt$_3$, or —SnBu$_3$. In the above preferred examples, Me represents a methyl group, Et represents an ethyl group, Bu represents a butyl group, and Ph represents a phenyl group.

Examples of the halogen atom represented by $T^1$ and $T^2$ in Formula (200) may include a fluorine atom, a chlorine atom, a bromine atom, and an iodine atom. In terms of the easiness of the synthesis of the macromolecular compound, the halogen atom is preferably a bromine atom or an iodine atom.

Examples of the alkyl sulfonate group represented by $T^1$ and $T^2$ in Formula (200) may include a methane sulfonate group, an ethane sulfonate group, and a trifluoromethane sulfonate group. Examples of the aryl sulfonate group may include a benzene sulfonate group and a p-toluene sulfonate group. Examples of the aryl sulfonate group may include a benzyl sulfonate group.

Specifically, examples of the method may include a method for carrying out the reaction in the presence of a palladium catalyst as a catalyst in any solvent.

Examples of the palladium catalyst used for the Stille coupling reaction may include a Pd(0) catalyst and a Pd(II) catalyst. Specifically, examples of the palladium catalyst may include palladium [tetrakis(triphenylphosphine)], palladium acetates, dichlorobis(triphenylphosphine)palladium, palladium acetate, tris(dibenzylideneacetone)dipalladium, and bis(dibenzylideneacetone)palladium. From the viewpoint of the easiness of the reaction (polymerization) operation and the reaction (polymerization) rate, palladium [tetrakis(triphenylphosphine)] and tris(dibenzylideneacetone)dipalladium are preferred.

The additive amount of the palladium catalyst used for the Stille coupling reaction is not particularly limited so long as it is an amount effective as the catalyst. It is generally 0.0001 mole to 0.5 mole, preferably 0.0003 mole to 0.2 mole, relative to 1 mole of the compound represented by Formula (100).

Furthermore, a ligand and a co-catalyst can also be used in the Stille coupling reaction, if necessary. Examples of the ligand may include a phosphorus compound such as triphenylphosphine, tri(o-tolyl)phosphine, tri(o-methoxyphenyl)phosphine, and tris(2-furyl)phosphine, and an arsenic compound such as triphenyl arsine and triphenoxy arsine. Examples of the co-catalyst may include copper iodide, copper bromide, copper chloride, and copper (I) 2-thenoate.

When the ligand or the co-catalyst is used, the additive amount of the ligand or the co-catalyst is generally 0.5 mole to 100 moles, preferably 0.9 mole to 20 moles, further preferably 1 mole to 10 moles, relative to 1 mole of the palladium catalyst.

The Stille coupling reaction is generally carried out in a solvent. Examples of the solvent may include N,N-dimethylformamide, N,N-dimethylacetamide, toluene, dimethoxyethane, and tetrahydrofuran. From the viewpoint of the solubility of the macromolecular compound used for the present invention, toluene and tetrahydrofuran are preferred.

Although the temperature for carrying out the Stille coupling reaction depends on the solvent, the temperature is generally around 50 to 160° C. It is preferably 60 to 120° C. from the viewpoint of making the molecular weight of the macromolecular compound higher. It is also possible to elevate the temperature to the near to the boiling point of the solvent for reflux.

Although the time for carrying out the reaction (reaction time) may be terminated when the polymerization degree has reached an objective polymerization degree, the reaction time is generally around 0.1 hour to 200 hours. Preferably, it is around 1 hour to 30 hours for efficiency.

The Stille coupling reaction is carried out under an inactive atmosphere such as an argon gas and a nitrogen gas in a reaction system in which a Pd catalyst is not inactivated. For example, the reaction is carried out in a system that is fully deaerated with an argon gas, a nitrogen gas, or the like. Specifically, the reaction is carried out by: fully purging the inside of a polymerization vessel (reaction system) with a nitrogen gas to deaerate the reaction system; then charging the compound represented by Formula (300), the compound represented by Formula (200), and a palladium catalyst into the polymerization vessel; further purging fully the inside of the polymerization vessel with a nitrogen gas to deaerate the reaction system; then adding a solvent such as toluene that has been deaerated by bubbling with a nitrogen gas beforehand to the reaction system; then adding a ligand or a co-catalyst to the reaction system, if necessary; then heating the resultant reaction mixture to elevate the temperature of the reaction mixture; and performing the polymerization, for example, at a reflux temperature for 8 hours while maintaining the inactive atmosphere.

The number average molecular weight (Mn) of the macromolecular compound mentioned above in terms of polystyrene is preferably $1\times10^3$ to $1\times10^8$. When the number average molecular weight in terms of polystyrene is $1\times10^3$ or more, a rigid thin film can easily be obtained. By contrast, when the number average molecular weight is $10^8$ or less, the solubility of the macromolecular compound becomes high, so that the production of a thin film becomes easier.

A terminal group of the macromolecular compound of the present invention may be protected with a stable group, since there is the probability that the property or the life of an element obtained by using such a macromolecular compound for the production of the element might be lowered if a polymerization active group remains. The terminal group preferably has a conjugated bond continuing from a conjugation structure of the main chain, or may have a structure having, for example, bonding with an aryl group or a heterocyclic group through a vinylene group.

Although the macromolecular compound used in the present invention has a structural unit represented by Formula (1). For example, the macromolecular compound can be synthesized by using a compound represented by Formula (1-3) as one of the raw materials.

[Chemical Formula 50]

(1-3)

In Formula (1-3), $Ar^1$, $Ar^2$, $X^1$, and $X^2$ individually represent the same as defined above. $W^1$ and $W^2$ are the same as or different from each other and represent a hydrogen atom, a halogen atom, an alkyl sulfonate group, an aryl sulfonate group, an arylalkyl sulfonate group, a boric acid ester residue, a sulfonium methyl group, a phosphonium methyl group, a phosphonate methyl group, a halogenated methyl group, a boric acid residue, a formyl group, a vinyl group, or an organotin residue.

When $W^1$ and $W^2$ each are a hydrogen atom, a macromolecular compound having a structural unit represented by Formula (1) can be produced by performing an oxidation polymerization. In the oxidation polymerization, a catalyst is generally used. As such a catalyst, a publicly known catalyst can be used. For example, a metal halide or a mixture of a metal halide and an amine complex (metal halide/amine complex) is used. Here, as the metal halide, for example, a monovalent-, divalent-, or trivalent-halide of a metal such as copper, iron, vanadium, and chromium can be used. Examples of the amine used for the production of the amine complex may include pyridine, lutidine, 2-methylimidazole, and N,N,N',N'-tetramethylethylenediamine. The metal halide/amine complex can be produced by mixing a metal halide with an amine in a solvent in the presence of oxygen, and the mixing molar ratio of the metal halide and the amine is, for example, metal halide/amine=1/0.1 to 1/200, preferably around 1/0.3 to 1/100.

As the catalyst, iron chloride can also be used (Polym. Prep. Japan, Vol. 48, 309 (1999)). Furthermore, by using a copper/amine catalyst system (J. Org. Chem., 64, 2264 (1999), J. Polym. Sci. Part A, Polym. Chem., 37, 3702 (1999)), the molecular weight of the macromolecular compound can be enhanced.

The solvent for the oxidation polymerization is not particularly limited to be used so long as it is a solvent from which the catalyst does not suffer poisoning. Examples of such a solvent may include hydrocarbon solvents, ether solvents, and alcohols. Here, examples of the hydrocarbon solvents may include toluene, benzene, xylene, trimethylbenzene, tetramethylbenzene, naphthalene, and tetralin. Examples of the ether solvent may include diethyl ether, diisopropyl ether, tetrahydrofuran, 1,4-dioxane, diphenyl ether, and tert-butyl methyl ether. Examples of the alcohols may include methanol, ethanol, isopropanol, and 2-methoxyethanol.

The reaction temperature for the oxidation polymerization is generally $-100°$ C. to $100°$ C., preferably around $-50$ to $50°$ C.

Examples of the method for producing a copolymer may include a method of mixing two or more types of monomers to polymerize them and a method of polymerizing one type of monomer and then adding, to the reaction, a second monomer. By using or combining these methods, a block copolymer, a random copolymer, an alternate copolymer, a multi-block copolymer, a graft copolymer, and the like can be produced.

From the viewpoint of the easiness of exchanging a functional group, $W^1$ and $W^2$ in Formula (1-3) are the same as or different from each other and are preferably a halogen atom, an alkyl sulfonate group, an aryl sulfonate group, an arylalkyl sulfonate group, a boric acid ester residue, a boric acid residue, or an organotin residue.

When $W^1$ and $W^2$ each are a hydrogen atom, as the method for converting $W^1$ and $W^2$ into a bromine atom, a publicly known method can be used. Examples of the method may include a method of contacting a compound represented by Formula (1-3) in which $W^1$ and $W^2$ each are a hydrogen atom with bromine or N-bromosuccinimide (NBS) to brominate $W^1$ and $W^2$. Although the conditions for the bromination can optionally be set, for example, it is desired that a method of reacting with NBS in a solvent exhibits a high brominaion rate and high selectivity of a position into which a bromine atom is introduced. Examples of the solvent used in this case may include N,N-dimethylformamide, chloroform, methylene chloride, and carbon tetrachloride. The reaction time is generally around 1 minute to 10 hours and the reaction temperature is generally around $-50$ to $50°$ C. The used amount of bromine is preferably around 1 mole to 5 moles relative to 1 mole of a compound represented by Formula (1-3) in which $W^1$ and $W^2$ each are a hydrogen atom. After the reaction, for example, ordinary post-treatment is carried out including, for example, extraction of the product with an organic solvent and evaporation of the solvent after termination of the reaction by adding water. By the treatment, a compound represented by Formula (1-3) in which $W^1$ and $W^2$ are a bromine atom can be obtained. The isolation and the purification of the product can be performed by a method such as preparative isolation by chromatography and recrystallization.

The macromolecular compound used in the present invention preferably has a light absorbing terminal wavelength that is a longer wavelength. The light absorbing terminal wavelength in the present invention means the value measured by the following method.

For the measurement, a spectrophotometer operating in wavelength regions of ultraviolet, visible, and near-infrared (for example, an ultraviolet-visible-near infrared spectrophotometer: JASCO-V670; manufactured by JASCO Corporation) is used. When JASCO-V670 is used, a range of measurable wavelength thereof is 200 to 1,500 nm. Therefore, the measurement is performed in this wavelength region. First, an absorption spectrum of a substrate used for the measurement is measured. The substrate such as a quartz substrate or a glass substrate is used. Next, on the substrate, a thin film comprising a first compound is formed from a solution containing the first compound or a melt containing the first compound. In the film formation from the solution, drying is performed after the film formation. Then, an absorption spectrum of the layered body of the thin film and the substrate is measured. The difference between the absorption spectrum of the layered body of the thin film and the substrate and the absorption spectrum of the substrate is obtained as the absorption spectrum of the thin film.

In the absorption spectrum of the thin film, the absorbance of the first compound is assigned on the ordinate axis and the wavelength is assigned on the abscissa axis. It is desired to control the film thickness of the thin film so that absorbance of the largest absorption peak becomes around 0.5 to 2. The absorbance of an absorption peak at the longest wavelength among absorption peaks is assumed to be 100%, and an intersection point of the absorption peak with a line parallel to the abscissa axis (wavelength axis) that passes through 50% of the absorbance, the intersection point being in a longer wavelength side than a peak wavelength of the absorption peak, is assumed to be a first point. An intersection point of the absorption peak with a line parallel to the wavelength axis that passes through 25% of the absorbance, the intersection point being in a longer wavelength side than a peak wavelength of the absorption peak, is assumed to be a second point. A wavelength for an intersection point of a line that connects the first point and the second point with the following standard line is defined as the light absorbing terminal wavelength. Here, the standard line refers to a line that connects a third point with a fourth point, which are defined as follows: the third point refers to a point on the absorption spectrum at a wavelength longer by 100 nm than the following standard wavelength; the fourth point refers to a point on the absorption spectrum at a wavelength longer by 150 nm than the following standard wavelength; and the standard wavelength refers to, when the absorbance of the absorption peak at the longest wavelength is assumed to be 100%, a wavelength for an intersection point of the absorption peak with a line parallel to the wavelength axis that passes through 10% of the absorbance, the intersection point being in a longer wavelength side than a peak wavelength of the absorption peak.

The photovoltaic cell of the present invention is explained below.

<Photovoltaic Cell>

The photovoltaic cell of the present invention has one or more active layer(s) containing a compound having a structural unit of Formula (1) between a pair of electrodes at least one of which is transparent or translucent.

A preferred form of the photovoltaic cell of the present invention has a pair of electrodes at least one of which is transparent or translucent and an active layer formed from an organic composition of a p-type organic semiconductor and an n-type organic semiconductor. The layer form of the active layer is not particularly limited and may be, for example, a bulk hetero junction-type active layer (pn mixed layer) formed from a mixture of a p-type organic semiconductor and an n-type organic semiconductor, a two-layered pn junction-type active layer constituted by joining a layer formed from a p-type organic semiconductor (p-type layer) and a layer formed from an n-type organic semiconductor (n-type layer), or a pin junction-type active layer in which a pn-type layer is provided between a p-type layer and an n-type layer. The compound having a structural unit of Formula (1) is preferably used as a p-type organic semiconductor.

The action mechanism of the photovoltaic cell in this form is described. A light energy entering through a transparent or translucent electrode is absorbed by an electron acceptor compound (n-type organic semiconductor) such as fullerene derivatives and/or an electron donor compound (p-type organic semiconductor) such as the compound that is used in the present invention to generate an exciton in which an electron and a hole are bonded with each other. When the generated exciton moves and reaches a heterojunction interface where an electron acceptor compound and an electron donor compound are adjacent to each other, due to the difference of an HOMO energy and a LUMO energy between an electron and a hole at the interface, an electron and a hole are separated to generate electric charges (an electron and a hole) that can independently move. Each of the generated electric charges moves to an electrode to become able to be taken out as an electric energy (current) to the outside.

The photovoltaic cell of the present invention is generally formed on a substrate. This substrate may be a substrate that does not chemically change when an electrode or an organic layer is formed on the substrate. Examples of the material for the substrate may include a glass, a plastic, a macromolecule film, and silicon. When the substrate is opaque, it is preferred that an opposite electrode (that is, an electrode more distant from the substrate) is transparent or translucent.

Another aspect of the photovoltaic cell of the present invention is a photovoltaic cell containing, between a pair of electrodes at least one of which is transparent or translucent, a first active layer containing the compound that is used in the present invention and a second active layer adjacent to the first active layer that contains an electron acceptor compound such as fullerene derivatives.

Examples of the transparent or translucent electrode material mentioned above may include a conductive metal oxide film and a translucent metal thin film. Specifically, a film produced using a conductive material such as indium oxide, zinc oxide, tin oxide, and a complex thereof such as indium-tin-oxide (ITO), and indium-zinc-oxide (IZO), and antimony-tin-oxide (NESA), a film produced using gold, platinum, silver, copper, and the like are used, and among them, a film produced using ITO, IZO, or tin oxide is preferred. Examples of the production method of the electrode may include a vacuum evaporation method, a sputtering method, an ion plating method, and a plating method. Furthermore, as the electrode material, an organic transparent conductive film such as a polyaniline or a derivative thereof, or a polythiophene or a derivative thereof may also be used.

One electrode may be not transparent, and as the material for this electrode, a metal, a conductive macromolecule, or the like may be used, for example. Specific examples of the electrode material may include a metal such as lithium, sodium, potassium, rubidium, cesium, magnesium, calcium, strontium, barium, aluminum, scandium, vanadium, zinc, yttrium, indium, cerium, samarium, europium, terbium, and ytterbium; an alloy of two or more types of these metals; an alloy of one or more type(s) of these metals with one or more type(s) of metal selected from the group consisting of gold, silver, platinum, copper, manganese, titanium, cobalt, nickel, tungsten, and tin; graphite; a graphite intercalation compound; a polyaniline and a derivative thereof; and a polythiophene and a derivative thereof. Examples of the alloy may include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

As a means for enhancing the photoelectric conversion efficiency, an additional intermediate layer other than the active layer may also be used. Examples of the material used for the intermediate layer may include a halide of an alkali metal or an alkaline earth metal such as lithium fluoride, an oxide such as titanium oxide, and PEDOT (poly-3,4-ethylenedioxythiophene).

<Active Layer>

The active layer mentioned above may contain one type of the macromolecular compounds having a structural unit represented by Formula (1) individually or in a combination of two or more types of the macromolecular compounds of the present invention. Furthermore, for enhancing the hole transport property of the active layer mentioned above, as the electron donor compound and/or the electron acceptor compound, a compound other than the macromolecular compound having a structural unit represented by Formula (1) may be blended in the above-mentioned active layer to be used. Here, the electron donor compound and the electron acceptor compound mentioned above are relatively determined from the energy level of energy order of these compounds.

Examples of the electron donor compound mentioned above may include, in addition to the macromolecular compound having a structural unit represented by Formula (1), a pyrazoline derivative, an arylamine derivative, a stilbene derivative, a triphenyldiamine derivative, oligothiophene and a derivative thereof, polyvinyl carbazole and a derivative thereof, polysilane and a derivative thereof, a polysiloxane derivative having an aromatic amine residue in side chains or the main chain, polyaniline and a derivative thereof, polythiophene and a derivative thereof, polypyrrole and a derivative thereof, polyphenylenevinylene and a derivative thereof, and polythienylenevinylene and a derivative thereof.

Examples of the electron acceptor compound mentioned above may include, in addition to the compound having a structural unit represented by Formula (1), a carbon material, a metal oxide such as titanium oxide, an oxadiazole derivative, anthraquinodimethane and a derivative thereof, benzoquinone and a derivative thereof, naphthoquinone and a derivative thereof, anthraquinone and a derivative thereof, tetracyanoanthraquinodimethane and a derivative thereof, a fluorenone derivative, diphenyldicyanoethylene and a derivative thereof, a diphenoquinone derivative, metal complexes of 8-hydroxyquinoline and a derivative thereof, polyquinoline and a derivative thereof, polyquinoxaline and a derivative thereof, polyfluorene and a derivative thereof, a phenanthrene derivative such as 2,9-dimethyl-4,7-diphenyl-1,10-phenanthroline (bathocuproine), fullerene, and a fullerene derivative, and among them, preferred are titanium oxide, a carbon nanotube, fullerene, and a fullerene derivative, particularly preferred are fullerene and a fullerene derivative.

Examples of fullerene and a fullerene derivative may include $C_{60}$, $C_{70}$, $C_{76}$, $C_{78}$, $C_{84}$, and a derivative thereof. A fullerene derivative refers to a fullerene having a substituent.

Specific examples of the $C_{60}$ derivative may include the following compounds.

[Chemical Formula 51]

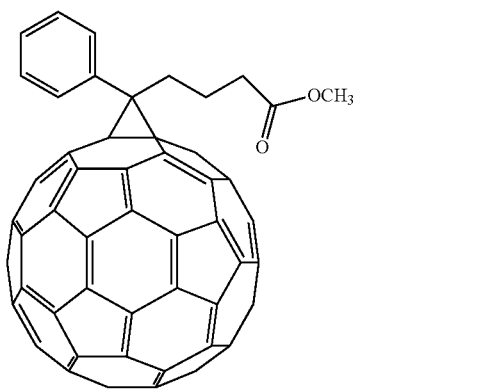

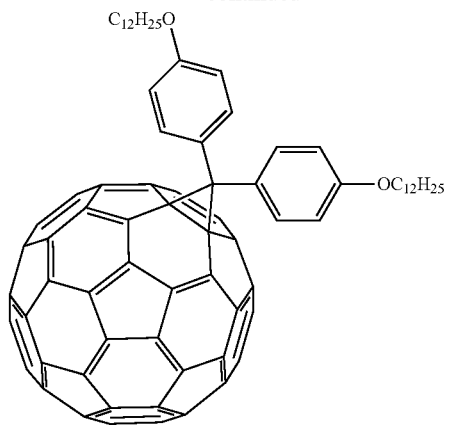

-continued

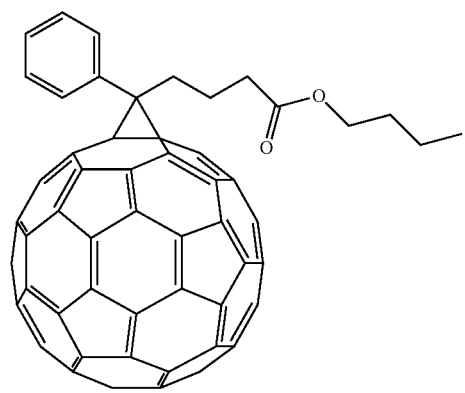

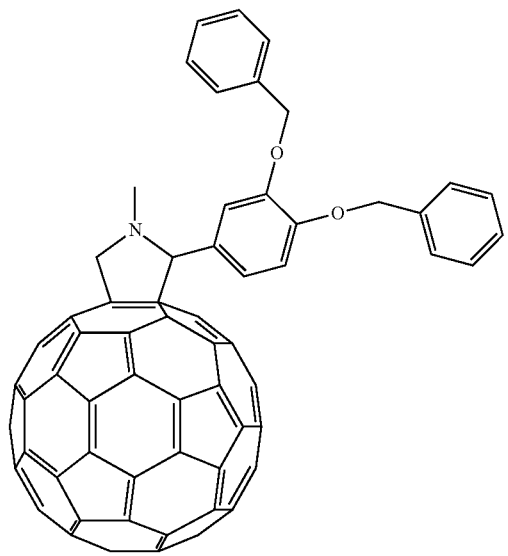

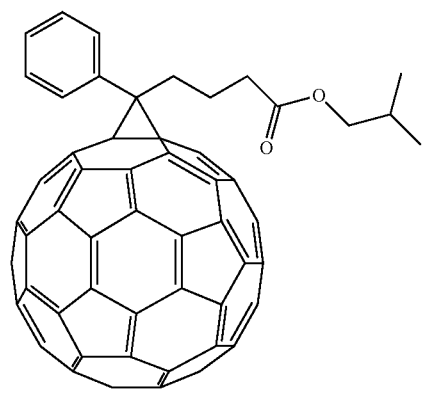

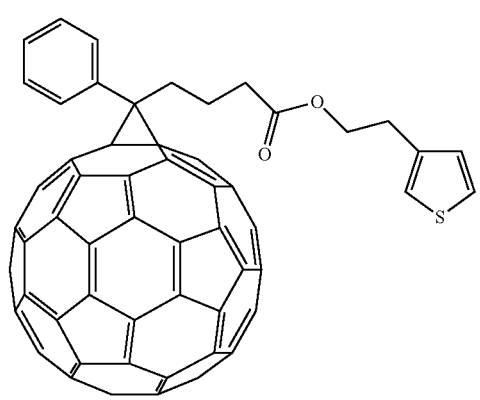

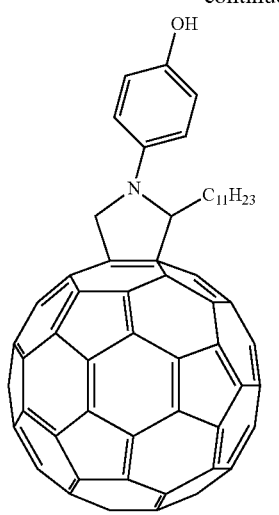

Specific examples of the C$_{70}$ derivative may include the following compounds.

[Chemical Formula 52]

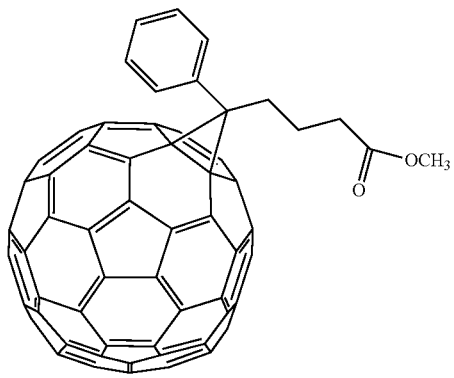

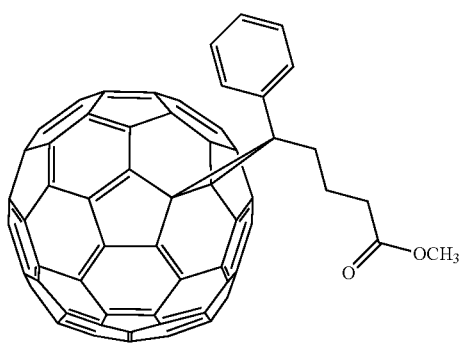

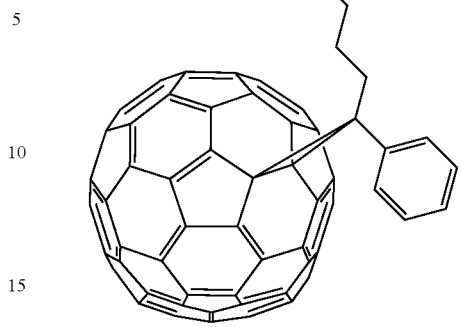

In addition, examples of the fullerene derivative may include [6,6]-phenyl C61 butyric acid methyl ester (C60 PCBM), [6,6]-phenyl C71 butyric acid methyl ester (C70 PCBM), [6,6]-phenyl C85 butyric acid methyl ester (C84 PCBM), and [6,6]-thienyl C61 butyric acid methyl ester.

When the macromolecular compound having a structural unit represented by Formula (1) and the fullerene derivative are contained in the active layer, the ratio of the fullerene derivative is preferably 10 to 1,000 parts by weight, more preferably 20 to 500 parts by weight, relative to 100 parts by weight of the compound.

The active layer generally has a thickness of preferably 1 nm to 100 μm, more preferably 2 nm to 1,000 nm, further preferably 5 nm to 500 nm, more preferably 20 nm to 200 nm.

The production method of the active layer may be any production method and examples thereof may include a film forming method from a solution containing the macromolecular compound having a structural unit represented by Formula (1) and a film forming method by a vacuum evaporation method.

Examples of the layer constitution that a photovoltaic cell can take may include a) to d).
a) Anode/Active layer/Cathode
b) Anode/Hole Transport Layer/Active layer/Cathode
c) Anode/Active layer/Electron Transport Layer/Cathode
d) Anode/Hole Transport Layer/Active layer/Electron Transport Layer/Cathode
(Here, the symbol "/" means that layers sandwiching the symbol "/" are layered as adjacent to each other).

The above layer constitution may be any one of a form in which the anode is provided in a side nearer to the substrate and a form in which the cathode is provided in a side nearer to the substrate.

Each layer above may be constituted not only as a single layer, but also as a layered body of two layers or more. A layer other than the above layers may further be provided.

<Production Method of Photovoltaic Cell>

A preferred production method of a photovoltaic cell is a production method of an element comprising a first electrode and a second electrode and an active layer between the first electrode and the second electrode, which has a process of applying a solution (ink) containing the macromolecular compound having a structural unit represented by Formula (1) and a solvent on the first electrode by a coating method to form an active layer and a process of forming the second electrode on the active layer.

The solvent used for the film formation from the solution may be any solvent so long as the solvent dissolves the macromolecular compound that is used for the present invention.

Examples of the solvent may include an unsaturated hydrocarbon solvent such as toluene, xylene, mesitylene, tetralin, decalin, bicyclohexyl, n-butylbenzene, sec-butylbenzene, and tert-butylbenzene; a halogenated saturated hydrocarbon solvent such as carbon tetrachloride, chloroform, dichloromethane, dichloroethane, chlorobutane, bromobutane, chloropentane, bromopentane, chlorohexane, bromohexane, chlorocyclohexane, and bromocyclohexane; a halogenated unsaturated hydrocarbon solvent such as chlorobenzene, dichlorobenzene, and trichlorobenzene; and an ether solvent such as tetrahydrofuran and tetrahydropyran. The macromolecular compound used for the present invention can generally be dissolved in these solvents in a concentration of 0.1% by weight or more.

When the film formation is performed using the solution, examples of the coating method used in the film formation may include a slit coating method, a knife coating method, a spin coating method, a casting method, a micro gravure coating method, a gravure coating method, a bar coating method, a roll coating method, a wire bar coating method, a dip coating method, a spray coating method, a screen printing method, a gravure printing method, a flexo printing method, an offset printing method, an inkjet coating method, a dispenser printing method, a nozzle coating method, and a capillary coating method, and among them, preferred are a slit coating method, a capillary coating method, a gravure coating method, a micro gravure coating method, a bar coating method, a knife coating method, a nozzle coating method, an inkjet coating method, and a spin coating method.

From the viewpoint of film forming property, the surface tension of the solvent at 25° C. is preferably more than 15 mN/m, more preferably more than 15 mN/m and less than 100 mN/m, further preferably more than 25 mN/m and less than 60 mN/m.

<Use of Cell>

By irradiating the photovoltaic cell of the present invention with a light such as a solar light from the transparent or translucent electrode, a photoelectromotive force is generated between the electrodes, so that the photovoltaic cell can act as an organic thin film solar cell. By integrating a plurality of organic thin film solar cells, the photovoltaic cell can also be used as an organic thin film solar cell module.

By irradiating the photovoltaic cell with light from the transparent or translucent electrode in a state in which a voltage is applied to between the electrodes or in a state in which a voltage is not applied, a photocurrent is flowed, so that the photovoltaic cell can act as an organic optical sensor. By integrating a plurality of organic optical sensors, the photovoltaic cell can also be used as an organic image sensor.

<Solar Cell Module>

The organic thin film solar cell can fundamentally take the same module structure as that of a conventional solar cell module. The solar cell module generally takes a structure in which a cell is provided on a supporting substrate such as a metal and a ceramic, and the cell is covered with filling resin, protective glass, or the like to take in light from an opposite side of the supporting substrate. However, such a structure is also possible that a transparent material such as a toughened glass is used as the supporting substrate and on the supporting substrate, a cell is provided to take in light from the side of the transparent supporting substrate. Specific known examples of such a structure may include a module structure called a superstrate type, a substrate type, or a potting type, and a substrate built-in-type module structure used in an amorphous silicon solar cell or the like. The organic thin film solar cell of the present invention can also appropriately select these module structures according to the intended purpose, the using space, and the using environment.

A representative module of the superstrate type or the substrate type has a structure in which: cells are provided at a constant interval between supporting substrates that are transparent in one side or both sides thereof and have been subjected to reflection preventing treatment; adjacent cells are connected with each other by a metal lead, a flexible wiring, or the like; and in an outer edge part, a power-collecting electrode is provided to take out a generated electric power to the outside. Between the substrate and the cell, various plastic materials such as ethylenevinyl acetate (EVA) may be used in a shape of a film or a filling resin according to the purpose for protecting the cell or enhancing the power-collecting efficiency. When the module is used at a position at which, for example, an impact from the outside is small and consequently, the surface of the module is not necessary to be coated with a hard material, it is possible to compose the surface protecting layer with a transparent plastic film or to cure the above filling resin to impart a protecting function to the module, so that to omit a supporting substrate on one side. The periphery of the supporting substrate is fixed by a metal frame in a sandwich-shape for securing the sealing of the inside and the rigidity of the module and between the supporting substrate and the frame is sealing-sealed with a sealing material. When for the cell itself, the supporting substrate, the filling material, and the sealing material, a flexible material is used, a solar cell can also be provided on a curved surface.

In the case of a solar cell using a flexible supporter such as a polymer film, a main body of the cell can be produced by a method including: forming cells sequentially while letting out the supporter in a roll-shape; cutting the supporter in a desired size; and then sealing the penumbra of the supporter with a moisture-resistant flexible material. In addition, there can also be prepared a module structure called "SCAF" described in "Solar Energy Materials and Solar Cells, 48, pp. 383-391." Furthermore, a solar cell using a flexible supporter can also be adhered and fixed on a curved surface glass or the like to be used.

<Organic Thin Film Transistor>

The organic thin film transistor of the present invention has a gate electrode, a source electrode, a drain electrode, and an active layer and the active layer contains a macromolecular compound having a structural unit represented by Formula (1), where the macromolecular compound has an inverse of the excitation energy from the ground singlet state to the lowest excited singlet state that is calculated using the time-dependent density functional theory of 0.43 ($eV^{-1}$) or more.

As one aspect of the organic thin film transistor of the present invention, there can be mentioned an aspect having a constitution containing a source electrode and a drain electrode, an organic semiconductor layer (active layer) acting as a current path between these electrodes, and a gate electrode for controlling the amount of a current passing through the current path. The aspect contains a macromolecular compound having a structural unit represented by Formula (1) in the organic semiconductor layer and has an inverse of the excitation energy of the macromolecular compound from the ground singlet state to the lowest excited singlet state that is calculated using the time-dependent density functional theory of 0.43 ($eV^{-1}$) or more. Examples of such an organic thin film transistor may include an electric field effect-type and a static induction-type.

The electric field effect-type organic thin film transistor preferably comprises a source electrode and a drain electrode, an organic semiconductor layer (active layer) acting as a current path between these electrodes, a gate electrode for controlling a current amount passing through the current path, and an insulating layer disposed between the organic semiconductor layer and the gate electrode. Particularly, it is preferred that the source electrode and the drain electrode are brought into contact with the organic semiconductor layer (active layer), and furthermore, the gate electrode is provided as sandwiching the insulating layer brought into contact with the organic semiconductor layer. In the electric field effect-type organic thin film transistor, the organic semiconductor layer comprises an organic thin film containing the macromolecular compound used for the present invention.

The electrostatic induction-type organic thin film transistor, which is one aspect of an organic thin film transistor of the present invention, has a source electrode and a drain electrode, an organic semiconductor layer (active layer) acting as a current path between these electrodes, and a gate electrode for controlling a current amount passing through the current path, and the gate electrode is preferably provided in the organic semiconductor layer. Particularly, it is preferable to be brought into contact with the source electrode and the drain electrode. Here, the structure of the gate electrode may be a structure by which a current path through which the current passes from the source electrode to the drain electrode is formed and the amount of the current passing through the current path can be controlled by a voltage applied to the gate electrode, and examples thereof may include an interdigitated electrode. Also in the electrostatic induction-type organic thin film transistor, the organic semiconductor layer comprises an organic thin film containing the compound used for the present invention of the present invention. The active layer generally has a thickness of preferably 1 nm to 100 µm, more preferably 2 nm to 1,000 nm, further preferably 5 nm to 500 nm, more preferably 20 nm to 200 nm.

The organic thin film transistor of the present invention can be produced by blending a compound having a structural unit represented by Formula (1) or the like in the organic semiconductor layer (active layer). As the method for film-forming the organic semiconductor layer, there can be adopted the same method as the film-forming method in the above "production method of a photovoltaic cell." In other terms, the organic thin film transistor of the present invention may be produced according to a conventional publicly known method for the organic thin film transistor.

EXAMPLES

Hereinafter, Examples will be described for further explaining the present invention in detail. However, the present invention is not limited to the following Examples.

(NMR Measurement)

The NMR measurement was performed by dissolving an objective compound in deuterated chloroform and using an NMR apparatus (manufactured by Varian Inc.; INOVA 300).

(Measurement of Number Average Molecular Weight and Weight-Average Molecular Weight)

As the number average molecular weight and the weight-average molecular weight, a number average molecular weight and a weight-average molecular weight in terms of polystyrene were measured by gel permeation chromatography (GPC) (manufactured by Shimadzu Corporation; trade name: LC-10Avp). The macromolecular compound to be measured was dissolved in tetrahydrofuran so that the concentration of the macromolecular compound became about 0.5% by weight, and 30 µL of the resultant solution was injected into GPC. As the mobile phase of GPC, tetrahydrofuran was used and the mobile phase was flowed at a flow rate of 0.6 mL/min. As the column, two TSKgel SuperHM-H (manufactured by Tosoh Corporation) and one TSKgel SuperH2000 (manufactured by Tosoh Corporation) were connected in series. As the detector, a differential refractive index detector (manufactured by Shimadzu Corporation; trade name: RID-10A) was used.

Reference Example 1

Synthesis of Compound 1

[Chemical Formula 53]

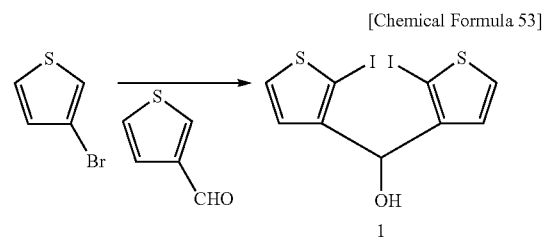

Into a 1,000 mL four-neck flask in which a gas in the flask was replaced by argon, 13.0 g (80.0 mmol) of 3-bromothiophene and 80 mL of diethyl ether were charged to prepare a homogeneous solution. While maintaining the solution at −78° C., 31 mL (80.6 mmol) of solution of 2.6 M n-butyl lithium (n-BuLi) in hexane was dropped into the solution. At −78° C., the reaction was carried out for 2 hours and then into the resultant reaction mixture, a solution in which 8.96 g (80.0 mmol) of 3-thiophenealdehyde was dissolved in 20 mL of diethyl ether, was dropped. After the dropping, the resultant reaction mixture was stirred at −78° C. for 30 minutes and further at room temperature (25° C.) for 30 minutes. The reaction solution was cooled again to −78° C. and into the reaction solution, 62 mL (161 mmol) of solution of 2.6 M n-BuLi in hexane was dropped over 15 minutes. After the dropping, the reaction solution was stirred at −25° C. for 2 hours and further at room temperature (25° C.) for 1 hour. Then, the reaction solution was cooled to −25° C. and into the reaction mixture, a solution in which 60 g (236 mmol) of iodine was dissolved in 1,000 mL of diethyl ether, was dropped over 30 minutes. After the dropping, the reaction mixture was stirred at room temperature (25° C.) for 2 hours and to the reaction mixture, 50 mL of an aqueous solution of 1N sodium thiosulfate was added to terminate the reaction. The reaction product was extracted with diethyl ether, was then dried over magnesium sulfate, and was filtered. The filtrate was then concentrated to obtain 35 g of crude product. The crude product was purified by recrystallization with chloroform to obtain 28 g of compound 1.

Reference Example 2

Synthesis of Compound 2

[Chemical Formula 54]

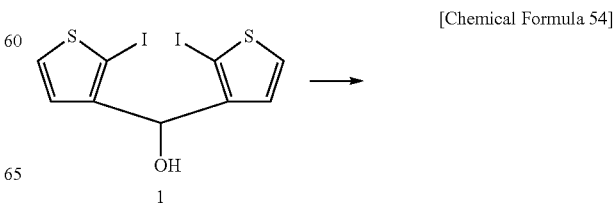

-continued

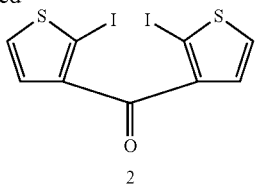

2

Into a 300 mL four-neck flask, 10.5 g (23.4 mmol) of bisiodothienyl methanol (compound 1) and 150 mL of methylene chloride were charged to prepare a homogeneous solution. To the solution, 7.50 g (34.8 mmol) of pyridinium chlorochromate was added, and the resultant reaction mixture was stirred at room temperature (25° C.) for 10 hours. The reaction solution was filtered to remove insoluble matters and the filtrate was then concentrated to obtain 10.0 g (22.4 mmol) of compound 2.

Reference Example 3

Synthesis of Compound 3

[Chemical Formula 55]

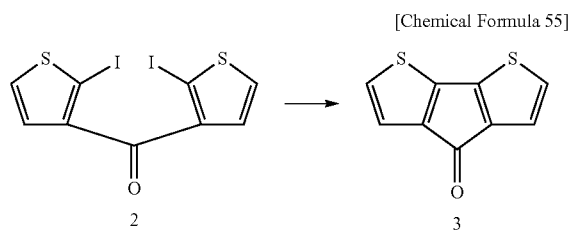 [SMILES: O=C(c1ccsc1I)c1ccsc1I ; O=C1c2ccsc2-c2sccc21]

Into a 300 mL flask in which a gas in the flask was replaced by argon, 10.0 g (22.4 mmol) of the compound 2, 6.0 g (94.5 mmol) of copper powder, and 120 mL of anhydrous N,N-dimethylformamide (hereinafter, which may be called DMF) were charged and the resultant reaction mixture was stirred at 120° C. for 4 hours. After the reaction, the flask was cooled to room temperature (25° C.) and the reaction solution was passed through a silica gel column to remove insoluble components. Then, 500 mL of water was added to the reaction solution and the reaction product was extracted with chloroform. The oil phase that was a chloroform solution was dried over magnesium sulfate and the oil phase was filtered, followed by concentrating the filtrate to obtain crude product. The composition was purified by a silica gel column (developing solution: chloroform) to obtain 3.26 g of compound 3. The operations up to here were repeated by a plurality of times.

Reference Example 4

Synthesis of Compound 4

[Chemical Formula 56]

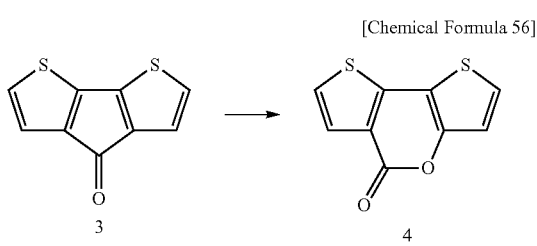 [SMILES: O=C1c2ccsc2-c2sccc21 ; O=c1oc2ccsc2c2sccc12]

Into a 300 mL four-neck flask equipped with a mechanical stirrer in which a gas in the flask was replaced by argon, 3.85 g (20.0 mmol) of the compound 3, 50 mL of chloroform, and 50 mL of trifluoroacetic acid were charged to prepare a homogeneous solution. To the solution, 5.99 g (60 mmol) of sodium perborate monohydrate was added and the resultant reaction mixture was stirred at room temperature (25° C.) for 45 minutes. Then, to the reaction mixture, 200 mL of water was added and the reaction product was extracted with chloroform, followed by passing the organic phase that was a chloroform solution through a silica gel column and evaporating the solvent of the filtrate using an evaporator. Using methanol, the residue was recrystallized to obtain 534 mg of compound 4.

$^1$H NMR in CDCl$_3$ (ppm): 7.64 (d, 1H), 7.43 (d, 1H), 7.27 (d, 1H), 7.10 (d, 1H)

Reference Example 5

Synthesis of Compound 5

[Chemical Formula 57]

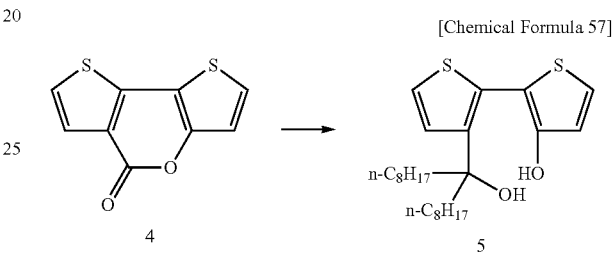

Into a 200 mL four-neck flask in which a gas in the flask was replaced by argon, 534 mg (2.56 mmol) of the compound 4 and 25 mL of anhydrous tetrahydrofuran (THF) were charged to prepare a homogeneous solution. The solution was cooled to −20° C. and thereto, 10.3 mL (10.3 mmol) of solution of n-octylmagnesium bromide (1 M) in THF was added. Then, the temperature of the resultant reaction mixture was elevated to room temperature (25° C.) and the reaction mixture was stirred at room temperature (25° C.) for 1.5 hours. Then, to the reaction mixture, 50 mL of water was added to terminate the reaction and the reaction product was extracted with ethyl acetate. The organic phase that was an ethyl acetate solution was dried over sodium sulfate and the ethyl acetate solution was then passed through a silica gel column, followed by evaporating the solvent of the filtrate to obtain 433 mg of compound 5.

$^1$H NMR in CDCl$_3$ (ppm): 7.24 (d, 1H), 7.19 (d, 1H), 6.98 (d, 1H), 6.76 (d, 1H), 1.79 (b, 4H), 1.32 (b, 24H), 0.86 (s, 6H)

Reference Example 6

Synthesis of Compound 6

[Chemical Formula 58]

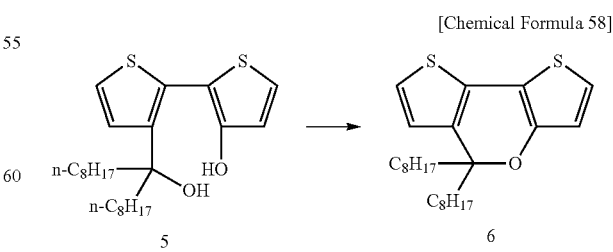

Into a 200 mL flask in which a gas in the flask was replaced by argon, 433 mg (0.992 mmol) of the compound 5 and 15 mL of toluene were charged to prepare a homogeneous solution.

To the solution, 57 mg of sodium p-toluenesulfonate monohydrate was added and the resultant reaction mixture was stirred at 100° C. for 4 hours. The reaction solution was cooled to room temperature (25° C.) and thereto, 50 mL of water was added, followed by extracting the reaction product with toluene. The organic phase that was a toluene solution was dried over sodium sulfate and was filtered, and then the solvent was evaporated. The resultant crude product was purified by a silica gel column (solvent: hexane) to obtain 389 mg of compound 6 (yield: 93.7%).

$^1$H NMR in CDCl$_3$ (ppm): 6.99 (d, 1H), 6.94 (d, 1H), 6.69 (d, 1H), 6.60 (d, 1H), 1.80 (b, 4H), 1.32 (b, 24H), 0.86 (s, 6H)

Reference Example 7

Synthesis of Compound 7

[Chemical Formula 59]

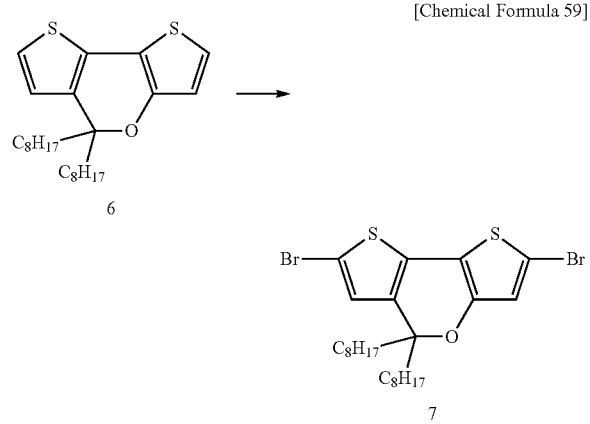

Into a 200 mL flask in which a gas in the flask was replaced by argon, 389 mg (0.929 mmol) of the compound 6 and 12 mL of anhydrous DMF were charged to prepare a homogeneous solution. The solution was maintained at −20° C. and thereto, 339 mg (1.90 mmol) of N-bromosuccinimide (hereinafter, which may be called NBS) was added. The reaction was carried out at −20° C. for 3 hours and was then carried out at 0° C. for 1 hour. After the reaction, to the reaction mixture, 50 mL of an aqueous solution of 1N sodium thiosulfate was added to terminate the reaction and the reaction product was extracted with ether. The organic phase that was an ether solution was dried over magnesium sulfate and was filtered, and from the filtrate, the solvent was evaporated to obtain crude product. The crude product was purified by a silica gel column (solvent: hexane) to obtain 315 mg of compound 7 (yield: 58.9%).

$^1$H NMR in CDCl$_3$ (ppm): 6.65 (s, 1H), 6.63 (s, 1H), 1.81 (b, 4H), 1.33 (b, 24H), 0.87 (s, 6H)

Reference Example 8

Synthesis of Polymer A

[Chemical Formula 60]

7

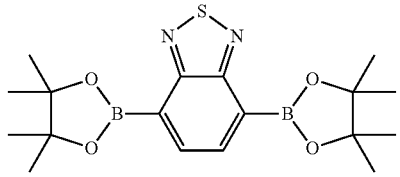

8

Into a 100 mL flask in which a gas in the flask was replaced by argon, 115.3 mg (0.200 mmol) of the compound 7, 77.6 mg (0.200 mmol) of compound 8 (4,7-bis(4,4,5,5-tetramethyl-1,3,2-dioxaborolan-2-yl)-2,1,3-benzothiadiazole) (manufactured by Aldrich Corp.), and 60.6 mg of methyltrialkylammonium chloride (trade name: Aliquat 336 (registered trademark); manufactured by Aldrich Corp.) were charged and the resultant reaction mixture was dissolved in 10 mL of toluene. The resultant toluene solution was bubbled with argon for 30 minutes. Then thereto, 0.67 mg of palladium acetate, 3.7 mg of tris(2-methoxyphenyl)phosphine, and 2 mL of an aqueous solution of sodium carbonate (16.7% by weight) were added and the resultant reaction mixture was stirred at 100° C. for 1.5 hours. Then, 1 g of sodium diethyldithiocarbamate and 10 mL of water were added and the resultant reaction mixture was stirred under reflux for 2 hours. After the completion of the reaction, the reaction solution was cooled to around room temperature (25° C.) and the resultant reaction solution was left stand still to recover the separated toluene phase. The toluene phase was washed with 10 mL of water twice, with 10 mL of 3% acetic acid water twice, and further with 10 mL of water twice and the resultant toluene phase was poured into methanol to recover precipitate. The precipitate was dried under reduced pressure and was then dissolved in chloroform. Next, the resultant chloroform solution was filtered to remove insoluble matters and was then passed through an alumina column to be purified. The resultant chloroform solution was concentrated under reduced pressure and was then poured into methanol to generate precipitate and the generated precipitate was recovered. The precipitate was washed with methanol and was then dried under reduced pressure to obtain 40 mg of polymer. Hereinafter, the polymer is called polymer A. For the polymer A, the weight-average molecular weight in terms of polystyrene was 17,000 and the number average molecular weight in terms of polystyrene was 5,000. The light absorbing terminal wavelength of the polymer A was 925 nm.

Example 1

Preparation and Evaluation of Ink and Organic Thin Film Solar Cell

A glass substrate on which an ITO film was formed by a sputtering method in a thickness of 150 nm was subjected to surface treatment by ozone UV treatment. Next, the polymer A and fullerene C60PCBM (phenyl C61-butyric acid methyl ester; manufactured by Frontier Carbon Corporation) (weight ratio of the polymer A/C60PCBM was 1/3) were dissolved in o-dichlorobenzene (total weight of the polymer A and C60PCBM was 2.0% by weight) to produce an ink 1. The ink 1 was applied on the substrate by spin-coating to prepare an organic film containing the polymer A (film thickness: about 100 nm). The thus prepared organic film had a light absorbing terminal wavelength of 920 nm. Then, on the organic film, lithium fluoride was deposited by a vacuum deposition machine in a thickness of 2 nm and next thereon, Al was deposited in a thickness of 100 nm. The obtained organic thin film solar cell had a shape of a 2 mm×2 mm square. The obtained organic thin film solar cell was irradiated with a constant light using a solar simulator (manufactured by BUNKOUKEIKI Co., Ltd.; trade name: OTENTO-SUNII; AM 1.5G filter, irradiance: 100 mW/cm$^2$) and the generated current and voltage were measured to calculate the photoelectric conversion efficiency, the short-circuit current density, the open-circuit voltage, and the fill factor. $J_{sc}$ (short-circuit current density) was 12.46 mA/cm$^2$; Voc (open-circuit voltage) was 0.52 V; ff (fill factor) was 0.52; and photoelectric conversion efficiency (η) was 3.38%.

Calculation Example 1

The polymer A has the smallest repeated unit (E1) represented by the formula below. As the calculation model structure, there were prepared a calculation model structure composed of one repeated unit (E1), a calculation model structure in which two repeated units (E1) were linked with each other, and a calculation model structure in which three repeated units (E1) were linked with each other. To linking groups at the both terminals of each calculation model structure, hydrogen atoms were bonded. Next, for each calculation model structure, the structure optimization calculation was performed to determine a structure having the minimum energy. The Hartree-Fock method was used as the method, and 3-21G* was used as the basis function. Furthermore, for the structure obtained by the structure optimization calculation, the calculation of the excitation energy from the ground singlet state to the lowest excited singlet state was performed by the time-dependent density functional theory. At this time, B3LYP was used as the functional, and 3-21G* was used as the basis function. Gaussian 03 (manufactured by Gaussian Inc.) was used as the calculation program. Each excitation energy of the calculation model structures from the ground singlet state to the lowest excited singlet state was plotted by assigning the inverse of the number k of aromatic rings that constitute the main chain contained in each calculation model structure (i.e., 1/k) on the abscissa axis and assigning the excitation energy on the ordinate axis. A straight line was drawn among three plotted points by the least-squares method and the straight line was extrapolated to define the energy when 1/k was 0, as the excitation energy of the polymer A from the ground singlet state to the lowest excited singlet state. The result is listed in Table 1. The excitation energy of the polymer A from the ground singlet state to the lowest excited singlet state was 1.42 (eV) and the inverse was 0.70 (eV$^{-1}$).

[Chemical Formula 61]

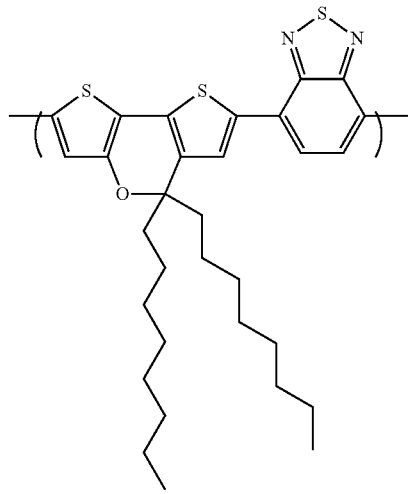

Smallest repeated unit (E1)

TABLE 1

| Structure used for calculation of excitation energy | k (Number of aromatic rings that constitute main chain) | Excitation energy from ground singlet state to lowest excited singlet state (eV) |
|---|---|---|
| 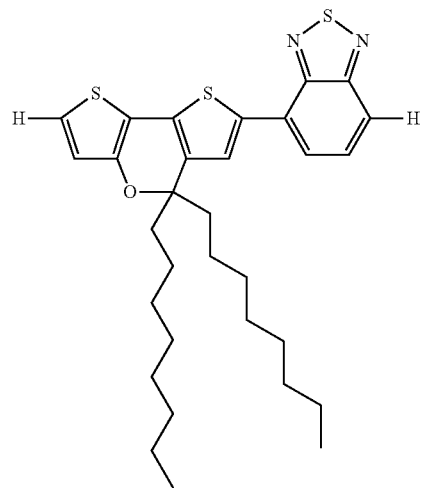 [SMILES: CCCCCCCCC1(CCCCCCCC)Oc2ccsc2-c2sc(-c3cccc4nsnc34)cc21] | 3 | 2.42 |

TABLE 1-continued

| Structure used for calculation of excitation energy | k (Number of aromatic rings that constitute main chain) | Excitation energy from ground singlet state to lowest excited singlet state (eV) |
|---|---|---|
| 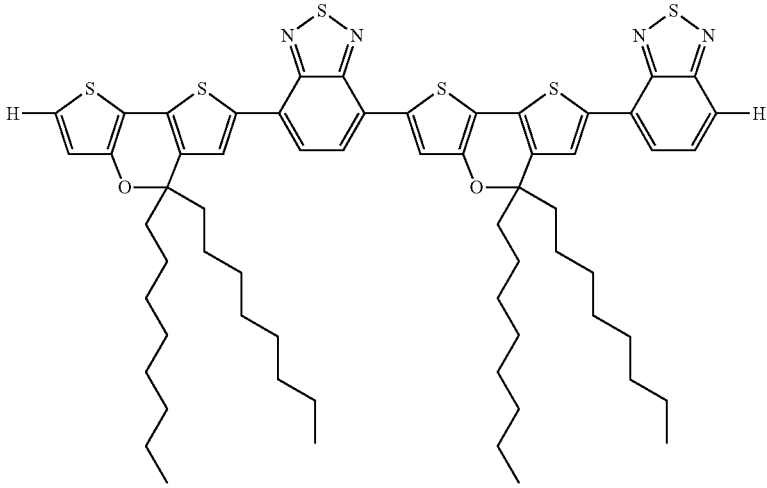 [SMILES: CCCCCCCCC1(CCCCCCCC)Oc2cc(-c3ccc(-c4cc5c(s4)-c4sccc4OC5(CCCCCCCC)CCCCCCCC)c4nsnc34)sc2-c2sc(-c3cccc4nsnc34)cc21] | 6 | 1.93 |
| 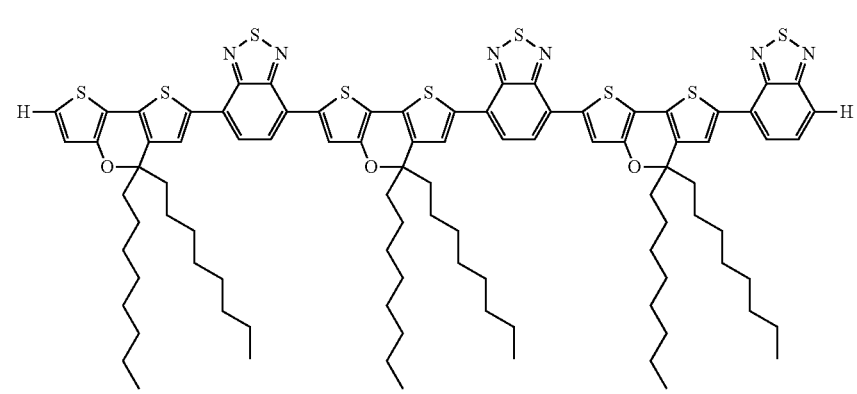 [SMILES: CCCCCCCCC1(CCCCCCCC)Oc2cc(-c3ccc(-c4cc5c(s4)-c4sc(-c6ccc(-c7cc8c(s7)-c7sccc7OC8(CCCCCCCC)CCCCCCCC)c7nsnc67)cc4OC5(CCCCCCCC)CCCCCCCC)c4nsnc34)sc2-c2sc(-c3cccc4nsnc34)cc21] | 9 | 1.75 |

Reference Example 9

Synthesis of Compound 5b

[Chemical Formula 62]

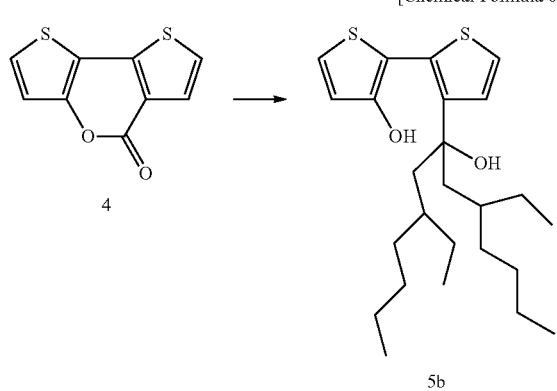

Into a 100 mL four-neck flask in which a gas in the flask was replaced by argon, 1.06 g (5.09 mmol) of the compound 4 and 30 mL of anhydrous THF were charged to prepare a homogeneous solution. While maintaining the flask at −20° C., 12.7 mL of solution of 2-ethylhexylmagnesium bromide (1 M) in ether was added to the solution. Then, the temperature of the resultant reaction mixture was elevated to −5° C. over 30 minutes and the reaction mixture as it was stirred for 30 minutes. Then, the temperature of the reaction mixture was elevated to 0° C. over 10 minutes and the reaction mixture as it was was stirred for 1.5 hours. Then, to the reaction mixture, water was added to terminate the reaction and the reaction product was extracted with ethyl acetate. The organic phase that was an ethyl acetate solution was dried over sodium sulfate and was filtered and then the ethyl acetate solution was passed through a silica gel column, followed by evaporating the solvent of the filtrate to obtain 1.28 g of compound 5b. The operations up to here were repeated by a plurality of times.

$^1$H NMR in CDCl$_3$ (ppm): 7.25 (d, 1H), 7.20 (d, 1H), 6.99 (d, 1H), 6.76 (d, 1H), 1.76 (s, 4H), 1.49 (b, 2H), 1.29-1.04 (m, 16H), 0.80 (s, 6H), 0.71 (s, 6H)

Reference Example 10

Synthesis of Compound 6b

[Chemical Formula 63]

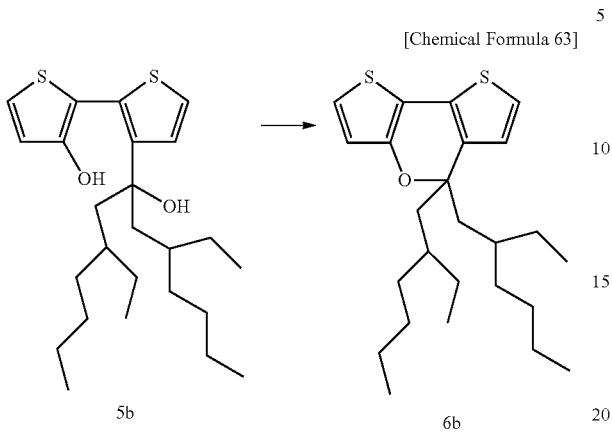

Into a 200 mL flask in which a gas in the flask was replaced by argon, 2.58 g of the compound 5b and 30 mL of toluene were charged to prepare a homogeneous solution. To the solution, 100 mg of sodium p-toluenesulfonate monohydrate was added and the resultant reaction mixture was stirred at 100° C. for 1.5 hours. The resultant reaction solution was cooled to room temperature (25° C.) and to the reaction solution, 50 mL of water was then added, followed by extracting the reaction product with toluene. The organic phase that was a toluene solution was dried over sodium sulfate and was filtered and then the solvent was evaporated. The resultant crude product was purified by a silica gel column (solvent: hexane) to obtain 741 mg of compound 6b.

$^1$H NMR in CDCl$_3$ (ppm): 6.98 (d, 1H), 6.93 (d, 1H), 6.68 (d, 1H), 6.59 (d, 1H), 1.78 (s, 4H), 1.50 (b, 2H), 1.30-1.05 (m, 16H), 0.81 (s, 6H), 0.72 (s, 6H)

Reference Example 11

Synthesis of Compound 7b

[Chemical Formula 64]

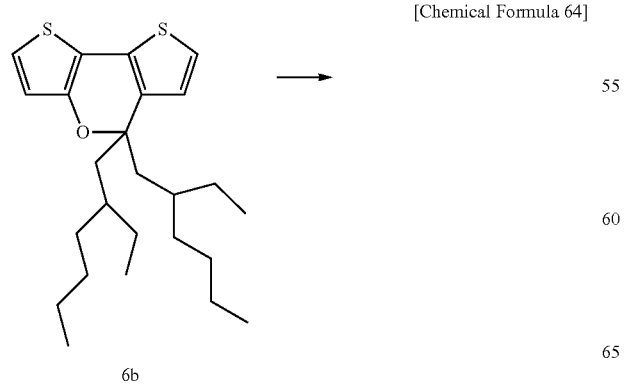

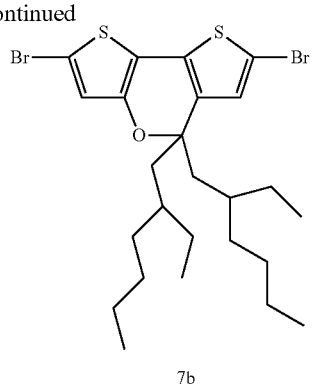

Into a 200 mL flask in which a gas in the flask was replaced by argon, 741 mg (1.77 mmol) of the compound 6b and 20 mL of anhydrous DMF were charged to prepare a homogeneous solution. While maintaining the solution at −30° C., to the solution, 646 mg (3.63 mmol) of NBS was added and the temperature of the resultant reaction mixture was elevated from −30° C. to −10° C. over 30 minutes. After the confirmation of the disappearance of the compound 6b by liquid chromatography (LC), water and sodium thiosulfate were added to the reaction mixture to terminate the reaction and the reaction product was extracted with ether. The organic phase that was an ether solution was washed with a saturated sodium chloride aqueous solution, was dried over magnesium sulfate, and was filtered and then the solvent was evaporated to obtain crude product. The crude product was purified by a silica gel column (solvent: hexane) to obtain 892 mg of compound 7b (yield: 87.4%).

$^1$H NMR in CDCl$_3$ (ppm): 6.63 (1H), 6.59 (1H), 1.74 (s, 4H), 1.50 (b, 2H), 1.37-1.01 (m, 16H), 0.87 (s, 6H), 0.77 (s, 6H)

Reference Example 12

Synthesis of Polymer B

[Chemical Formula 65]

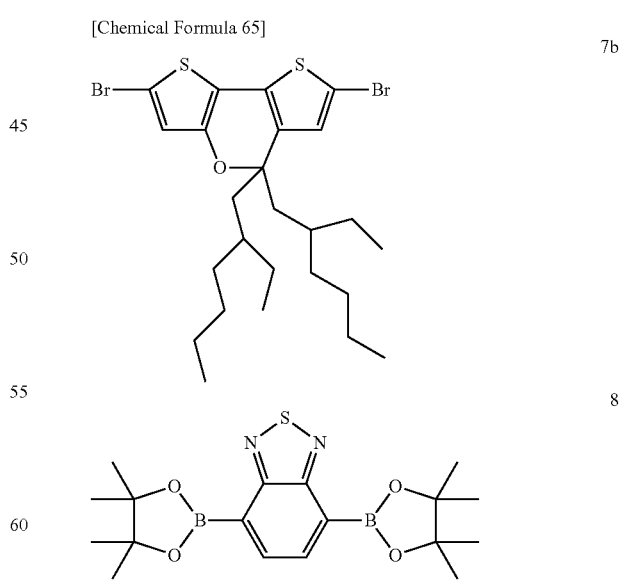

Into a 200 mL flask in which a gas in the flask was replaced by argon, 890 mg (1.54 mmol) of the compound 7b, 571.8 mg (1.47 mmol) of the compound 8 (4,7-bis(4,4,5,5-tetramethyl-1,3,2-dioxaborolan-2-yl)-2,1,3-benzothiadiazole) (manufactured by Aldrich Corp.), and 250 mg of methyltrialkylammonium chloride (trade name: Aliquat 336 (registered trademark); manufactured by Aldrich Corp.) were charged and the resultant reaction mixture was dissolved in 60 mL of toluene. The resultant toluene solution was bubbled with argon for 30 minutes. Then thereto, 3.74 mg of palladium acetate, 19.0 mg of tris(2-methoxyphenyl)phosphine, and 7.5 mL of an aqueous solution of sodium carbonate (16.7% by weight) were added and the resultant reaction mixture was stirred at 70° C. for 4 hours. Then, 50 mg of phenylboric acid was added and the reaction was further carried out at 70° C. for 2 hours. Then, 2 g of sodium diethyldithiocarbamate and 20 mL of water were added and the resultant reaction mixture was stirred under reflux for 2 hours. The aqueous phase was removed and the organic phase was washed with 20 mL of water twice, with 20 mL of an aqueous solution of acetic acid (3% by weight) twice, and further with 20 mL of water twice, followed by pouring the resultant solution into methanol to precipitate polymer. The polymer was filtered and then dried and the resultant polymer was dissolved in 30 mL of o-dichlorobenzene again. The resultant solution was passed through an alumina/silica gel column and the resultant solution was poured into methanol to precipitate polymer, followed by filtering and then drying the polymer to obtain 380 mg of purified polymer. Hereinafter, the polymer is called polymer B. The molecular weight of the polymer B measured by GPC (in terms of polystyrene) corresponded to Mw=77,000 and Mn=15,000. The light absorbing terminal wavelength of the polymer B was 930 nm.

Example 2

In the same manner as in Example 1, except that the polymer B was used instead of the polymer A, the preparation and evaluation of the cell were carried out. The result is listed in Table 7.

Calculation Example 2

The polymer B has the smallest repeated unit (E2) represented by the formula below. By the same method as in Calculation Example 1, the excitation energy of the polymer B from the ground singlet state to the lowest excited singlet state was calculated. The excitation energy of the polymer B from the ground singlet state to the lowest excited singlet state was 1.50 (eV) and the inverse of the excitation energy was 0.67 (eV$^{-1}$).

[Chemical Formula 66]

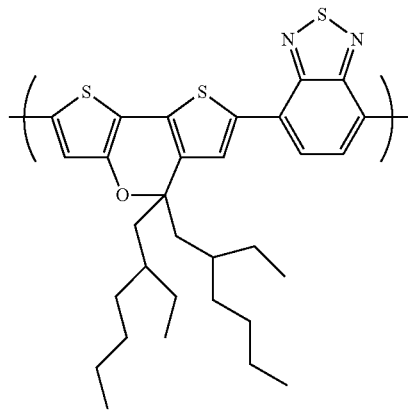

Smallest repeated unit (E2)

TABLE 2

| Structure used for calculation of excitation energy | k (Number of aromatic rings that constitute main chain) | Excitation energy from ground singlet state to lowest excited singlet state (eV) |
|---|---|---|
| 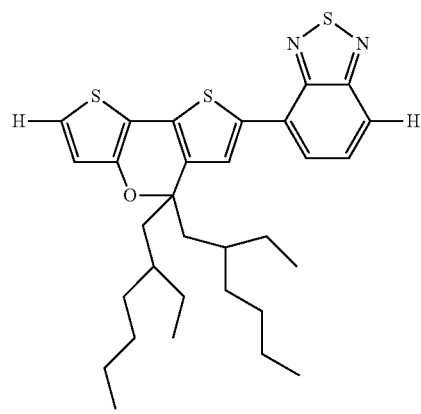 [SMILES: CCCCC(CC)CC1(CC(CC)CCCC)Oc2ccsc2-c2sc(-c3cccc4nsnc34)cc21] | 3 | 2.43 |

TABLE 2-continued

| Structure used for calculation of excitation energy | k (Number of aromatic rings that constitute main chain) | Excitation energy from ground singlet state to lowest excited singlet state (eV) |
|---|---|---|
| | 6 | 1.98 |
| | 9 | 1.81 |

Reference Example 13

Synthesis of Compound 5c

[Chemical Formula 67]

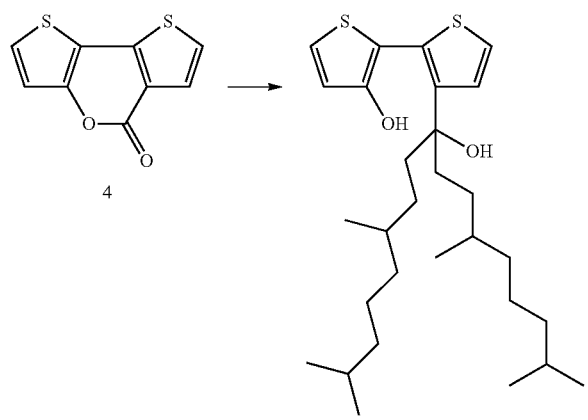

Into a 100 mL four-neck flask in which a gas in the flask was replaced by argon, 1.00 g (4.80 mmol) of the compound 4 and 30 mL of anhydrous THF were charged to prepare a homogeneous solution. While maintaining the flask at −20° C., 12.7 mL of solution of 3,7-dimethyloctylmagnesium bromide (1 M) in ether was added to the solution. Then, the temperature of the resultant reaction mixture was elevated to −5° C. over 30 minutes and the reaction mixture as it was stirred for 30 minutes. Then, the temperature of the reaction mixture was elevated to 0° C. over 10 minutes and the reaction mixture as it was was stirred for 1.5 hours. Then, to the reaction mixture, water was added to terminate the reaction and the reaction product was extracted with ethyl acetate. The organic phase that was an ethyl acetate solution was dried over sodium sulfate and was filtered and then the ethyl acetate solution was passed through a silica gel column, followed by evaporating the solvent of the resultant filtrate to obtain 1.50 g of compound 5c.

$^1$H NMR in CDCl$_3$ (ppm): 8.42 (b, 1H), 7.25 (d, 1H), 7.20 (d, 1H), 6.99 (d, 1H), 6.76 (d, 1H), 2.73 (b, 1H), 1.90 (m, 4H), 1.58-1.02 (b, 20H), 0.92 (s, 6H), 0.88 (s, 12H)

Reference Example 14

Synthesis of Compound 6c

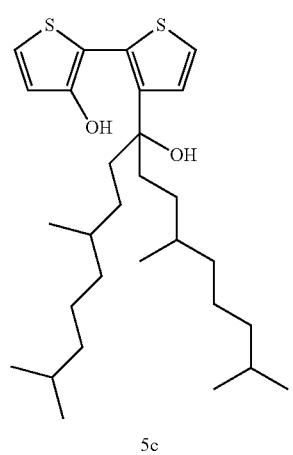

5c

[Chemical Formula 68]

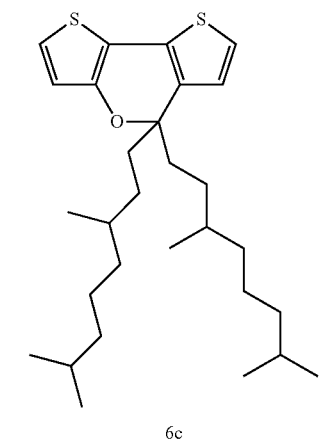

6c

Reference Example 15

Synthesis of Compound 7c

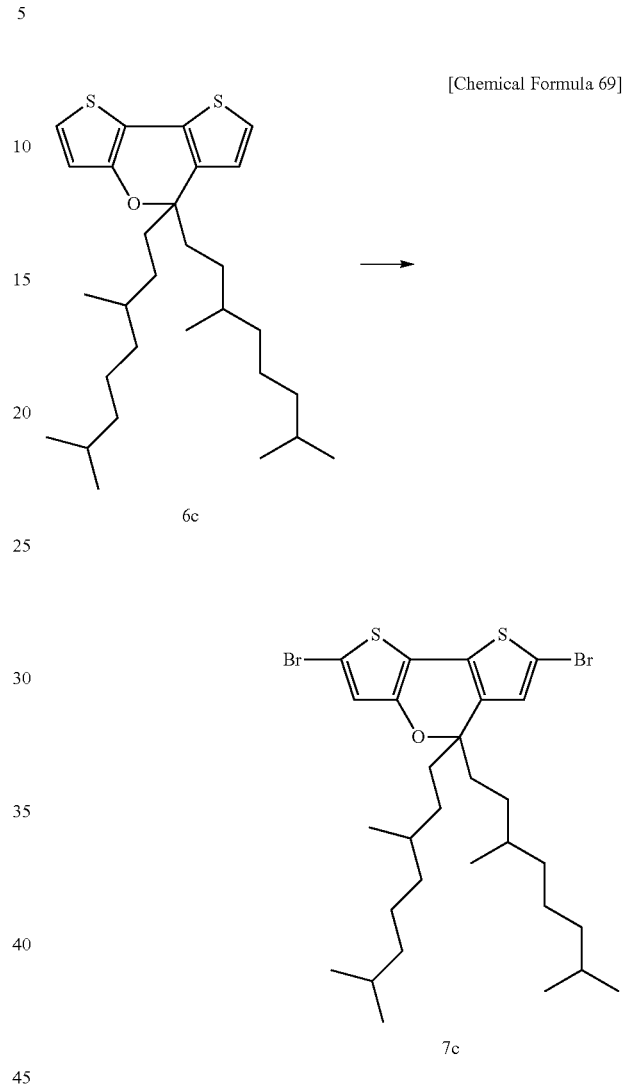

[Chemical Formula 69]

Into a 200 mL flask in which a gas in the flask was replaced by argon, 1.50 g of the compound 5c and 30 mL of toluene were charged to prepare a homogeneous solution. To the solution, 100 mg of sodium p-toluenesulfonate monohydrate was added and the resultant reaction mixture was stirred at 100° C. for 1.5 hours. The resultant reaction solution was cooled to room temperature (25° C.) and then to the reaction solution, 50 mL of water was added, followed by extracting the reaction product with toluene. The organic phase that was a toluene solution was dried over sodium sulfate and was filtered and then from the resultant filtrate, the solvent was evaporated. The resultant crude product was purified by a silica gel column (solvent: hexane) to obtain 1.33 g of compound 6c. The operations up to here were repeated by a plurality of times.

$^1$H NMR in $CDCl_3$ (ppm): 6.98 (d, 1H), 6.93 (d, 1H), 6.68 (d, 1H), 6.59 (d, 1H), 1.89 (m, 4H), 1.58-1.00 (b, 20H), 0.87 (s, 6H), 0.86 (s, 12H)

Into a 200 mL flask in which a gas in the flask was replaced by argon, 1.33 g (2.80 mmol) of the compound 6c and 20 mL of anhydrous DMF were charged to prepare a homogeneous solution. The solution was maintained at −30° C. and thereto, 1,040 mg (5.84 mmol) of NBS was added. The temperature of the reaction mixture was elevated from −30° C. to −10° C. over 30 minutes. After the confirmation of the disappearance of the compound 6c by liquid chromatography (LC), to the reaction mixture, 50 mL of an aqueous solution of 1 M sodium thiosulfate was added to terminate the reaction and the reaction product was extracted with ether. The organic phase that was an ether solution was washed with a saturated sodium chloride aqueous solution, was dried over magnesium sulfate, and was filtered and then from the resultant filtrate, the solvent was evaporated to obtain crude product. The crude product was purified by a silica gel column (solvent: hexane) to obtain 1.65 g of compound 7c (93%).

$^1$H NMR in $CDCl_3$ (ppm): 6.66 (1H), 6.63 (1H), 1.90 (m, 4H), 1.56-1.02 (b, 20H), 0.87 (s, 6H), 0.85 (s, 12H)

Reference Example 16

Synthesis of Polymer F

[Chemical Formula 70]

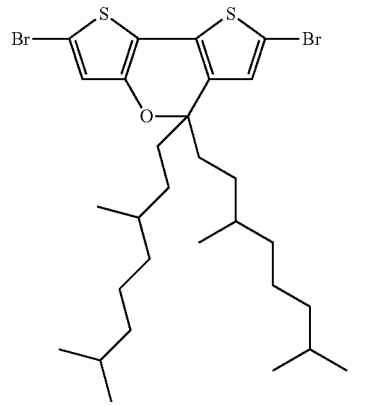

7c

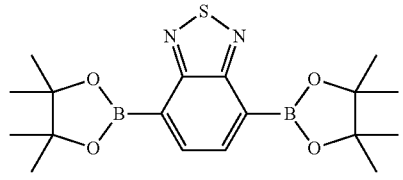

8

In the same manner as in Reference Example 12, except that the compound 7c was used instead of the compound 7b, the synthesis was performed to obtain polymer F. The molecular weight of the polymer F measured by GPC (in terms of polystyrene) corresponded to Mw=54,000 and Mn=21,000. The light absorbing terminal wavelength of the polymer F was 930 nm.

Example 3

In the same manner as in Example 1, except that the polymer F was used instead of the polymer A, the preparation and evaluation of the cell were carried out. The result is listed in Table 7.

Calculation Example 3

The polymer F has the smallest repeated unit (E3) represented by the formula below. By the same method as in Calculation Example 1, the excitation energy of the polymer F from the ground singlet state to the lowest excited singlet state was calculated. The excitation energy of the polymer F from the ground singlet state to the lowest excited singlet state was 1.42 (eV) and the inverse of the excitation energy was 0.71 (eV$^{-1}$).

[Chemical Formula 71]

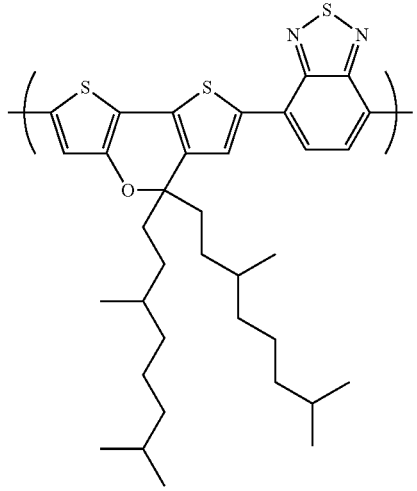

Smallest repeated unit (E3)

TABLE 3

| Structure used for calculation of excitation energy | k (Number of aromatic rings that constitute main chain) | Excitation energy from ground singlet state to lowest excited singlet state (eV) |
|---|---|---|
| | 3 | 2.42 |

TABLE 3-continued

| Structure used for calculation of excitation energy | k (Number of aromatic rings that constitute main chain) | Excitation energy from ground singlet state to lowest excited singlet state (eV) |
|---|---|---|
| (structure) | 6 | 1.93 |
| (structure) | 9 | 1.75 |

Reference Example 17
Synthesis of Compound 24

[Chemical Formula 72]

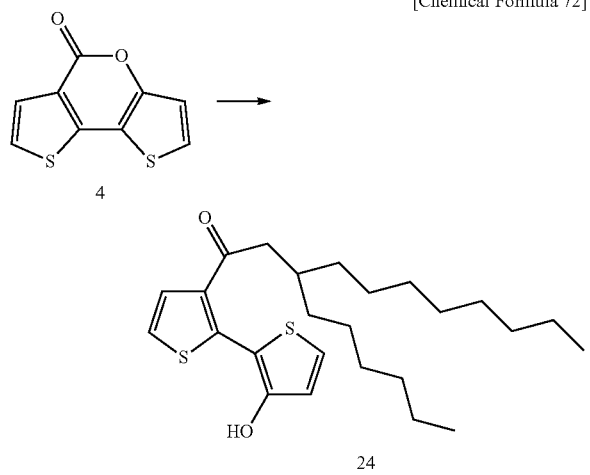

Into a 100 mL four-neck flask in which a gas in the flask was replaced by argon, 1.04 g (5.00 mmol) of the compound 4 and 35 mL of anhydrous THF were charged to prepare a homogeneous solution. While maintaining the flask at −20° C., to the solution, 15.0 mL of solution of 2-hexyldecylmagnesium bromide (1 M) in ether was added. Then, the temperature of the resultant reaction mixture was elevated to −5° C. over 30 minutes and the reaction mixture as it was stirred for 30 minutes. Then, the temperature of the reaction mixture was elevated to 0° C. over 10 minutes and the reaction mixture as it was stirred for 1.5 hours. Then to the reaction mixture, water was added to terminate the reaction and the reaction product was extracted with diethyl ether. The organic phase that was a diethyl ether solution was dried over sodium sulfate and was filtered. The resultant filtrate was passed through a silica gel column using chloroform as a developing solution and the solvent of the resultant filtrate was evaporated to obtain 1.30 g of compound 24.

Reference Example 18

Synthesis of Compound 5e

[Chemical Formula 73]

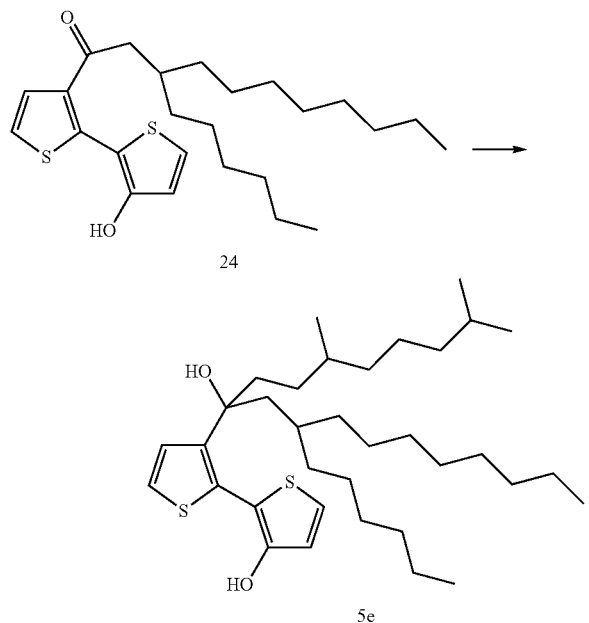

Into a 100 mL four-neck flask in which a gas in the flask was replaced by argon, 1.30 g (2.99 mmol) of the compound 24 and 30 mL of anhydrous THF were charged to prepare a homogeneous solution. While maintaining the flask at −20° C., to the solution, 15.0 mL of solution of 3,7-dimethyloctyl-magnesium bromide (1 M) in ether was added. Then, the temperature of the resultant reaction mixture was elevated to −5° C. over 30 minutes and the reaction mixture as it was stirred for 30 minutes. Then, the temperature of the reaction mixture was elevated to 0° C. over 10 minutes and the reaction mixture as it was stirred for 1.5 hours. Then to the reaction mixture, water was added to terminate the reaction and the reaction product was extracted with diethyl ether. The organic phase that was a diethyl ether solution was dried over sodium sulfate and was filtered. The resultant filtrate was passed through a silica gel column using chloroform as a developing solution and the solvent of the resultant filtrate was evaporated to obtain 1.20 g of compound 5e.

Reference Example 19

Synthesis of Compound 6e

[Chemical Formula 74]

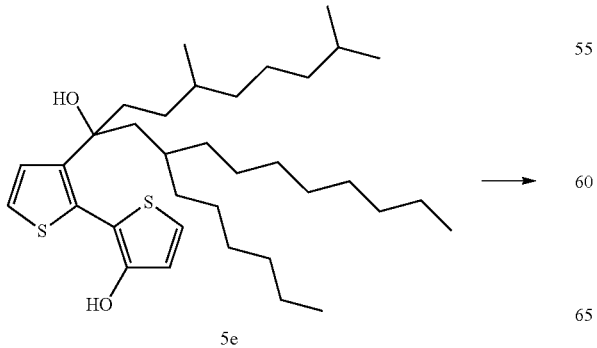

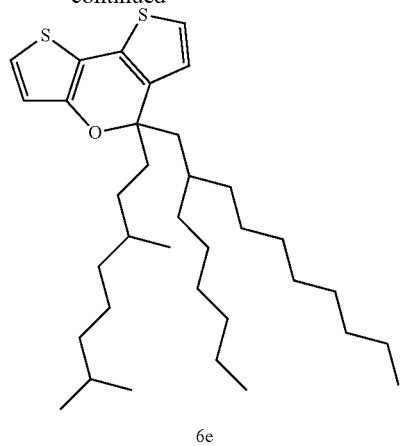

Into a 200 mL flask in which a gas in the flask was replaced by argon, 1.20 g (2.08 mmol) of the compound 5e and 30 mL of toluene were charged to prepare a homogeneous solution. To the solution, 100 mg of sodium p-toluenesulfonate mono-hydrate was added, and the resultant reaction mixture was stirred at 100° C. for 1.5 hours. The reaction solution was cooled to room temperature (25° C.) and thereto, 50 mL of water was added, followed by extracting the reaction product with toluene. The organic phase that was a toluene solution was dried over sodium sulfate and was filtered and from the resultant filtrate, the solvent was evaporated. The resultant crude product was purified by a silica gel column (solvent: hexane) to obtain 802 mg of compound 6e.

$^1$H-NMR (CDCl$_3$, δ (ppm)): 0.833 (m, 15H), 1.0-1.5 (m, 35H), 1.850 (m, 4H), 6.688 (m, 2H), 6.966 (d, 1H), 7.028 (d, 1H)

Reference Example 20

Synthesis of Compound 7e

[Chemical Formula 75]

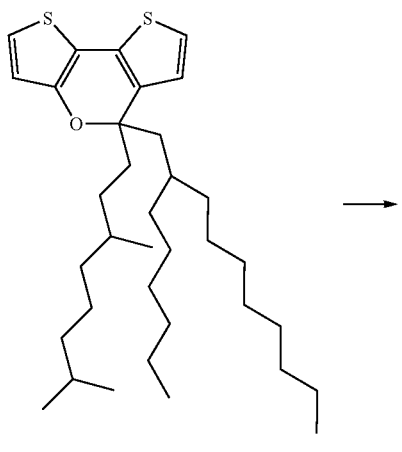

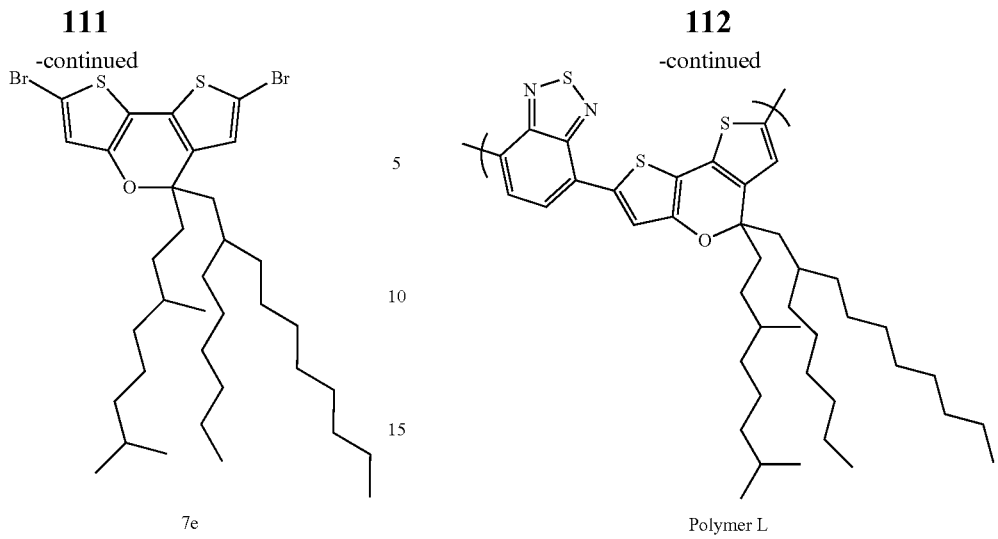

7e

Into a 300 mL flask in which a gas in the flask was replaced by argon, the compound 6e (400 mg, 0.716 mmol) and N,N-dimethylformamide (DMF) (20 mL) were charged to prepare a homogeneous solution. The solution was subjected to argon bubbling at 25° C. for 30 minutes and was then cooled to −40° C. and thereto, NBS (280.4 mg, 1.575 mmol) was added, followed by elevating the temperature of the resultant reaction mixture to 0° C. over 2 hours. To the reaction solution, 50 mL of water was added and extraction was carried out with diethyl ether. The extracted diethyl ether solution was dried over sodium sulfate and was then filtered and from the resultant filtrate, the solvent was evaporated. The resultant crude product was purified by a silica gel column using hexane as a solvent to obtain 437 mg of compound 7e.

$^1$H-NMR (CDCl$_3$, δ (ppm)): 0.833 (m, 15H), 1.0-1.5 (m, 35H), 1.850 (m, 4H), 6.660 (s, 1H), 6.980 (s, 1H)

Reference Example 21

Synthesis of Polymer L

[Chemical Formula 76]

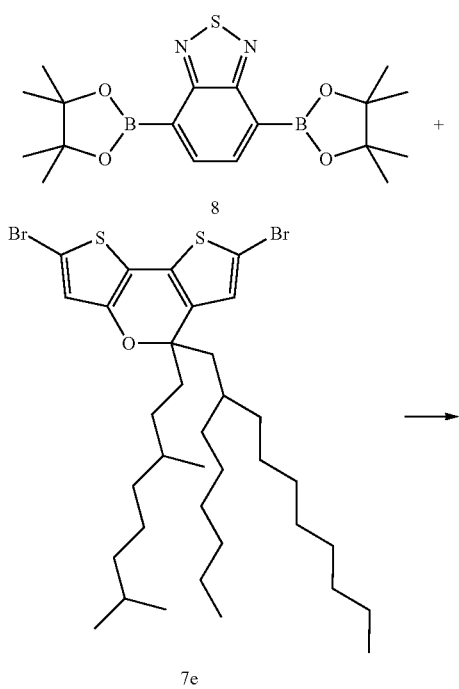

Polymer L

Into a 200 mL four-neck flask in which a gas in the flask was replaced by argon, the compound 8 (110.6 mg, 0.285 mmol), the compound 7e (215.0 mg, 0.300 mmol), and tetrahydrofuran (THF) (10 mL) were charged and the resultant reaction mixture was subjected to argon bubbling at room temperature (25° C.) for 30 minutes. Then, to the reaction mixture, tris(dibenzylideneacetone) palladium (5.49 mg, 0.006 mmol) and [tri(tert-butyl)phosphonium]tetrafluoroborate (6.96 mg, 0.024 mmol) were added. While stirring the reaction mixture at 80° C., a potassium carbonate aqueous solution (27.6% by weight, 1.50 g, 3.00 mmol) was dropped into the reaction mixture over 30 minutes. After 30 minutes, to the resultant reaction mixture, phenylboric acid (3.66 mg, 0.03 mmol) was added, the resultant reaction mixture was stirred further for 1 hour, and then the reaction was terminated.

Then, to the reaction mixture, sodium diethyldithiocarbamate (1 g) and pure water (10 mL) were added and the resultant reaction mixture was stirred under reflux for 1 hour. The aqueous phase in the reaction solution was removed and then the organic phase was washed with 10 mL of water twice, with 10 mL of an aqueous solution of acetic acid (3% by weight) twice, and further with 10 mL of water twice, followed by pouring the resultant solution into methanol to precipitate polymer. The polymer was filtered and then dried and the resultant polymer was dissolved in toluene. The resultant solution was passed through an alumina/silica gel column and the resultant solution was poured into methanol to precipitate polymer. The polymer was filtered and then dried to obtain 242 mg of polymer L. The light absorbing terminal wavelength of the polymer L was 930 nm.

Example 4

In the same manner as in Example 1, except that the polymer L was used instead of the polymer A, the preparation and evaluation of the cell were carried out. The result is listed in Table 7.

Calculation Example 4

The polymer L has the smallest repeated unit (E4) represented by the formula below. By the same method as in Calculation Example 1, the excitation energy of the polymer L from the ground singlet state to the lowest excited singlet state was calculated. The excitation energy of the polymer L from the ground singlet state to the lowest excited singlet state was 1.42 (eV) and the inverse of the excitation energy was 0.70 (eV$^{-1}$).

[Chemical Formula 77]
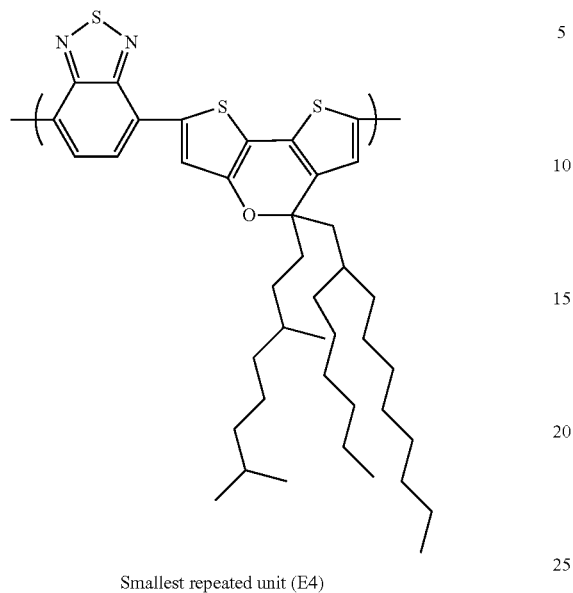
Smallest repeated unit (E4)
TABLE 4
| Structure used for calculation of excitation energy | k (Number of aromatic rings that constitute main chain) | Excitation energy from ground singlet state to lowest excited singlet state (eV) |
| --- | --- | --- |
|  | 3 | 2.43 |

TABLE 4-continued

| Structure used for calculation of excitation energy | k (Number of aromatic rings that constitute main chain) | Excitation energy from ground singlet state to lowest excited singlet state (eV) |
| --- | --- | --- |
| [chemical structure] | 6 | 1.94 |
| [chemical structure] | 9 | 1.75 |
| [chemical structure] | | |

Reference Example 22

Synthesis of Compound 26

[Chemical Formula 78]

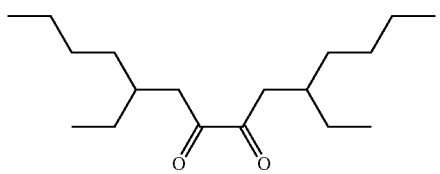

26

Into a 500 mL flask in which a gas in the flask was replaced by argon, 5.65 g (39.4 mmol) of copper (I) bromide, 6.84 g (78.8 mmol) of lithium bromide, and 280 mL of THF were charged, and the resultant mixture was stirred to prepare a suspension. The flask was cooled to −78° C. and into the suspension, 39.4 mL of solution of 2-ethylhexylmagnesium bromide (1 M) in diethyl ether was dropped over 10 minutes. The resultant reaction solution was stirred at −78° C. for 30 minutes and then, into the reaction solution, 2.00 g (15.8 mmol) of oxalyl chloride was dropped at −78° C. over 10 minutes. After the dropping, the reaction solution was stirred at −78° C. for 1.5 hours and further, stirred at room temperature (25° C.) for 30 minutes and to the resultant solution, 160 mL of an aqueous solution of saturated ammonium chloride was added to terminate the reaction. Ethyl acetate was added to the reaction mixture and the resultant reaction mixture was extracted into an organic phase. The resultant organic phase was dried over magnesium sulfate and was filtered. The resultant filtrate was concentrated by an evaporator and the resultant oily substance was purified by a silica gel column to obtain compound 26 as 1.30 g of light yellow liquid. As the developing solution of the silica gel column, a solution prepared by mixing hexane and ethyl acetate in a volume ratio of 99:1 was used.

Reference Example 23

Synthesis of Compound 28

Into a 300 mL flask in which a gas in the flask was replaced by argon, 1.33 g (4.72 mmol) of the compound 26, 1.20 g (4.31 mmol) of the compound 27 synthesized according to a method described in "Chemistry of Materials, Vol. 8, No. 2, (1996)," and 60 mL of ethanol were charged and the resultant reaction mixture was stirred under reflux for 5 hours. Then, from the reaction mixture, the solvent was evaporated by an evaporator and the resultant dark red solid was purified by a silica gel column to obtain 1.22 g of the objective compound 28. As the developing solution of the silica gel column, a solution prepared by mixing hexane and chloroform in a volume ratio of 99:1 was used.

Reference Example 24

Synthesis of Compound 29

[Chemical Formula 80]

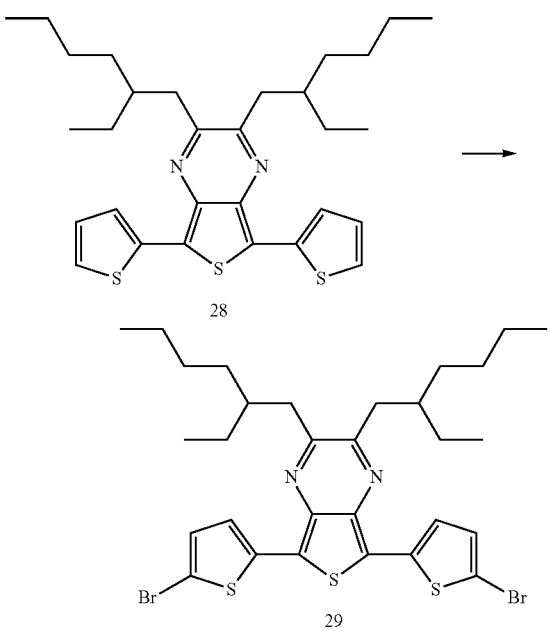

[Chemical Formula 79]

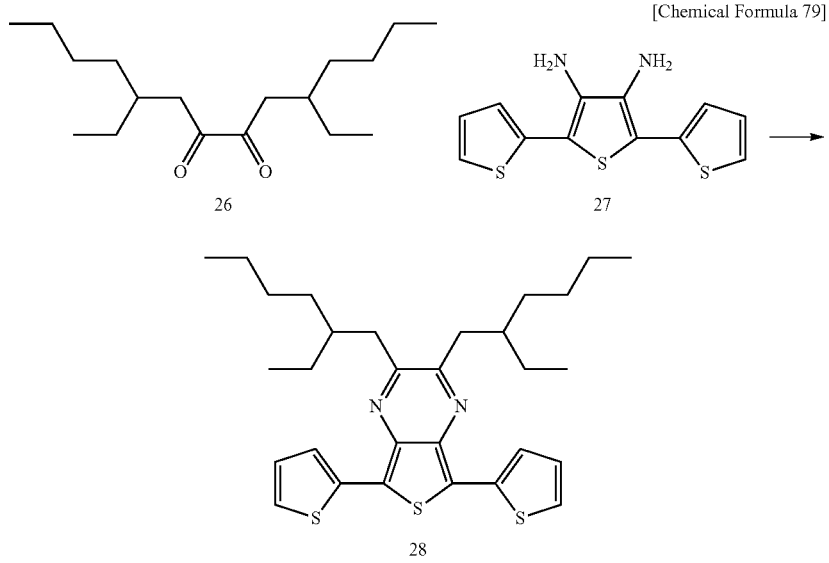

Into a 300 mL flask in which a gas in the flask was replaced by argon, 1.22 g (2.32 mmol) of the compound 28 and 100 mL of chloroform were charged to prepare a homogeneous solution. While maintaining the flask at −10° C., 0.87 g of NBS was added to the solution over 30 minutes. The flask was returned to room temperature and thereto, 100 mL of an aqueous solution of saturated sodium thiosulfate was added to terminate the reaction. The resultant solution was extracted with chloroform and the resultant organic phase was dried over sodium sulfate and was filtered. The resultant filtrate was concentrated by an evaporator and the resultant wax-shaped solid was purified by a silica gel column to obtain 1.00 g of the objective compound 29. As the developing solution of the silica gel column, a solution prepared by mixing heptane and chloroform in a volume ratio of 98:2 was used.

Reference Example 25

Synthesis of Polymer C

[Chemical Formula 81]

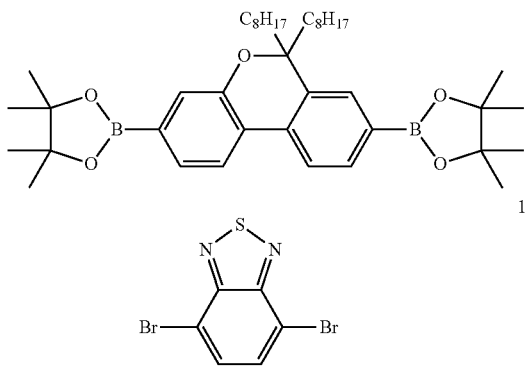

Into a 100 mL flask, 398.7 mg (0.605 mmol) of the above compound 9 synthesized according to the description in Example 10 of Japanese Patent Application. Laid-open No. 2004-168999, 160.3 mg (0.5451 mmol) of compound 10 (4,7-dibromo-2,1,3-benzothiadiazole) (manufactured by Aldrich Corp.), and 200 mg of methyltrialkylammonium chloride (trade name: Aliquat 336 (registered trademark); manufactured by Aldrich Corp.) were charged and the resultant reaction mixture was dissolved in 40 mL of toluene. The resultant toluene solution was bubbled with argon for 30 minutes. Then thereto, 2.4 mg of palladium acetate, 12.2 mg of tris(2-methoxyphenyl)phosphine, and 2 mL of an aqueous solution of sodium carbonate (16.7% by weight) were added and the resultant reaction mixture was stirred under reflux for 3 hours. Then, 50 mg of phenylboric acid was added and the reaction mixture was further stirred under reflux for 2 hours. Then, 2 g of sodium diethyldithiocarbamate and 20 mL of water were added and the resultant reaction mixture was stirred under reflux for 2 hours. After the completion of the reaction, the reaction solution was cooled to around room temperature (25° C.) and then the resultant reaction solution was left stand still to recover the separated toluene phase. The toluene phase was washed with 10 mL of water twice, with 10 mL of 3% acetic acid water twice, and further with 10 mL of water twice and the resultant toluene phase was poured into methanol to recover precipitate. The precipitate was dried under reduced pressure and was then dissolved in chloroform. Next, the resultant chloroform solution was filtered to remove insoluble matters and was then passed through an alumina column to be purified. The resultant chloroform solution was concentrated under reduced pressure and was then poured into methanol to generate precipitate, and the generated precipitate was recovered. The precipitate was washed with methanol and was then dried under reduced pressure to obtain 320 mg of polymer. Hereinafter, the polymer is called polymer C. For the polymer C, the weight-average molecular weight in terms of polystyrene was 446,000 and the number average molecular weight in terms of polystyrene was 169,000. The light absorbing terminal wavelength of the polymer C was 550 nm.

Reference Example 26

Synthesis of Polymer N

[Chemical Formula 82]

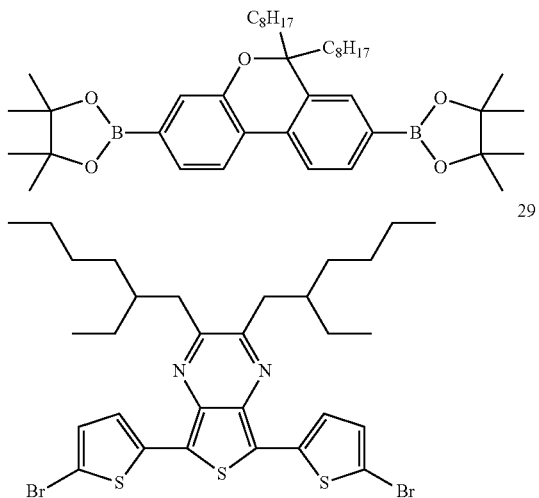

By using the compound 29 instead of the compound 10 in the synthesis of the polymer C in Reference Example 25, polymer N was obtained. For the polymer N, the weight-average molecular weight in terms of polystyrene was 126,000 and the number average molecular weight in terms of polystyrene was 56,000. The light absorbing terminal wavelength of the polymer N was 765 nm.

Example 5

In the same manner as in Example 1, except that the polymer N was used instead of the polymer A, the preparation and evaluation of the cell were carried out. The result is listed in Table 7.

Calculation Example 5

The polymer N has the smallest repeated unit (E5) represented by the formula below. By the same method as in Calculation Example 1, the excitation energy of the polymer N from the ground singlet state to the lowest excited singlet state was calculated. The excitation energy of the polymer N from the ground singlet state to the lowest excited singlet state was 2.12 (eV) and the inverse of the excitation energy was 0.47 (eV$^{-1}$).

[Chemical Formula 83]

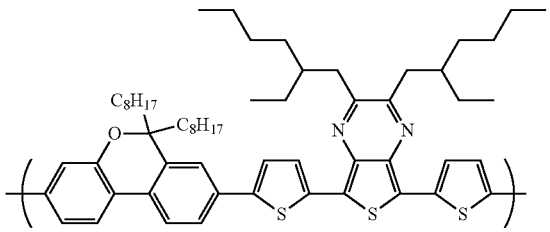

Smallest repeated unit (E5)

TABLE 5

| Structure used for calculation of excitation energy | k (Number of aromatic rings that constitute main chain) | Excitation energy from ground singlet state to lowest excited singlet state (eV) |
|---|---|---|
| [chemical structure] | 5 | 2.44 |
| [chemical structure] | 10 | 2.28 |
| [chemical structure] | 15 | 2.23 |

Comparative Example 1

In the same manner as in Example 1, except that the polymer C was used instead of the polymer A, the preparation and evaluation of the cell were carried out. The result is listed in Table 7.

Calculation Example 6

The polymer C has the smallest repeated unit (CE1) represented by the formula below. By the same method as in Calculation Example 1, the excitation energy of the polymer C from the ground singlet state to the lowest excited singlet state was calculated. The excitation energy of the polymer C from the ground singlet state to the lowest excited singlet state was 2.48 (eV) and the inverse of the excitation energy was 0.40 $(eV^{-1})$.

[Chemical Formula 84]

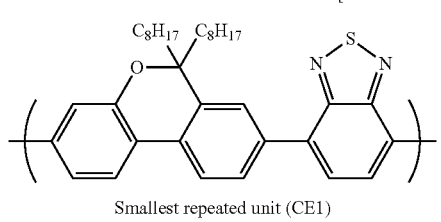

Smallest repeated unit (CE1)

Example 6

Preparation of Organic Transistor

A silicon substrate having a silicon thermal oxide film of a thickness of 300 nm and an n-type silicon in which antimony was doped in a high concentration was subjected to ultrasonic cleaning in acetone for 10 minutes and was then irradiated with ozone UV for 20 minutes. Then, the silicon substrate was spin-coated with a toluene solution in which 5 drops of β-PTS (β-phenyltrichlorosilane) were added to 10 mL of toluene with a syringe to subject the surface of the thermal oxide film

TABLE 6

| Structure used for calculation of excitation energy | k (Number of aromatic rings that constitute main chain) | Excitation energy from ground singlet state to lowest excited singlet state (eV) |
|---|---|---|
| (structure 1) | 3 | 2.94 |
| (structure 2) | 6 | 2.70 |
| (structure 3) | 9 | 2.63 |

TABLE 7

Photovoltaic Cell Evaluation Result

| | Polymer | Short-Circuit Current Density (mA/cm$^2$) | Open-Circuit Voltage | Fill Factor | Photoelectric Conversion Efficiency (%) | Inverse of Excitation Energy (eV$^{-1}$) |
|---|---|---|---|---|---|---|
| Example 1 | A | 12.46 | 0.52 | 0.52 | 3.38 | 0.70 |
| Example 2 | B | 5.64 | 0.58 | 0.36 | 1.18 | 0.67 |
| Example 3 | F | 10.08 | 0.56 | 0.51 | 2.86 | 0.71 |
| Example 4 | L | 10.32 | 0.57 | 0.57 | 3.34 | 0.70 |
| Example 5 | N | 4.60 | 0.67 | 0.46 | 1.42 | 0.47 |
| Comparative Example 1 | C | 0.11 | 0.80 | 0.43 | 0.04 | 0.40 | to silane treatment. The silicon thermal oxide film acts as a gate insulating layer and the silicon in which antimony was doped in a high concentration acts as a gate electrode.

Next, the polymer F was dissolved in chloroform to prepare a solution in which the concentration of the polymer F was 0.5% by weight, and the solution was filtered with a membrane filter to prepare a coating solution. The coating solution was applied on the above silane-treated n-type silicon substrate by a spin coating method to form the coating film of the polymer F having a thickness of about 60 nm. Then, the coating film was heated at 120° C. under a nitrogen atmosphere for 30 minutes to form the organic semiconductor thin film of the polymer F.

Next, on the organic semiconductor thin film, a metal mask was disposed and by a vacuum evaporation method, molybdenum trioxide and gold were layered in this order on the organic semiconductor thin film to prepare a source electrode and a drain electrode that had a layered structure of molybdenum trioxide and gold and to produce an organic transistor.

The electric properties of the organic transistor were measured using a semiconductor properties evaluation system (semiconductor parameter analyzer 4200-SCS; manufactured by Keithley Instruments Inc.). When a negative gate voltage applied to a gate electrode increased, a negative drain current also increased. Accordingly, it could be confirmed that the organic transistor is a p-type organic transistor. The saturated electric field-effect mobility μ of a carrier in the organic transistor was calculated using Formula (a) below representing a drain current Id in a saturation region of the electric properties of the organic transistor.

$$Id=(W/2L)\mu Ci(Vg-Vt)^2 \qquad (a)$$

(where L represents a channel length of the organic transistor; W represents a channel width of the organic transistor; Ci represents a capacity of the gate insulating film per unit area; Vg represents a gate voltage; and Vt represents a threshold voltage of the gate voltage).

The electric field-effect mobility of a carrier (carrier mobility) was 0.0073 cm$^2$/Vs and the ON/OFF current ratio was $10^4$.

Reference Example 27

Synthesis of Compound 30

[Chemical Formula 85]

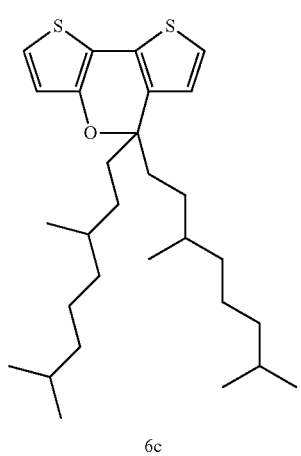

6c

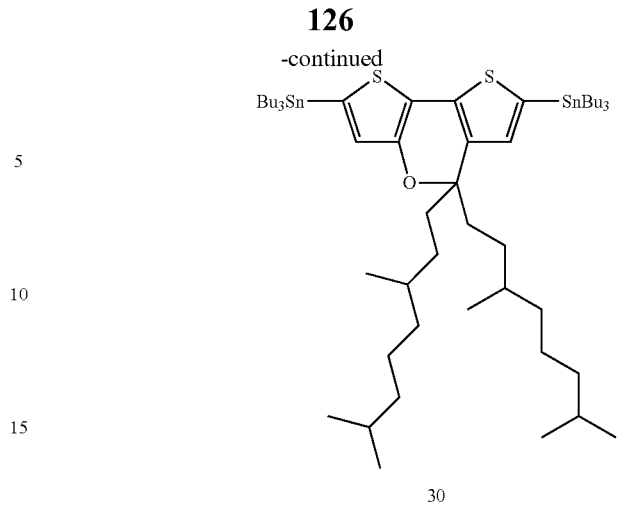

30

Into a 200 mL flask in which a gas in the flask was replaced by argon, 2.16 g (4.55 mmol) of the compound 6c and 100 mL of anhydrous THF were charged to prepare a homogeneous solution. While maintaining the solution at −78° C., into the solution, 4.37 mL (11.4 mmol) of solution of n-butyllithium (2.6 M) in hexane was dropped over 10 minutes. After the dropping, the resultant reaction mixture was stirred at −78° C. for 30 minutes and then, stirred at room temperature (25° C.) for 2 hours. Then, the flask was cooled to −78° C. and to the reaction mixture, 4.07 g (12.5 mmol) of tributyltin chloride was added. After the addition, the resultant reaction mixture was stirred at −78° C. for 30 minutes and next, stirred at room temperature (25° C.) for 3 hours. Then, to the reaction mixture, 200 mL of water was added to terminate the reaction and the reaction product was extracted with ethyl acetate. The organic phase that was an ethyl acetate solution was dried over sodium sulfate and was filtered and the resultant filtrate was concentrated by an evaporator to evaporate the solvent therefrom. The resultant oily substance was purified by a silica gel column (developing solution: hexane). As the silica gel in the silica gel column, a silica gel that was immersed in hexane containing 5% by weight of triethylamine for 5 minutes beforehand and was then rinsed with hexane, was used. After the purification, 3.52 g (3.34 mmol) of compound 30 was obtained.

$^1$H NMR in CDCl$_3$ (ppm): 6.72 (d, 1H), 6.68 (d, 1H), 1.95-1.80 (b, 4H), 1.65-1.00 (b, 56H), 0.90-0.83 (m, 36H)

Reference Example 28

Synthesis of Compound 31

[Chemical Formula 86]

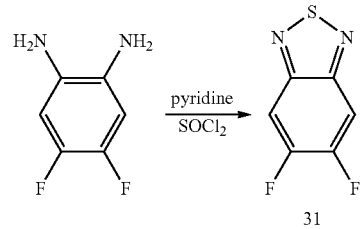

31

Into a 500 mL flask, 10.2 g (70.8 mmol) of 4,5-difluoro-1,2-diaminobenzene (manufactured by Tokyo Chemical Industry Co., Ltd.) and 150 mL of pyridine were charged to prepare a homogeneous solution. While maintaining the flask at 0° C., into the flask, 16.0 g (134 mmol) of thionyl chloride was dropped. After the dropping, the flask was warmed to 25° C.

and the reaction was carried out for 6 hours. Then, 250 mL of water was added to the reaction mixture and the reaction product was extracted with chloroform. The organic phase that was a chloroform solution was dried over sodium sulfate and was filtered. The resultant filtrate was concentrated by an evaporator and the precipitated solid was purified by recrystallization. As the solvent for recrystallization, methanol was used. After the purification, 10.5 g (61.0 mmol) of compound 31 was obtained.

Reference Example 29
Synthesis of Compound 32

[Chemical Formula 87]

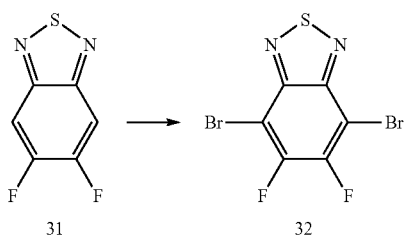

Into a 100 mL flask, 2.00 g (11.6 mmol) of the compound 31 and 0.20 g (3.58 mmol) of iron powder were charged and the flask was heated to 90° C. Into the flask, 31 g (194 mmol) of bromine was dropped over 1 hour. After the dropping, the resultant reaction mixture was stirred at 90° C. for 38 hours. Then, the flask was cooled to room temperature (25° C.) and the reaction mixture was diluted with 100 mL of chloroform. The resultant solution was charged into 300 mL of an aqueous solution of sodium sulfite (5% by weight), and the resultant reaction mixture was stirred for 1 hour. The organic phase of the resultant mixed solution was separated by a separation funnel and the aqueous phase was extracted with chloroform three times. The resultant extract was combined with the above-separated organic phase and the combined organic phase was dried over sodium sulfate. The organic phase was filtered and the resultant filtrate was concentrated by an evaporator to evaporate the solvent therefrom. The resultant yellow solid was dissolved in 90 mL of methanol heated to 55° C. and then, the resultant solution was cooled to 25° C. A precipitated crystal was filtered and recovered and then, the crystal was dried at room temperature (25° C.) under reduced pressure to obtain 1.50 g of compound 32.

$^{19}$F NMR (CDCl$_3$, ppm): −118.9 (s, 2F)

Reference Example 30
Synthesis of Polymer P

[Chemical Formula 88]

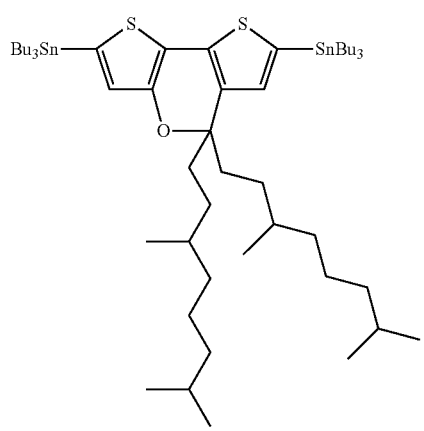

-continued

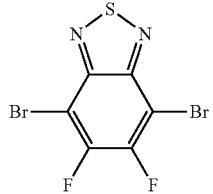

Into a 200 mL flask in which a gas in the flask was replaced by argon, 500 mg (0.475 mmol) of the compound 30, 141 mg (0.427 mmol) of the compound 32, and 32 mL of toluene were charged to prepare a homogeneous solution. The resultant toluene solution was bubbled with argon for 30 minutes. Then, to the toluene solution, 6.52 mg (0.007 mmol) of tris(dibenzylideneacetone)dipalladium and 13.0 mg of tris(2-tolyl)phosphine were added and the resultant reaction mixture was stirred at 100° C. for 6 hours. Then, to the resultant reaction solution, 500 mg of phenyl bromide was added and the reaction mixture was stirred further for 5 hours. Then, the flask was cooled to 25° C. and the reaction solution was poured into 300 mL of methanol. The precipitated polymer was recovered by filtration and the resultant polymer was charged into a thimble to extract the polymer with methanol, acetone, and hexane using a Soxhlet extractor for 5 hours respectively. The polymer remaining in the thimble was dissolved in 100 mL of toluene and to the resultant reaction solution, 2 g of sodium diethyldithiocarbamate and 40 mL of water were added, and the resultant reaction mixture was stirred under reflux for 8 hours. The aqueous phase was removed and then the organic phase was washed with 50 mL of water twice, next with 50 mL of an aqueous solution of acetic acid (3% by weight) twice, next with 50 mL of water twice, next with 50 mL of an aqueous solution of 5% potassium fluoride twice, and next with 50 mL of water twice, followed by pouring the resultant solution into methanol to precipitate polymer. The polymer was filtered and then dried and the resultant polymer was dissolved in 50 mL of o-dichlorobenzene again. The resultant solution was passed through an alumina/silica gel column. The resultant solution was poured into methanol to precipitate polymer and the polymer was filtered and then dried to obtain 185 mg of purified polymer. Hereinafter, the polymer is called polymer P. The molecular weight of the polymer P measured by GPC (in terms of polystyrene) corresponded to Mw=29,000 and Mn=14,000. The light absorbing terminal wavelength of the polymer P was 890 nm.

Example 7

Preparation and Evaluation of Ink and Organic Thin Film Solar Cell

A glass substrate on which an ITO film was formed by a sputtering method in a thickness of 150 nm was subjected to surface treatment by ozone UV treatment. Next, the polymer P and fullerene C60PCBM (phenyl C61-butyric acid methyl ester; manufactured by Frontier Carbon Corporation) were dissolved in o-dichlorobenzene so that the weight ratio of C60PCBM relative to the polymer P became 3 to produce an ink 2. In the ink 2, the total of the weight of the polymer P and the weight of C60PCBM was 2.0% by weight, relative to the weight of the ink 2. The ink 2 was applied on the substrate by spin-coating to prepare an organic film containing the polymer P. The organic film had a film thickness of about 100 nm.

The light absorbing terminal wavelength of the organic film was measured and was 890 nm. Then, on the organic film, lithium fluoride was deposited by a vacuum deposition machine in a thickness of 2 nm and next thereon, Al was deposited in a thickness of 100 nm. The obtained organic thin film solar cell had a shape of a 2 mm×2 mm square. The obtained organic thin film solar cell was irradiated with a constant light using a solar simulator (manufactured by BUNKOUKEIKI Co., Ltd.; trade name: OTENTO-SUNII; AM 1.5G filter, irradiance: 100 mW/cm$^2$) and the generated current and voltage were measured to calculate the photoelectric conversion efficiency, the short-circuit current density, the open-circuit voltage, and the fill factor. $J_{sc}$ (short-circuit current density) was 12.2 mA/cm$^2$; Voc (open-circuit voltage) was 0.71 V; ff (fill factor) was 0.64; and photoelectric conversion efficiency (η) was 5.54%.

Example 8

Preparation and Evaluation of Ink and Organic Thin Film Solar Cell

In the same manner as in Example 7, except that fullerene C70PCBM ([6,6]-phenyl C71 butyric acid methyl ester) was used instead of fullerene C60PCBM, the organic thin film solar cell was prepared and the photoelectric conversion efficiency, the short-circuit current density, the open-circuit voltage, and the fill factor were measured. The organic film had a light absorbing terminal wavelength of 890 nm, $J_{sc}$ (short-circuit current density) of 15.94 mA/cm$^2$, Voc (open-circuit voltage) of 0.715 V, ff (fill factor) of 0.59, and a photoelectric conversion efficiency (η) of 6.72%.

Calculation Example 7

The polymer P has the smallest repeated unit (E6) represented by the formula below. By the same method as in Calculation Example 1, the excitation energy of the polymer P from the ground singlet state to the lowest excited singlet state was calculated. The excitation energy of the polymer P from the ground singlet state to the lowest excited singlet state was 1.42 (eV) and the inverse of the excitation energy was 0.70 (eV$^{-1}$).

[Chemical Formula 89]

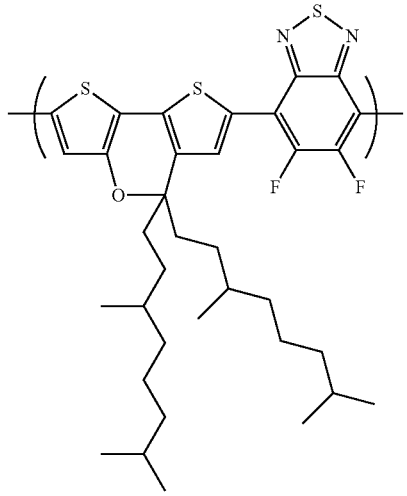

Smallest repeated unit (E6)

TABLE 8

| Structure used for calculation of excitation energy | k (Number of aromatic rings that constitute main chain) | Excitation energy from ground singlet state to lowest excited singlet state (eV) |
| --- | --- | --- |
|  | 3 | 2.31 |

TABLE 8-continued

| Structure used for calculation of excitation energy | k (Number of aromatic rings that constitute main chain) | Excitation energy from ground singlet state to lowest excited singlet state (eV) |
|---|---|---|
| (structure) | 6 | 1.88 |
| (structure) | 9 | 1.71 |

TABLE 9

Photovoltaic Cell Evaluation Result

| | | Short-Circuit Current Density (mA/cm$^2$) | Open-Circuit Voltage (V) | Fill Factor | Photoelectric Conversion Efficiency (%) | Inverse of Excitation Energy (eV$^{-1}$) |
|---|---|---|---|---|---|---|
| Example 7 | Polymer P | 12.2 | 0.71 | 0.64 | 5.54 | 0.70 |
| Example 8 | Polymer P | 15.9 | 0.71 | 0.59 | 6.72 | 0.70 |

The invention claimed is:

1. A photovoltaic cell comprising:
a first electrode;
a second electrode; and
an active layer positioned between the first electrode and the second electrode;
wherein the active layer contains a macromolecular compound having a structural unit represented by Formula (1) or Formula (2):

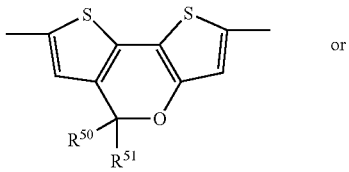

(1)

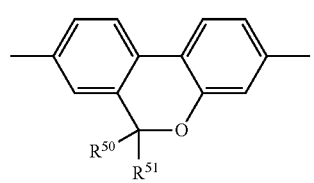

(2)

wherein $R^{50}$ and $R^{51}$ are the same as or different from each other and represent a hydrogen atom, a halogen atom, or a monovalent organic group, and further having a structural unit represented by Formula (3) or Formula (4):

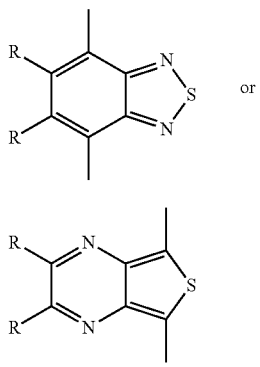

(3)

(4)

wherein Rs are the same as or different from each other and represent a hydrogen atom or a substituent, or are bonded with each other to form a ring, wherein the substituent is selected from a group consisting of an alkyl group, an alkyloxy group, an alkylthio group, an aryl group, an aryloxy group, an arylthio group, an arylalkyl group, an arylalkyloxy group, an arylalkylthio group, an arylalkenyl group, an arylalkynyl group, an amino group, a substituted amino group, a silyl group, a substituted silyl group, a halogen atom, an acyl group, an acyloxy group, an amido group, a monovalent heterocyclic group, a carboxyl group, a substituted carboxyl group, a nitro group, and a cyano group, wherein a hydrogen atom contained in the substituent is optionally substituted with a fluorine atom, wherein an inverse of excitation energy of the macromolecular compound from a ground singlet state to a lowest excited singlet state that is calculated using a time-dependent density functional theory is 0.43 (eV$^{-1}$) or more.

2. The photovoltaic cell according to claim 1, wherein the inverse of the excitation energy of the macromolecular compound from the ground singlet state to the lowest excited singlet state is 0.45 (eV$^{-1}$) or more.

3. The photovoltaic cell according to claim 1, wherein the monovalent organic group is an alkyl group, an alkyloxy group, an alkylthio group, an aryl group, an aryloxy group, an arylthio group, an arylalkyl group, an arylalkyloxy group, an arylalkylthio group, an acyl group, an acyloxy group, an amido group, an acid imido group, an amino group, a substituted amino group, a substituted silyl group, a substituted silyloxy group, a substituted silylthio group, a substituted silylamino group, a monovalent heterocyclic group, a heterocyclyloxy group, a heterocyclylthio group, an arylalkenyl group, an arylalkynyl group, a carboxyl group, or a cyano group.

4. A solar cell module comprising the photovoltaic cell according to claim 1.

5. An image sensor comprising the photovoltaic cell according to claim 1.

6. An organic thin film transistor comprising:
a gate electrode;
a source electrode;
a drain electrode; and
an active layer;
wherein the active layer contains a macromolecular compound having a structural unit represented by Formula (1) or Formula (2):

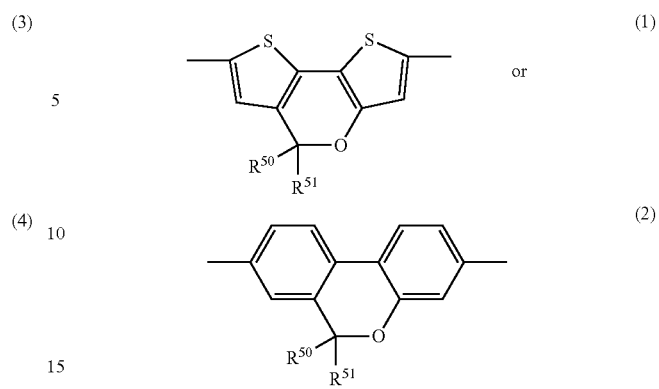

(1)

(2)

wherein $R^{50}$ and $R^{51}$ are the same as or different from each other and represent a hydrogen atom, a halogen atom, or a monovalent organic group, and further having a structural unit represented by Formula (3) or Formula (4):

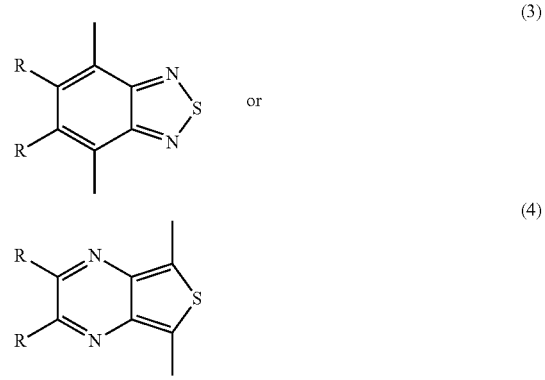

(3)

(4)

wherein Rs are the same as or different from each other and represent a hydrogen atom or a substituent, or are bonded with each other to form a ring, wherein the substituent is selected from a group consisting of an alkyl group, an alkyloxy group, an alkylthio group, an aryl group, an aryloxy group, an arylthio group, an arylalkyl group, an arylalkyloxy group, an arylalkylthio group, an arylalkenyl group, an arylalkynyl group, an amino group, a substituted amino group, a silyl group, a substituted silyl group, a halogen atom, an acyl group, an acyloxy group, an amido group, a monovalent heterocyclic group, a carboxyl group, a substituted carboxyl group, a nitro group, and a cyano group, wherein a hydrogen atom contained in the substituent is optionally substituted with a fluorine atom, wherein an inverse of excitation energy of the macromolecular compound from a ground singlet state to a lowest excited singlet state that is calculated using a time-dependent density functional theory is 0.43 (eV$^{-1}$) or more.

7. A method of calculating excitation energy of a macromolecular compound comprising a repeated unit represented by Formula (2) from a ground singlet state to a lowest excited singlet state, the method comprising:
calculating, using a processor, excitation energy of a compound represented by Formula (2-1), excitation energy of a compound represented by Formula (2-2), and excitation energy of a compound represented by Formula (2-3) by a time-dependent density functional theory;

plotting, on a coordinate plane in which a value represented by $1/k$ is assigned on an abscissa axis when number of aromatic rings contained in a main chain of the compound is assumed to be k and excitation energy is assigned on an ordinate axis, a first point of which abscissa is a value represented by $1/k$ for the compound represented by Formula (2-1) and of which ordinate is the excitation energy of the compound represented by Formula (2-1), a second point of which abscissa is a value represented by $1/k$ for the compound represented by Formula (2-2) and of which ordinate is the excitation energy of the compound represented by Formula (2-2), and a third point of which abscissa is a value represented by $1/k$ for the compound represented by Formula (2-3) and of which ordinate is the excitation energy of the compound represented by Formula (2-3);

calculating an approximate straight line that connects the first point, the second point, and the third point by least-squares method; and calculating an ordinate of an intersection point of a straight line on which the value represented by $1/k$ is 0 with the approximate straight line on the coordinate plane, as the excitation energy of the macromolecular compound;

wherein Formulae (2), (2-1), (2-2) and (2-3) are as follows:

 (2)

 (2-1)

 (2-2)

 (2-3)

wherein Formula (2) represents a divalent organic group comprising one or a plurality of structure units represented by Formula (1); wherein H represents a hydrogen atom; and when $Ar^3$ is plurally present, $Ar^3$s may be the same as or different from each other, wherein Formula (1) is as follows:

 (1)

wherein $Ar^1$ and $Ar^2$ are the same as or different from each other and represent a trivalent aromatic hydrocarbon group or a trivalent heterocyclic group; $X^1$ and $X^2$ are the same as or different from each other and represent —O—, —S—, —C(=O)—, —S(=O)—, —SO$_2$—, —C(R$^{50}$)(R$^{51}$)—, —Si(R$^3$)(R$^4$)—, —N(R$^5$)—, —B(R$^6$)—, —P(R$^7$)—, or —P(=O)(R$^8$)—; $R^{50}$, $R^{51}$, $R^3$, $R^4$, $R^5$, $R^6$, $R^7$, and $R^8$ are the same as or different from each other and represent a hydrogen atom, a halogen atom, or a monovalent organic group; and $X^1$ and $Ar^2$ are bonded with atoms adjacent to each other on a ring that constitutes $Ar^1$, and $X^2$ and $Ar^1$ are bonded with atoms adjacent to each other on a ring that constitutes $Ar^2$.

* * * * *